(12) United States Patent
Suzuki et al.

(10) Patent No.: US 12,356,613 B2
(45) Date of Patent: Jul. 8, 2025

(54) SEMICONDUCTOR MEMORY DEVICE

(71) Applicant: Kioxia Corporation, Tokyo (JP)

(72) Inventors: Takuya Suzuki, Kuwana (JP); Ken Iyoda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 952 days.

(21) Appl. No.: 17/398,398

(22) Filed: Aug. 10, 2021

(65) Prior Publication Data
US 2022/0285379 A1    Sep. 8, 2022

(30) Foreign Application Priority Data

Mar. 8, 2021 (JP) ................... 2021-036035

(51) Int. Cl.
| | | |
|---|---|---|
| *H10B 41/27* | (2023.01) | |
| *G11C 8/14* | (2006.01) | |
| *H01L 23/528* | (2006.01) | |
| *H10B 41/10* | (2023.01) | |

(52) U.S. Cl.
CPC ............... *H10B 41/27* (2023.02); *G11C 8/14* (2013.01); *H01L 23/5283* (2013.01); *H10B 41/10* (2023.02)

(58) Field of Classification Search
CPC ........ H10B 41/27; H10B 41/10; H10B 43/27; H10B 43/10; G11C 8/14; H01L 23/5283
See application file for complete search history.

(56) References Cited

U.S. PATENT DOCUMENTS

| | | | |
|---|---|---|---|
| 10,090,321 B2 * | 10/2018 | Nakajima | ......... H01L 21/76829 |
| 10,388,664 B2 | 8/2019 | Huang et al. | |
| 10,672,782 B2 | 6/2020 | Utsumi | |
| 2017/0179154 A1 * | 6/2017 | Furihata | ................ H10B 41/41 |
| 2021/0066347 A1 * | 3/2021 | Titus | ..................... H10B 43/50 |

FOREIGN PATENT DOCUMENTS

| | | |
|---|---|---|
| CN | 108377660 A | 8/2018 |
| JP | 2018-26518 A | 2/2018 |
| TW | 201830671 A | 8/2018 |
| TW | 201836128 A | 10/2018 |

* cited by examiner

*Primary Examiner* — Matthew C Landau
*Assistant Examiner* — Halee Cramer
(74) *Attorney, Agent, or Firm* — Oblon, McClelland, Maier & Neustadt, L.L.P.

(57) ABSTRACT

A semiconductor memory device includes a substrate that includes a first region and a second region. The first region includes: a plurality of first word line layers; a first semiconductor layer having an outer peripheral surface opposed to the plurality of first word line layers; and a first electric charge accumulating film disposed between the plurality of first word line layers and the first semiconductor layer. The second region includes: a part of the plurality of first word line layers; a plurality of first insulating layers, the plurality of first insulating layers; a first contact having an outer peripheral surface opposed to the plurality of first insulating layers; a second semiconductor layer disposed between the plurality of first word line layers and the plurality of first insulating layers; and a second electric charge accumulating film disposed between the plurality of first insulating layers and the second semiconductor layer.

16 Claims, 40 Drawing Sheets

SEMICONDUCTOR MEMORY DEVICE

CROSS-REFERENCE TO RELATED APPLICATIONS

This application is based upon and claims the benefit of Japanese Patent Application No. 2021-36035, filed on Mar. 8, 2021, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a plurality of conductive layers stacked in a direction intersecting with a surface of the semiconductor substrate, a semiconductor layer that extends in a direction intersecting with the surface of the semiconductor substrate and is opposed to the plurality of conductive layers, and agate insulating film disposed between the conductive layers and the semiconductor substrate.

DETAILED DESCRIPTION

Figure 1:
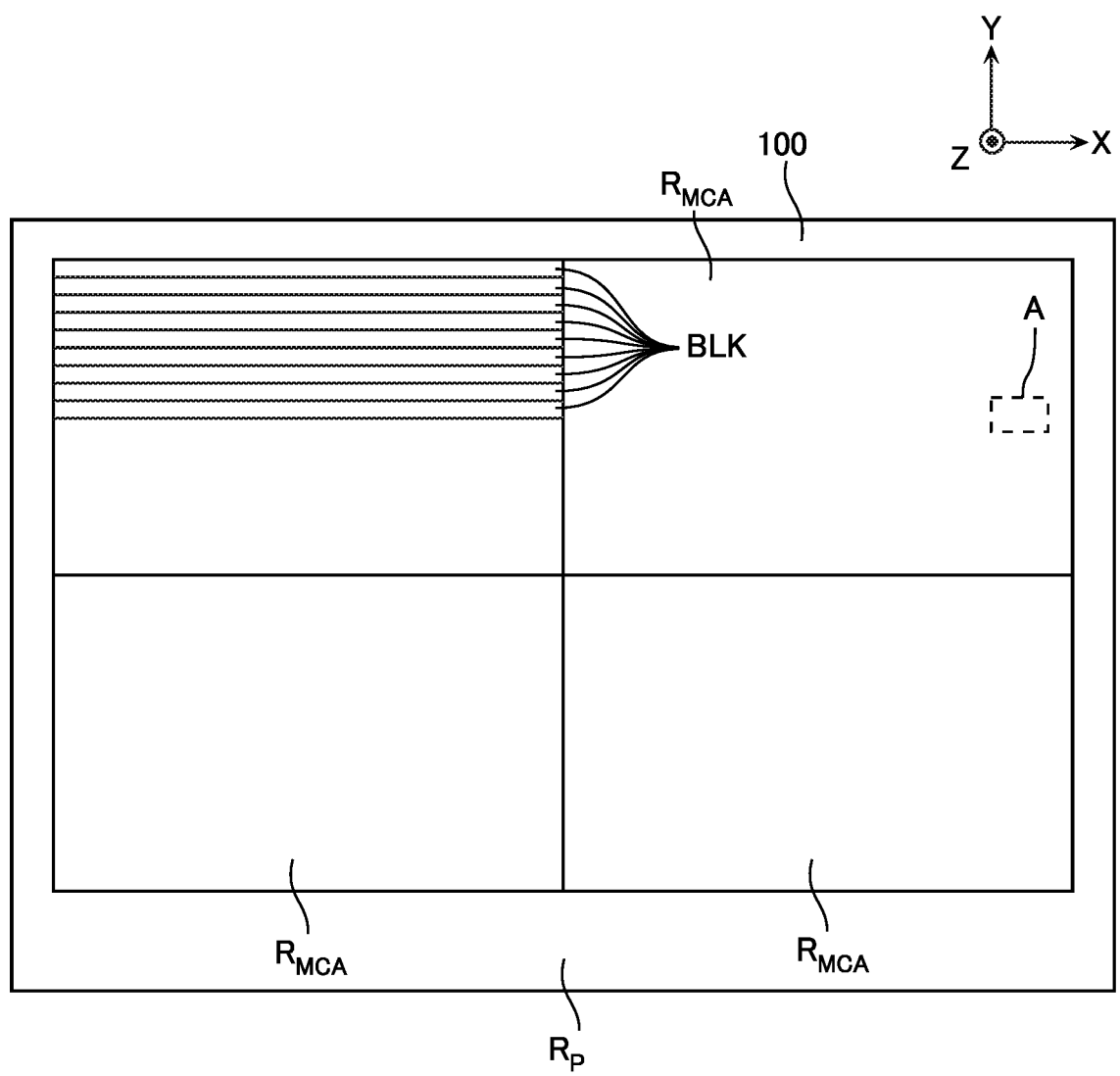
FIG. 1 is a schematic plan view of a semiconductor memory device according to a first embodiment.

A semiconductor memory device according to one embodiment comprises a substrate that includes a first region and a second region arranged in a first direction. The first region includes: a plurality of first word line layers stacked in a second direction intersecting with a surface of the substrate; a first semiconductor layer that extends in the second direction, the first semiconductor layer having an outer peripheral surface opposed to the plurality of first word line layers; and a first electric charge accumulating film disposed between the plurality of first word line layers and the first semiconductor layer. The second region includes: a part of the plurality of first word line layers stacked in the second direction; a plurality of first insulating layers that are separated from the plurality of first word line layers in a third direction intersecting with the first direction and the second direction, the plurality of first insulating layers being stacked in the second direction; a first contact that extends in the second direction, the first contact having an outer peripheral surface opposed to the plurality of first insulating layers; a second semiconductor layer disposed between the plurality of first word line layers and the plurality of first insulating layers, the second semiconductor layer extending in the first direction and the second direction; and a second electric charge accumulating film disposed between the plurality of first insulating layers and the second semiconductor layer.

Next, the semiconductor memory devices according to embodiments are described in detail with reference to the drawings. The following embodiments are only examples, and not described for the purpose of limiting the present invention.

In this specification, a direction parallel to a surface of the semiconductor substrate is referred to as an X-direction, a direction parallel to the surface of the semiconductor substrate and perpendicular to the X-direction is referred to as a Y-direction, and a direction perpendicular to the surface of the semiconductor substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the semiconductor substrate. For example, a direction away from the semiconductor substrate along the Z-direction is referred to as above and a direction approaching the semiconductor substrate along the Z-direction is referred to as below. A lower surface and a lower end portion of a certain configuration mean a surface and an end portion on the semiconductor substrate side of this configuration. An upper surface and an upper end portion of a certain configuration mean a surface and an end portion on a side opposite to the semiconductor substrate of this configuration. A surface intersecting with the X-direction or the Y-direction is referred to as a side surface and the like.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

First Embodiment

The configuration of the semiconductor memory device according to the first embodiment is described with reference to the drawings. Note that the following drawings are schematic, and the configurations are partially omitted in some cases for sake of convenience of the description.

[Structure]

Figure 2:
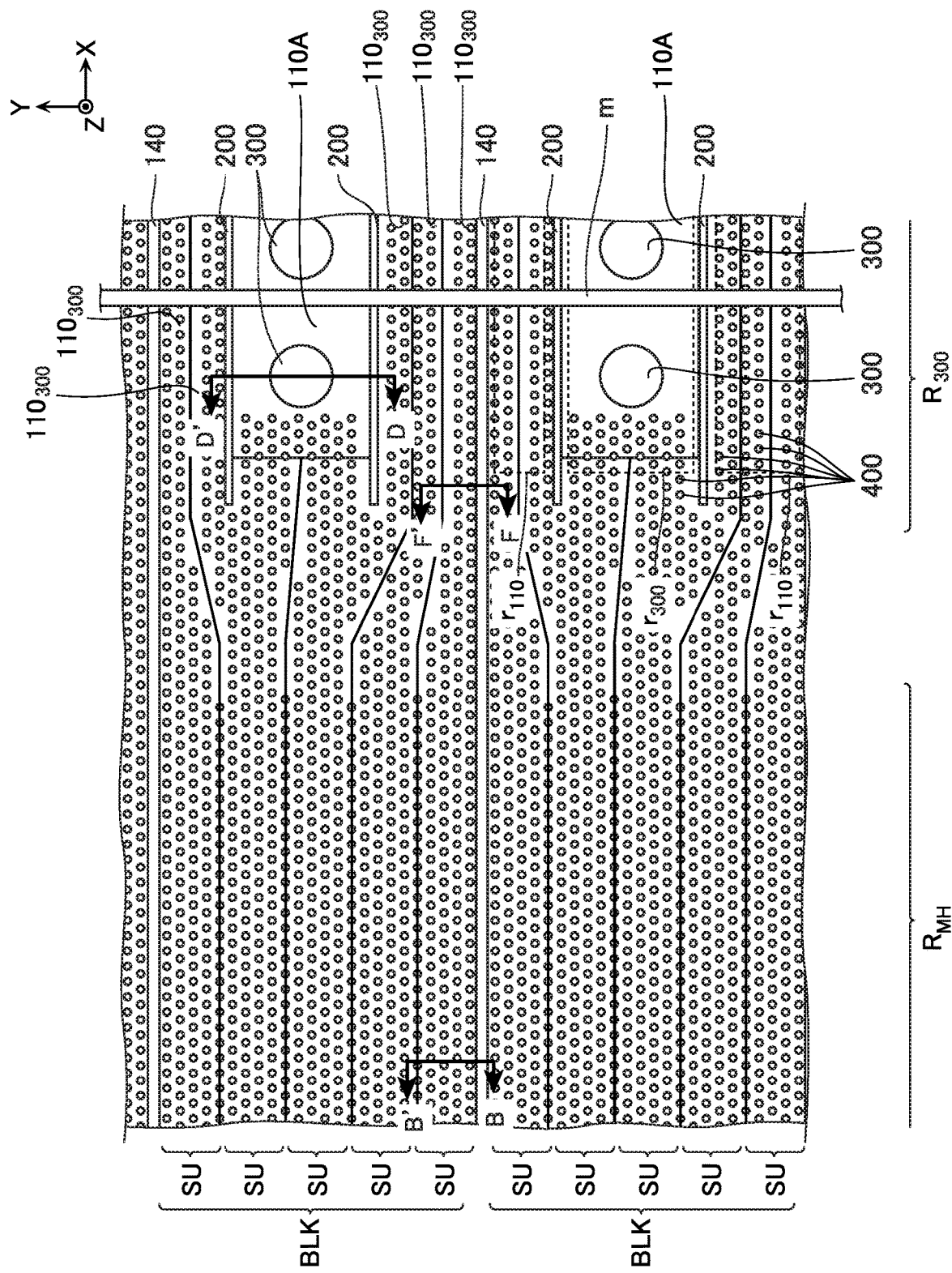
FIG. 2 is a schematic enlarged cross-sectional view of a portion indicated by A in FIG. 1.
Figure 3:
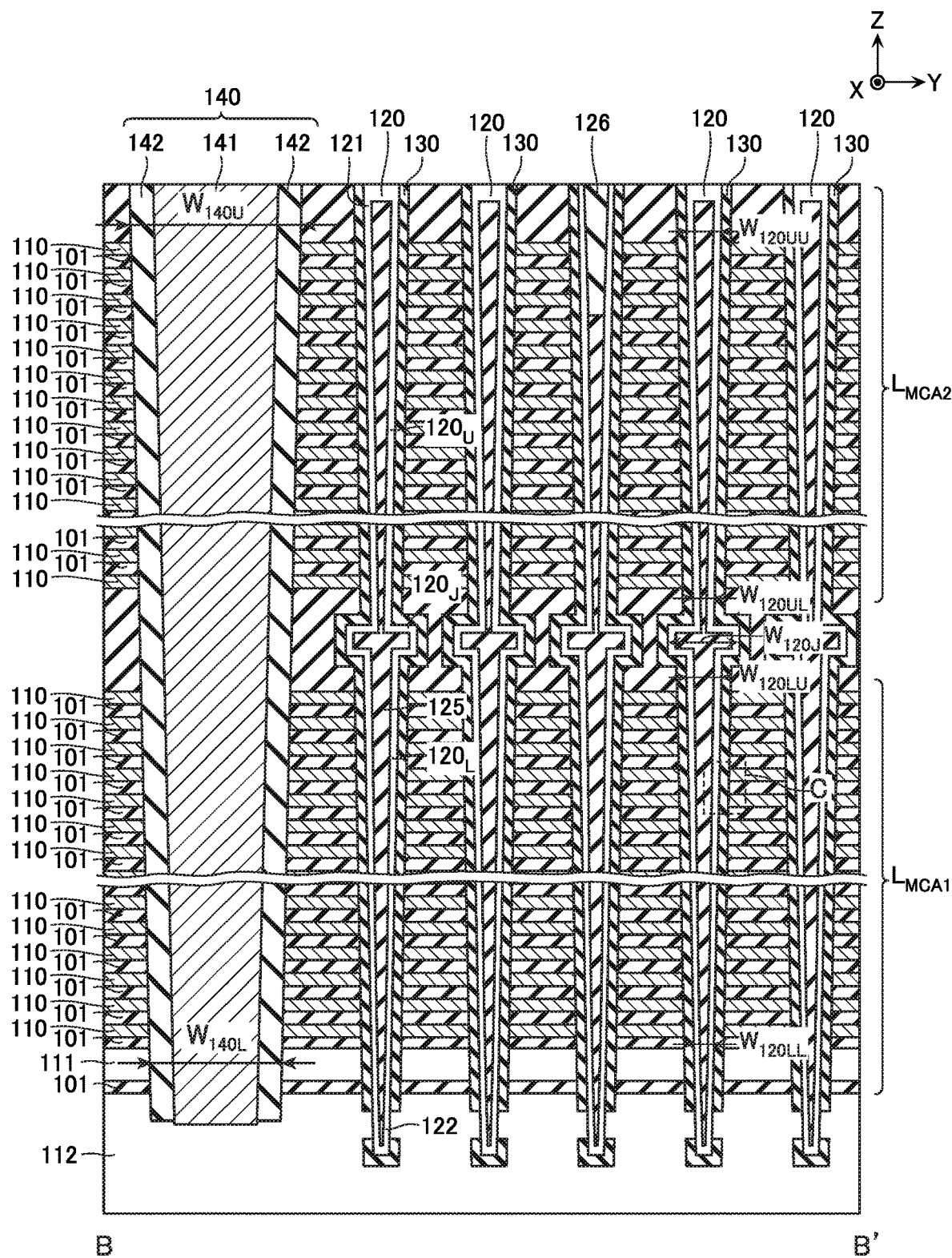
FIG. 3 is a schematic cross-sectional view of a structure illustrated in FIG. 2 taken along a line B-B' and viewed along an arrow direction.
Figure 4:
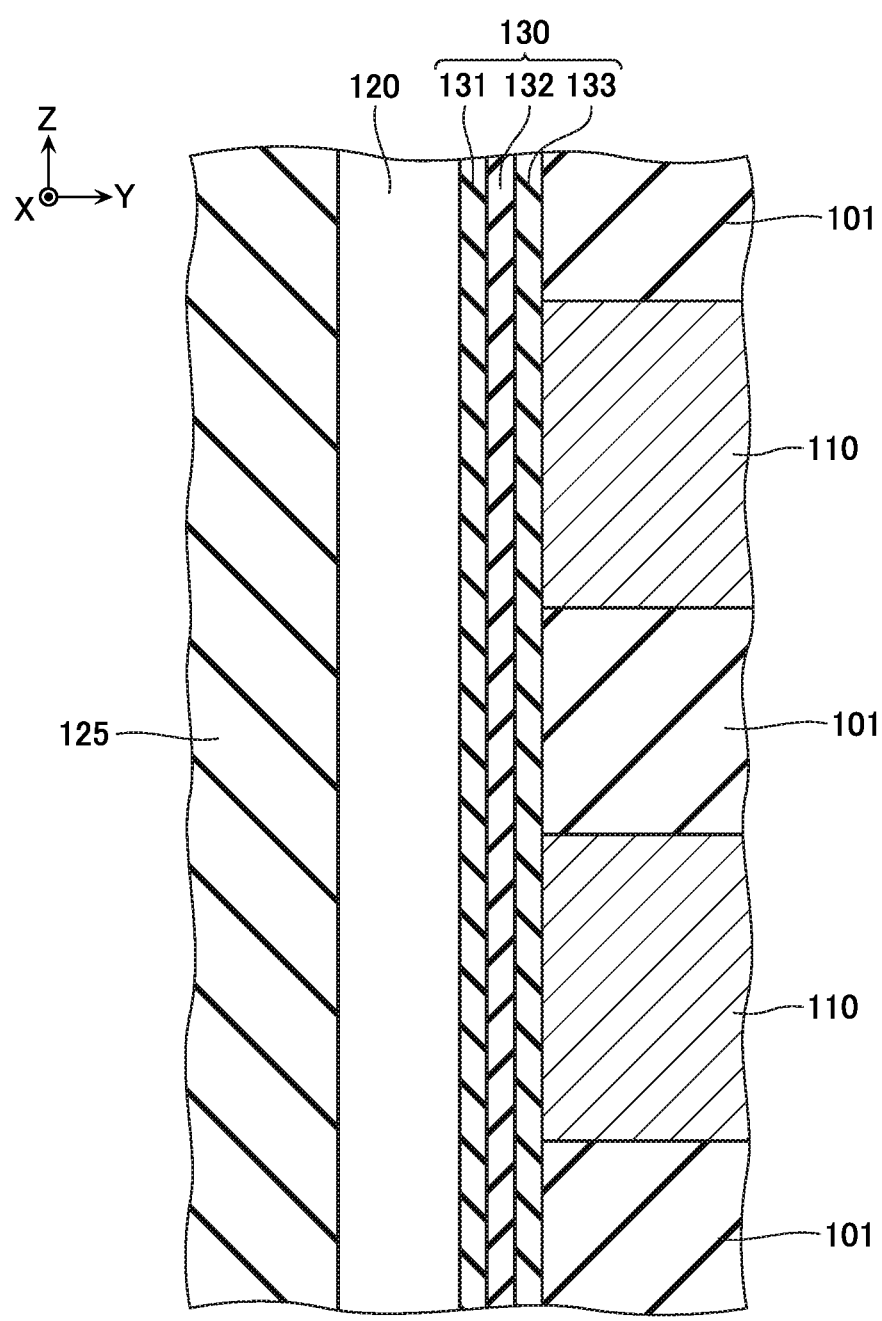
FIG. 4 is a schematic enlarged view of a portion indicated by C in FIG. 3.
Figure 5:
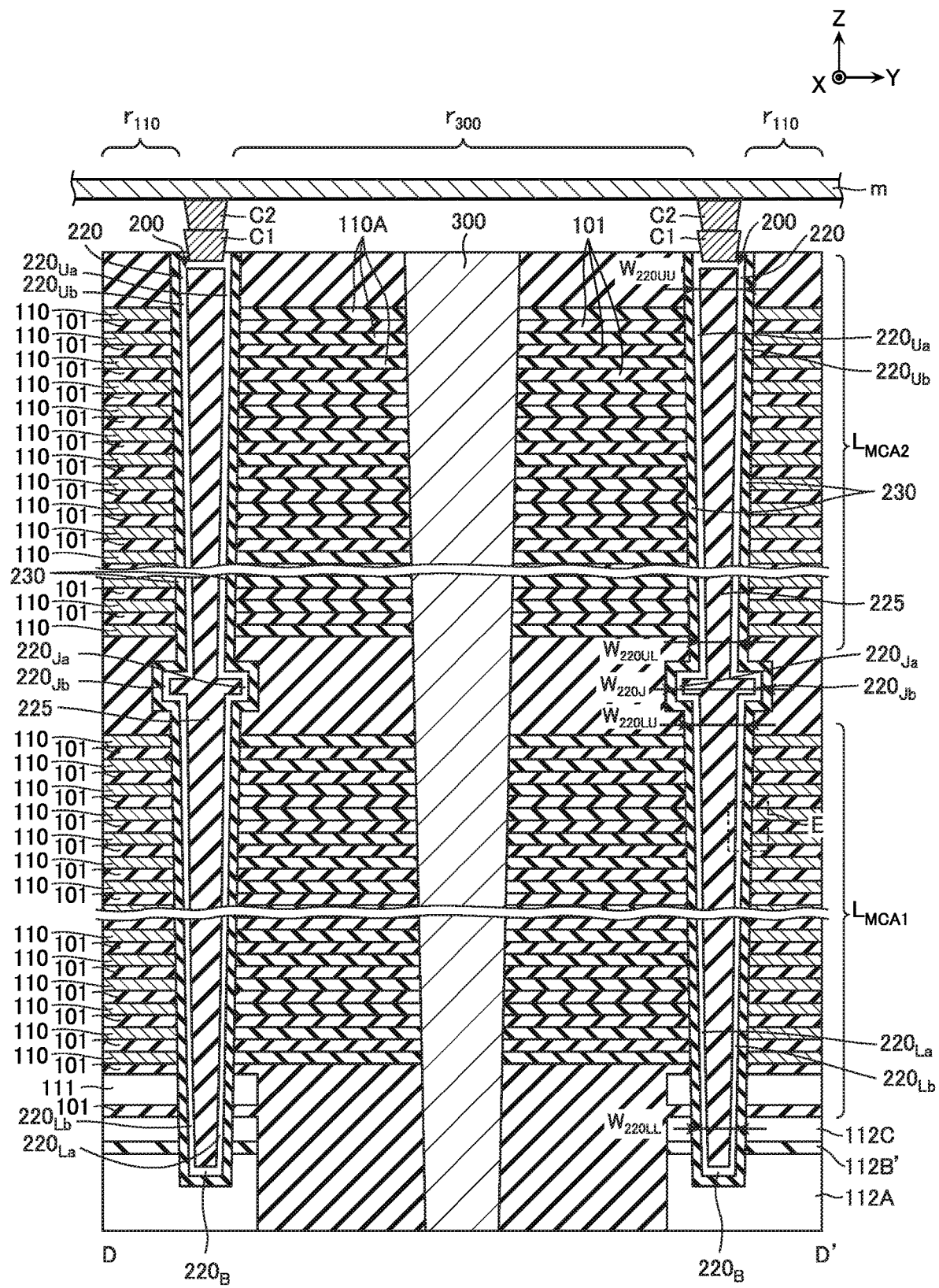
FIG. 5 is a schematic cross-sectional view of a structure illustrated in FIG. 2 taken along a line D-D' and viewed along an arrow direction.
Figure 6:
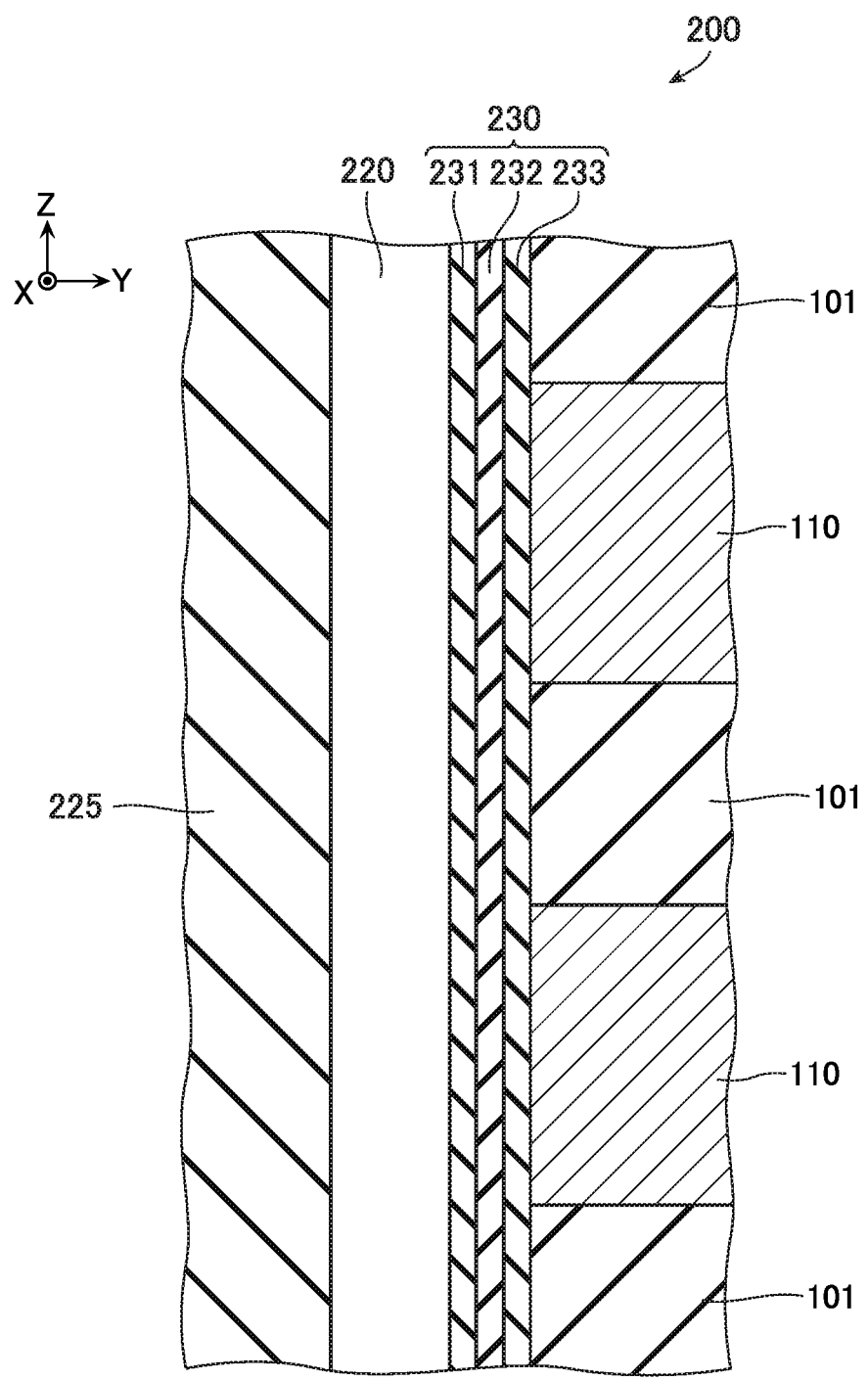
FIG. 6 is a schematic enlarged view of a portion indicated by E in FIG. 5.
Figure 7:
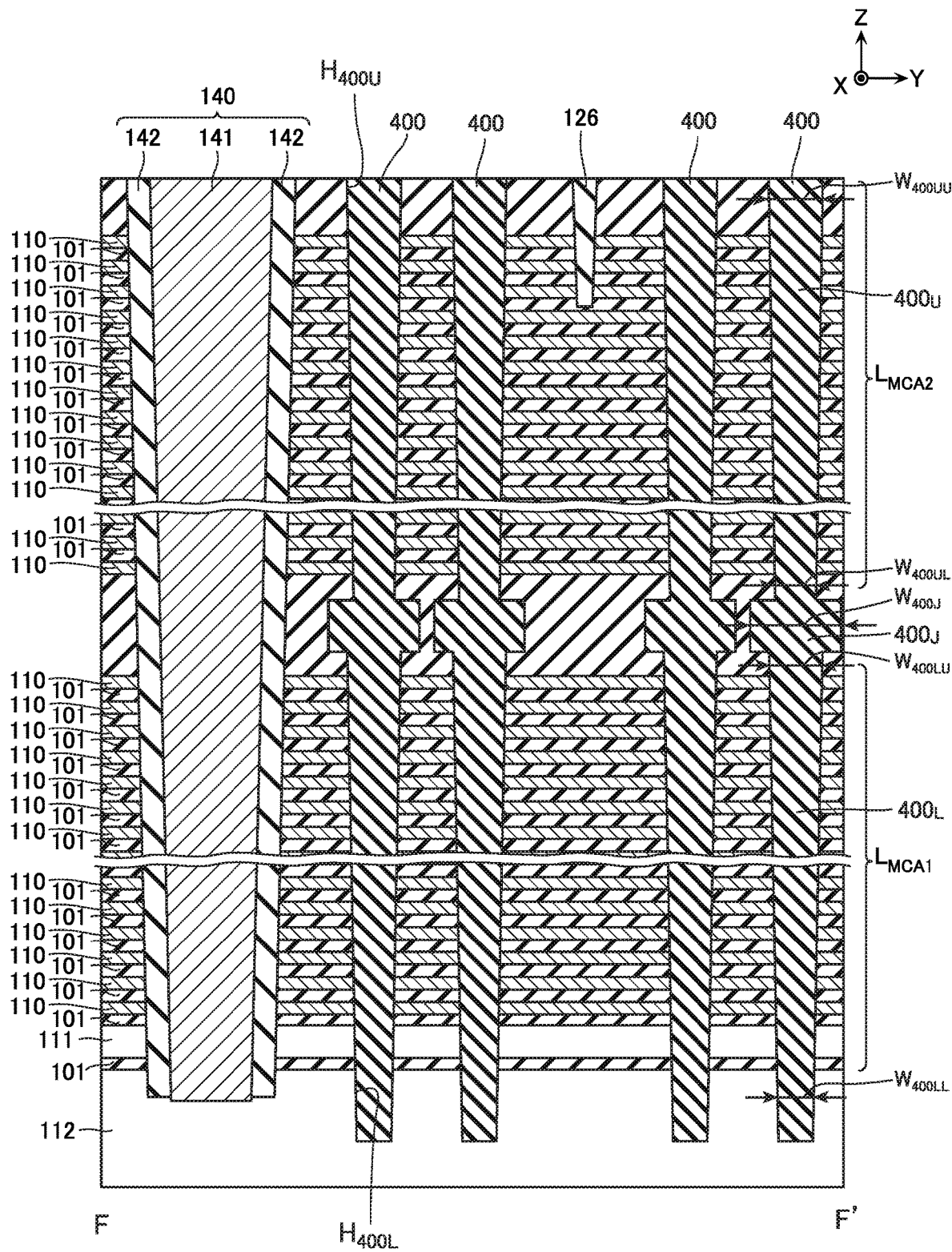
FIG. 7 is a schematic cross-sectional view of a structure illustrated in FIG. 2 taken along a line F-F' and viewed along an arrow direction.

FIG. 1 is a schematic plan view of a semiconductor memory device according to a first embodiment. FIG. 2 is a schematic enlarged cross-sectional view of a portion indicated by A in FIG. 1 and illustrates a configuration in a memory cell array layer. FIG. 3 is a schematic cross-sectional view of a structure illustrated in FIG. 2 taken along a line B-B' and viewed along an arrow direction. FIG. 4 is a schematic enlarged view of a portion indicated by C in FIG. 3. FIG. 5 is a schematic cross-sectional view of a structure illustrated in FIG. 2 taken along a line D-D' and viewed along an arrow direction. FIG. 6 is a schematic enlarged view of a portion indicated by E in FIG. 5. FIG. 7 is a schematic cross-sectional view of a structure illustrated in FIG. 2 taken along a line F-F' and viewed along an arrow direction.

For example, as illustrated in FIG. 1, the semiconductor memory device according to the first embodiment includes a semiconductor substrate 100. The semiconductor substrate 100 is, for example, a semiconductor substrate of P-type silicon (Si) containing P-type impurities, such as boron (B). In the illustrated example, in the semiconductor substrate 100, four memory cell array regions $R_{MCA}$ arranged in an X-direction and a Y-direction are disposed. The memory cell array region $R_{MCA}$ includes a plurality of memory hole regions $R_{MH}$ (FIG. 2) arranged in the X-direction, a plurality of contact connection regions $R_{300}$ (FIG. 2) disposed between these memory hole regions $R_{MH}$. At an end portion in the Y-direction of the semiconductor substrate 100, a peripheral region $R_P$ is disposed. The peripheral region $R_P$ extends in the X-direction along the end portion in the Y-direction of the semiconductor substrate 100.

The semiconductor memory device according to the first embodiment includes the semiconductor substrate 100, a transistor layer disposed on the semiconductor substrate 100, a wiring layer at a lower layer side disposed above the transistor layer, a memory cell array layer $L_{MCA1}$ (FIG. 3) disposed above the wiring layer at the lower layer side, a memory cell array layer $L_{MCA2}$ (FIG. 3) disposed above the memory cell array layer $L_{MCA1}$, and a wiring layer at an upper layer side disposed above the memory cell array layer $L_{MCA2}$.

[Structure of Memory Cell Array Layers $L_{MCA1}$ and $L_{MCA2}$ in Memory Hole Region $R_{MH}$]

For example, as illustrated in FIG. 1 and FIG. 2, in the memory cell array region $R_{MCA}$, a plurality of memory blocks BLK arranged in the Y-direction are disposed. As illustrated in FIG. 2, the memory block BLK includes a plurality of string units SU arranged in the Y-direction. Between the two memory blocks BLK adjacent in the Y-direction, an inter-block structure 140, such as silicon oxide ($SiO_2$), is disposed.

For example, as illustrated in FIG. 3, the memory block BLK includes a plurality of conductive layers 110 arranged in the Z-direction, a plurality of semiconductor layers 120 extending in the Z-direction, a plurality of gate insulating films 130 disposed between the plurality of conductive layers 110 and the respective plurality of semiconductor layers 120.

The conductive layer 110 is an approximately plate-shaped conductive layer extending in the X-direction. The conductive layer 110 may include, for example, a stacked film including a barrier conductive film of titanium nitride (TiN) or the like and a metal film of tungsten (W) or the like. Further, the conductive layer 110 may include, for example, polycrystalline silicon containing impurities such as phosphorus (P) or boron (B). Between each of the plurality of conductive layers 110 arranged in the Z-direction, insulating layers 101 of silicon oxide ($SiO_2$) or the like are disposed.

Below the conductive layers 110, a conductive layer 111 is disposed. The conductive layer 111 may include, for example, polycrystalline silicon containing impurities, such as phosphorus (P) or boron (B). Between the conductive layer 111 and the conductive layer 110, the insulating layer 101 of silicon oxide ($SiO_2$) or the like is disposed. The conductive layer 111 functions as a gate electrode or the like of a source-side select transistor.

Below the conductive layer 111, a semiconductor layer 112 is disposed. The semiconductor layer 112 functions as a source line or the like.

Among the plurality of conductive layers 110, one or a plurality of conductive layers 110 positioned at the lowermost layer function as, for example, a gate electrode of the source-side select transistor. The plurality of conductive layers 110 are electrically independent for each memory block BLK.

A plurality of conductive layers 110 positioned thereabove function as the word lines, the gate electrodes of memory transistors, and the like. The plurality of conductive layers 110 are each electrically independent for each memory block BLK.

One or a plurality of conductive layers 110 positioned thereabove function as, for example, the gate electrode of a drain-side select transistor. The plurality of conductive layers 110 have a width in the Y-direction smaller than those of the other conductive layers 110. Between the two conductive layers 110 adjacent in the Y-direction, an inter-string unit insulating layer 126 is disposed. The plurality of conductive layers 110 are each electrically independent for each string unit SU.

The semiconductor layers 120 are arranged in a predetermined pattern in the X-direction and the Y-direction. The semiconductor layers 120 function as channel regions or the like of the plurality of memory transistors, source-side select transistors, and drain-side select transistors arranged in the Z-direction. The semiconductor layer 120 is a semiconductor layer of polycrystalline silicon (Si) or the like. For example, as illustrated in FIG. 3, the semiconductor layer 120 has an approximately closed-bottomed cylindrical shape and has a center portion where an insulating layer 125 of silicon oxide ($SiO_2$) or the like is disposed.

The semiconductor layer 120 includes a semiconductor region $120_L$ included in the memory cell array layer $L_{MCA1}$ and a semiconductor region $120_U$ included in the memory cell array layer $L_{MCA2}$. The semiconductor layer 120 includes a semiconductor region $120_J$ disposed between the semiconductor region $120_L$ and the semiconductor region $120_U$, an impurity region 122 disposed below the semiconductor region $120_L$, and an impurity region 121 disposed above the semiconductor region $120_U$.

The semiconductor region $120_L$ is a substantially cylindrical region where a width in a radial direction (a width in the X-direction and a width in the Y-direction) becomes gradually smaller as it extends downward along the Z-direction. An outer peripheral surface of the semiconductor region $120_L$ is surrounded by the plurality of conductive layers 110 each included in the memory cell array layer $L_{MCA1}$ and is opposed to the plurality of conductive layers 110.

The semiconductor region $120_U$ is a substantially cylindrical region where a width in a radial direction (a width in the X-direction and a width in the Y-direction) becomes gradually smaller as it extends downward along the Z-direction. An outer peripheral surface of the semiconductor region $120_U$ is surrounded by the plurality of conductive layers 110 each included in the memory cell array layer $L_{MCA2}$ and is opposed to the plurality of conductive layers 110.

A width $W_{120LU}$ in the radial direction at an upper end portion of the semiconductor region $120_L$ and a width $W_{120UU}$ in the radial direction at an upper end portion of the semiconductor region $120_U$ are approximately equal. A width $W_{120LL}$ in the radial direction at a lower end portion of the semiconductor region $120_L$ and a width $W_{120UL}$ in the radial direction at a lower end portion of the semiconductor region $120_U$ are substantially equal.

The above-described "upper end portion of the semiconductor region $120_L$" is a portion positioned above and including a position opposed to the conductive layer 110 in the uppermost layer among the plurality of conductive layers 110 included in the memory cell array layer $L_{MCA1}$ in the semiconductor region $120_L$. The "upper end portion of the semiconductor region $120_U$" is a portion positioned above and including a position opposed to the conductive layer 110 in the uppermost layer among the plurality of conductive layers 110 included in the memory cell array layer $L_{MCA2}$ in the semiconductor region $120_U$. The "lower end portion of the semiconductor region $120_L$" is a portion positioned below and including a position opposed to the conductive layer 110 in the lowermost layer among the plurality of conductive layers 110 included in the memory cell array layer $L_{MCA1}$ in the semiconductor region $120_L$. The "lower end portion of the semiconductor region $120_U$" is a portion positioned below and including a position opposed to the conductive layer 110 in the lowermost layer among the plurality of conductive layers 110 included in the memory cell array layer $L_{MCA2}$ in the semiconductor region $120_U$.

The semiconductor region $120_J$ is disposed above the plurality of conductive layers 110 each included in the memory cell array layer $L_{MCA1}$ and disposed below the plurality of conductive layers 110 included in the memory cell array layer $L_{MCA2}$. A width $W_{120J}$ in the radial direction of the semiconductor region $120_J$ is larger than the width $W_{120LU}$ in the radial direction at the upper end portion of the semiconductor region $120_L$ and the width $W_{120UU}$ in the radial direction at the upper end portion of the semiconductor region $120_U$.

The impurity region 122 is connected to the above-described semiconductor layer 112. The impurity region 122 contains, for example, N-type impurities such as phosphorus (P) or P-type impurities such as boron (B).

The impurity region 121 contains, for example, N-type impurities such as phosphorus (P). The impurity region 121 is connected to a bit line (not illustrated) via a contact (not illustrated).

The gate insulating film 130 has an approximately cylindrical shape that covers the outer peripheral surface of the semiconductor layer 120. For example, as illustrated in FIG. 4, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are insulating films of silicon oxide ($SiO_2$) or the like. The electric charge accumulating film 132 is a film that can accumulate electric charge, and is silicon nitride ($Si_3N_4$) or the like. The tunnel insulating film 131, the electric charge accumulating film 132, and the block insulating film 133 have approximately cylindrical shapes and extend in the Z-direction along the outer peripheral surface of the semiconductor layer 120.

[Structure of Inter-Block Structure 140]

The inter-block structure 140 extends in the X-direction as illustrated in FIG. 2, extends in the Z-direction as illustrated in FIG. 3, and separates the plurality of conductive layers 110 and the plurality of insulating layers 101 arranged in the Z-direction in the Y-direction. As illustrated in FIG. 3, the inter-block structure 140 includes a pair of insulating layers 142, 142 that extend in the Z-direction and the X-direction and are separated in the Y-direction, and a conductive layer 141 that is arranged between the pair of insulating layers 142, 142 and extends in the Z-direction and the X-direction. The conductive layer 141 has a lower end connected to the semiconductor layer 112.

The pair of insulating layers 142, 142 are obliquely arranged with respect to the Z-direction when viewed in the Y-Z cross-sectional surface as illustrated in FIG. 3. Moreover, when viewed in the Y-Z cross-sectional surface, the insulating layers 142, 142 are arranged such that a width (a width in the Y-direction) of these two insulating layers 142 becomes gradually smaller as the insulating layers 142, 142 extend downward along the Z-direction. As a result, a width $W_{140U}$ in the Y-direction at an upper end portion of the inter-block structure 140 becomes larger than a width $W_{140L}$ in the Y-direction at a lower end portion of the inter-block structure 140.

The above-described "upper end portion of the inter-block structure 140" is a portion positioned above and including a position opposed to the conductive layer 110 in the uppermost layer among the plurality of conductive layers 110 included in the memory cell array layer $L_{MCA2}$ in the inter-block structure 140. The "lower end portion of the inter-block structure 140" is a portion positioned below and including a position opposed to the conductive layer 110 in the lowermost layer among the plurality of conductive layers 110 included in the memory cell array layer $L_{MCA1}$ in the inter-block structure 140.

Furthermore, for example, the width $W_{140U}$ and the width $W_{140L}$ of the inter-block structure 140 are larger than the widths $W_{120LU}$ and $W_{120LL}$ of the semiconductor region $120_L$, the widths $W_{120UU}$ and $W_{120UL}$ of the semiconductor region $120_U$, and the width $W_{120J}$ of the semiconductor region $120_J$ in the semiconductor layer 120.

[Structure of Memory Cell Array Layers $L_{MCA1}$ and $L_{MCA2}$ in Contact Connection Region $R_{300}$]

For example, as illustrated in FIG. 2, in the contact connection region $R_{300}$, two structure bodies 200 arranged in the Y-direction are disposed between the two inter-block structures 140 arranged in the Y-direction. Between these two structure bodies 200, a contact connection sub-region $r_{300}$ is disposed. Between the inter-block structure 140 and the structure body 200, a conductive layer connection sub-region $r_{110}$ is disposed. These regions extend in the X-direction along the inter-block structure 140.

For example, the structure body 200 extend in the X-direction as illustrated in FIG. 2, also extend in the Z-direction as illustrated in FIG. 5, and is in contact with a semiconductor layer 112A at its lower end. As illustrated in FIG. 5, the structure body 200 is arranged in the position between the contact connection sub-region $r_{300}$ and the conductive layer connection sub-region $r_{110}$. Thus, the structure body 200 separates the insulating layers 101 and an insulating layers 110A, which will be described later, in the contact connection sub-region $r_{300}$, from the insulating layers 101 and the conductive layers 110 in the conductive layer connection sub-region $r_{110}$ in the Y-direction.

Further, for example, as illustrated in FIG. 5, in the vicinity of the structure body 200, below the conductive layer 111, a semiconductor layer 112C, an insulating layer 112B', and the semiconductor layer 112A may be disposed. Furthermore, the structure body 200 may separate the semiconductor layer 112C and the insulating layer 112B' in the Y-direction and may be in contact with the semiconductor layer 112A at its lower end. The semiconductor layer 112A and the semiconductor layer 112C are, for example, semiconductor layers of polycrystalline silicon (Si) or the like. The insulating layer 112B' is silicon oxide ($SiO_2$) or the like.

As illustrated in FIG. 5, the structure body 200 includes, for example, a semiconductor layer 220 of polycrystalline silicon (Si) or the like, an insulating layer 225 of silicon oxide ($SiO_2$) or the like, and a gate insulating film 230.

As illustrated in FIG. 5, the semiconductor layer 220 has an approximate U-shape when viewed in the Y-Z cross-sectional surface and has a structure extending in the X-direction. A Y-Z cross-sectional shape of the semiconductor layer 220 is substantially similar to the shape of the Y-Z cross-sectional shape (FIG. 3) of the semiconductor layer 120.

The semiconductor layer 220 includes a semiconductor region $220_{La}$ and a semiconductor region $220_{Lb}$ that are separated in the Y-direction and are included in the memory cell array layer $L_{MCA1}$, and a semiconductor region $220_{Ua}$, and a semiconductor region $220_{Ub}$ that are separated in the Y-direction and are included in the memory cell array layer $L_{MCA2}$. Further, the semiconductor layer 220 includes a semiconductor region $220_{Ja}$ and a semiconductor region $220_{Jb}$ separated in the Y-direction in a region between the memory cell array layer $L_{MCA1}$ and the memory cell array layer $L_{MCA2}$, and a semiconductor region $220_B$ arranged below the semiconductor region $220_{La}$, and the semiconductor region $220_{Lb}$.

An upper end of the semiconductor region $220_{La}$ is connected to a lower end of the semiconductor region $220_{Ja}$, an upper end of the semiconductor region $220_{Ja}$ is connected to a lower end of the semiconductor region $220_{Ua}$. An upper end of the semiconductor region $220_{Lb}$ is connected to a lower end of the semiconductor region $220_{Jb}$, and an upper end of the semiconductor region $220_{Jb}$ is connected to a lower end of the semiconductor region $220_{Ub}$. The semiconductor region $220_B$ connects a lower end portion of the semiconductor region $220_{La}$ and a lower end portion of the semiconductor region $220_{Lb}$.

The semiconductor regions $220_{La}$ and $220_{Lb}$ are obliquely arranged with respect to the Z-direction when viewed in the Y-Z cross-sectional surface as illustrated in FIG. 5. Moreover, when viewed in the Y-Z cross-sectional surface, the semiconductor regions $220_{La}$ and $220_{Lb}$ are arranged such that a width (width in the Y-direction) of the semiconductor regions $220_{La}$ and $220_{Lb}$ becomes gradually smaller as the semiconductor regions $220_{La}$ and $220_{Lb}$ extend downward along the Z-direction.

The semiconductor regions $220_{Ua}$ and $220_{Ub}$ are obliquely arranged with respect to the Z-direction when viewed in the Y-Z cross-sectional surface as illustrated in FIG. 5. Moreover, when viewed in the Y-Z cross-sectional surface, the semiconductor regions $220_{Ua}$ and $220_{Ub}$ are arranged such that a width (width in the Y-direction) of the semiconductor regions $220_{Ua}$ and $220_{Ub}$ becomes gradually smaller as the semiconductor regions $220_{Ua}$ and $220_{Ub}$ extend downward along the Z-direction.

A width $W_{220LU}$ in the Y-direction at an upper end portion of the semiconductor regions $220_{La}$ and $220_{Lb}$, and a width $W_{220UU}$ in the Y-direction at an upper end portion of the semiconductor regions $220_{Ua}$ and $220_{Ub}$ are substantially equal. A width $W_{220LL}$ in the Y-direction at a lower end portion of the semiconductor regions $220_{La}$ and $220_{Lb}$ and a width $W_{220UL}$ in the Y-direction at a lower end portion of the semiconductor regions $220_{Ua}$ and $220_{Ub}$ are substantially equal.

The above-described "upper end portion of the semiconductor regions $220_{La}$ and $220_{Lb}$" is a portion positioned above and including a position opposed to the conductive layer 110 in the uppermost layer among the plurality of conductive layers 110 included in the memory cell array layer $L_{MCA1}$ in the semiconductor regions $220_{La}$ and $220_{Lb}$. The "upper end portion of the semiconductor regions $220_{Ua}$ and $220_{Ub}$" is a portion positioned above and including a position opposed to the conductive layer 110 in the uppermost layer among the plurality of conductive layers 110 included in the memory cell array layer $L_{MCA2}$ in the semiconductor regions $220_{Ua}$ and $220_{Ub}$. The "lower end portion of the semiconductor regions $220_{La}$ and $220_{Lb}$" is a portion positioned below and including a position opposed to the conductive layer 110 in the lowermost layer among the plurality of conductive layers 110 included in the memory cell array layer $L_{MCA1}$ in the semiconductor regions $220_{La}$ and $220_{Lb}$. The "lower end portion of the semiconductor regions $220_{Ua}$ and $220_{Ub}$" is a portion positioned below and including a position opposed to the conductive layer 110 in the lowermost layer among the plurality of conductive layers 110 included in the memory cell array layer $L_{MCA2}$ in the semiconductor regions $220_{Ua}$ and $220_{Ub}$.

The semiconductor regions $220_{Ja}$ and $220_{Jb}$ are each disposed above the plurality of conductive layers 110 included in the memory cell array layer $L_{MCA1}$ and below the plurality of conductive layers 110 included in the memory cell array layer $L_{MCA2}$. A width $W_{220J}$ in the Y-direction of the semiconductor regions $220_{La}$ and $220_{Lb}$ is larger than the width $W_{220LU}$ in the Y-direction at the upper end portion of the semiconductor regions $220_{La}$ and $220_{Lb}$ and the width $W_{220UU}$ in the Y-direction at the upper end portion of the semiconductor regions $220_{Ua}$ and $220_{Ub}$.

The widths $W_{220LU}$, $W_{220UU}$ (FIG. 5) of the semiconductor layer 220 can be made larger than 0.5 times of and smaller than 2.0 times of the widths $W_{120LU}$, $W_{120UU}$ (FIG. 3) of the semiconductor layer 120. The widths $W_{220LL}$, $W_{220UL}$ (FIG. 5) of the semiconductor layer 220 can be made larger than 0.5 times of and smaller than 2.0 times of the widths $W_{120LL}$, $W_{120UL}$ (FIG. 3) of the semiconductor layer 120. The width $W_{220J}$ (FIG. 5) of the semiconductor layer 220 can be made larger than 0.5 times of and smaller than 2.0 times of the width $W_{120J}$ (FIG. 3) of the semiconductor layer 120.

In a portion between the semiconductor regions $220_{La}$, $220_{Ja}$, and $220_{Ua}$ and the semiconductor regions $220_{Lb}$, $220_{Jb}$, and $220_{Ub}$ of the semiconductor layer 220, the insulating layer 225 of silicon oxide or the like is disposed. The insulating layer 225 extends in the Z-direction and also extends in the X-direction.

The gate insulating film 230 covers the outer surface (a surface at a side opposite to a surface where the insulating layer 225 is disposed) of the semiconductor layer 220 and has a structure that has an approximate U-shape when viewed in the Y-Z cross-sectional surface and extends in the X-direction.

For example, as illustrated in FIG. 6, the gate insulating film 230 includes a tunnel insulating film 231, an electric charge accumulating film 232, and a block insulating film 233, which are stacked between the semiconductor layer 220 and the conductive layers 110. The tunnel insulating film 231 and the block insulating film 233 are insulating films of silicon oxide ($SiO_2$) or the like. The electric charge accumulating film 232 is a film that can accumulate electric charge, and is silicon nitride ($Si_3N_4$) or the like. The tunnel insulating film 231, the electric charge accumulating film 232, and the block insulating film 233 extend in the X-direction along the outer surface (a surface at a side opposite to the surface where the insulating layer 225 is disposed) of the semiconductor layer 220.

The Y-Z cross-sectional shape of the structure body 200 including the semiconductor layer 220, the insulating layer 225, and the gate insulating film 230 illustrated in FIG. 5 is approximately similar to the Y-Z cross-sectional shape of the structure including the semiconductor layer 120, the insulating layer 125, and the gate insulating film 130 illustrated in FIG. 3. Further, a width in the Y-direction at each height position of the structure body 200 illustrated in FIG. 5 can be made larger than 0.5 times of and smaller than 2.0 times of the width in the radial direction at each height position of the structure including the semiconductor layer 120, the insulating layer 125, and the gate insulating film 130 illustrated in FIG. 3.

As illustrated in FIG. 5, the contact connection sub-region $r_{300}$ includes the plurality of insulating layers 110A arranged in the Z-direction and a through contact 300 extending in the Z-direction.

The insulating layer 110A is an approximately plate-shaped insulating layer extending in the X-direction. The insulating layer 110A may include an insulating layer of silicon nitride (SiN) or the like. Between each of the plurality of insulating layers 110A arranged in the Z-direction, the insulating layer 101 of silicon oxide ($SiO_2$) or the like is disposed.

For example, as illustrated in FIG. 2, the plurality of through contacts 300 are arranged in the X-direction. The through contact 300 may include, for example, a stacked film including the barrier conductive film of titanium nitride (TiN) or the like and the metal film of tungsten (W) or the like. For example, as illustrated in FIG. 5, the through contact 300 has an outer peripheral surface surrounded by the respective plurality of insulating layers 110A and the respective plurality of insulating layers 101 and opposed to the plurality of insulating layers 110A and the plurality of insulating layers 101.

Thus, since the through contact 300 has the outer peripheral surface surrounded by the plurality of insulating layers 110A and the plurality of insulating layers 101, an electrical insulation withstand voltage between the through contact 300 and the plurality of conductive layers 110 functioning as the word line or the like can be ensured. The through contact 300 extends in the Z-direction and has an upper end connected to the wiring in the wiring layer at the upper layer side. Furthermore, the through contact 300 has a lower end connected to the wiring in the wiring layer at the lower layer side and is electrically connected to the transistor layer disposed below the wiring at the lower layer side via this wiring.

For example, as illustrated in FIG. 2, the conductive layer connection sub-region $r_{110}$ includes a narrow-width portion $110_{300}$ of the plurality of conductive layers 110 arranged in the Z-direction. The plurality of conductive layers 110 included in the two memory hole regions $R_{MH}$ adjacent in the X-direction are electrically conducted with one another via this narrow-width portion $110_{300}$.

As illustrated in FIG. 2, in an end portion region in the X-direction of the contact connection sub-region $r_{300}$ and the conductive layer connection sub-region $r_{110}$, approximately cylindrical support members 400 functioning to support the insulating layers 101 during manufacturing processes is disposed. As illustrated in FIG. 7, the support member 400 extends in the Z-direction and has a lower end connected to the semiconductor layer 112. The support member 400 contains silicon oxide ($SiO_2$) or the like. For example, as illustrated in FIG. 7, the support member 400 has an outer peripheral surface that is surrounded by the plurality of conductive layers 110 and the plurality of insulating layers 101 included in each of the memory cell array layers $L_{MCA1}$ and $L_{MCA2}$ and is opposed to the plurality of conductive layers 110 and the plurality of insulating layers 101.

The support member 400 includes a support member region $400_L$ included in the memory cell array layer $L_{MCA1}$ and a support member region $400_U$ included in the memory cell array layer $L_{MCA2}$. The support member 400 includes a support member region $400_J$ disposed between the support member region $400_L$ and the support member region $400_U$. The support member region $400_J$ is disposed above the plurality of conductive layers 110 included in the memory cell array layer $L_{MCA1}$ and is disposed below the plurality of conductive layers 110 included in the memory cell array layer $L_{MCA2}$.

The Y-Z cross-sectional shape of the support member 400 illustrated in FIG. 7 is approximately similar to the Y-Z cross-sectional shape of the structure including the semiconductor layer 120, the insulating layer 125, and the gate insulating film 130 illustrated in FIG. 3.

A width $W_{400LU}$ in the radial direction at an upper end portion of the support member region $400_L$ and a width $W_{400UU}$ in the radial direction at an upper end portion of the support member region $400_U$ are substantially equal. A width $W_{400LL}$ in the radial direction at a lower end portion of the support member region $400_L$ and a width $W_{400UL}$ in the radial direction at a lower end portion of the support member region $400_U$ are substantially equal. A width $W_{400J}$ in the radial direction of the support member region $400_J$ is larger than the width $W_{400LU}$ in the radial direction at the upper end portion of the support member region $400_L$ and the width $W_{400UU}$ in the radial direction at the upper end portion of the support member region $400_U$.

The above-described "upper end portion of the support member region $400_L$" is a portion positioned above and including a position opposed to the conductive layer 110 in the uppermost layer among the plurality of conductive layers 110 included in the memory cell array layer $L_{MCA1}$ in the support member region $400_L$. The "upper end portion of the support member region $400_U$" is a portion positioned above and including a position opposed to the conductive layer 110 in the uppermost layer among the plurality of conductive layers 110 included in the memory cell array layer $L_{MCA2}$ in the support member region $400_U$. The "lower end portion of the support member region $400_L$" is a portion positioned below and including a position opposed to the conductive layer 110 in the lowermost layer among the plurality of conductive layers 110 included in the memory cell array layer $L_{MCA1}$ in the support member region $400_L$. The "lower end portion of the support member region $400_U$" is a portion positioned below and including a position opposed to the conductive layer 110 in the lowermost layer among the plurality of conductive layers 110 included in the memory cell array layer $L_{MCA2}$ in the support member region $400_U$.

In dimensions, a width in the Y-direction of the support member 400 illustrated in FIG. 7 is slightly longer than or approximately equal to the width in the radial direction of the structure including the semiconductor layer 120, the insulating layer 125, and the gate insulating film 130 illustrated in FIG. 3 and is shorter than the width in the Y-direction of the inter-block structure 140 illustrated in FIG. 3.

More specifically, in dimensions, the width $W_{400LU}$ in the Y-direction at the upper end portion of the support member region $400_L$ and the width $W_{400UU}$ in the Y-direction at the upper end portion of the support member region $400_U$ in the support member 400 are slightly longer than or approximately equal to the width $W_{120LU}$ at the upper end portion of the semiconductor region $120_L$ and the width $W_{120UU}$ at the upper end portion of the semiconductor region $120_U$ in the semiconductor layer 120. Moreover, in dimensions, the width $W_{400LL}$ in the Y-direction at the lower end portion of the support member region $400_L$ and the width $W_{400UL}$ in the Y-direction at the lower end portion of the support member region $400_U$ in the support member 400 are slightly longer than or approximately equal to the width $W_{120LL}$ at the lower end portion of the semiconductor region $120_L$ and the width $W_{120UL}$ at the lower end portion of the semiconductor region $120_U$ in the semiconductor layer 120. Furthermore, in dimensions, the width $W_{400J}$ in the Y-direction of the support member region $400_J$ in the support member 400 is slightly longer than or approximately equal to the width $W_{120J}$ of the semiconductor region $120_J$ in the semiconductor layer 120.

[Energization Structure]

As illustrated in FIG. 2 and FIG. 5, the semiconductor layers 220 of the structure bodies 200 are each electrically connected to a wiring m included in the wiring layer at the upper layer side via contacts C1 and C2.

[Manufacturing Method]

Next, the manufacturing method of the semiconductor memory device according to the first embodiment is described with reference to FIG. 8 to FIG. 24. FIG. 8, FIG. 9, FIG. 11 to FIG. 15, FIG. 17 to FIG. 22, and FIG. 24 are schematic cross-sectional views for describing the manufacturing method and illustrate the cross-sectional surfaces corresponding to FIG. 3. FIG. 10, FIG. 16, and FIG. 23 are schematic cross-sectional views for describing the manufacturing method and illustrate the cross-sectional surfaces corresponding to FIG. 5.

In manufacturing the semiconductor memory device according to the first embodiment, first, the transistor layer and the wiring layer at the lower layer side are formed on the semiconductor substrate 100 (FIG. 1). On a top surface of the wiring layer at the lower layer side, the insulating layer is formed.

Figure 8:
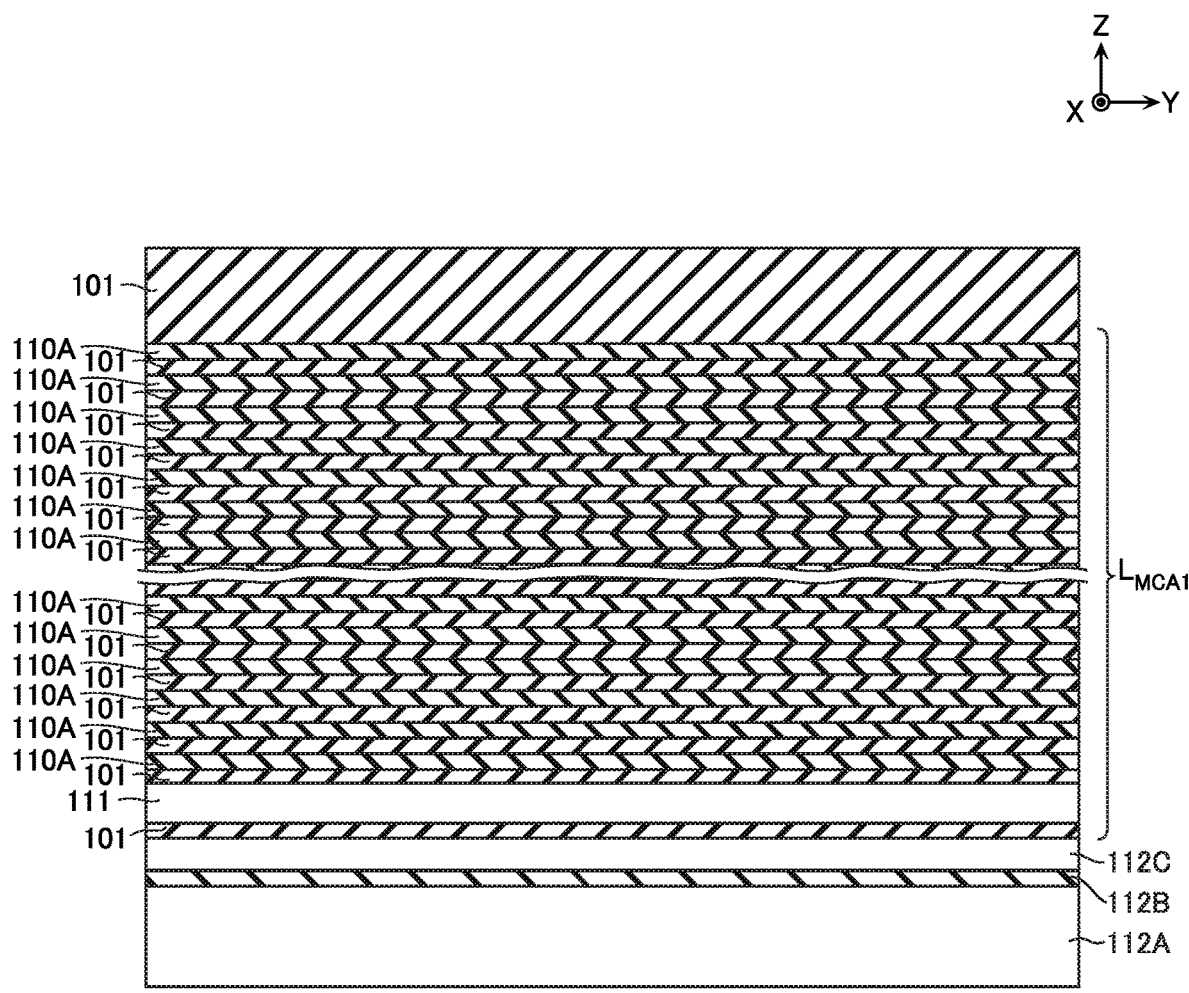
FIG. 8 is a schematic Y-Z cross-sectional view illustrating a manufacturing method of the semiconductor memory device according to the first embodiment.

Next, for example, as illustrated in FIG. 8, on the insulating layer, the semiconductor layer 112A, a sacrifice layer 112B, the semiconductor layer 112C, the insulating layer 101, and the conductive layer 111 are formed. On the conductive layer 111, the plurality of insulating layers 101 and the plurality of insulating layers 110A are formed in alternation. Furthermore, on a top surface of the structure of the plurality of insulating layers 101 and the plurality of insulating layers 110A, which are formed in alternation, the insulating layer 101 is formed. This process is performed by, for example, a method such as Chemical Vapor Deposition (CVD). Furthermore, in the sacrifice layer 112B and a part of the sacrifice layer 112B, the insulating layer 112B' may be disposed.

Figure 9:
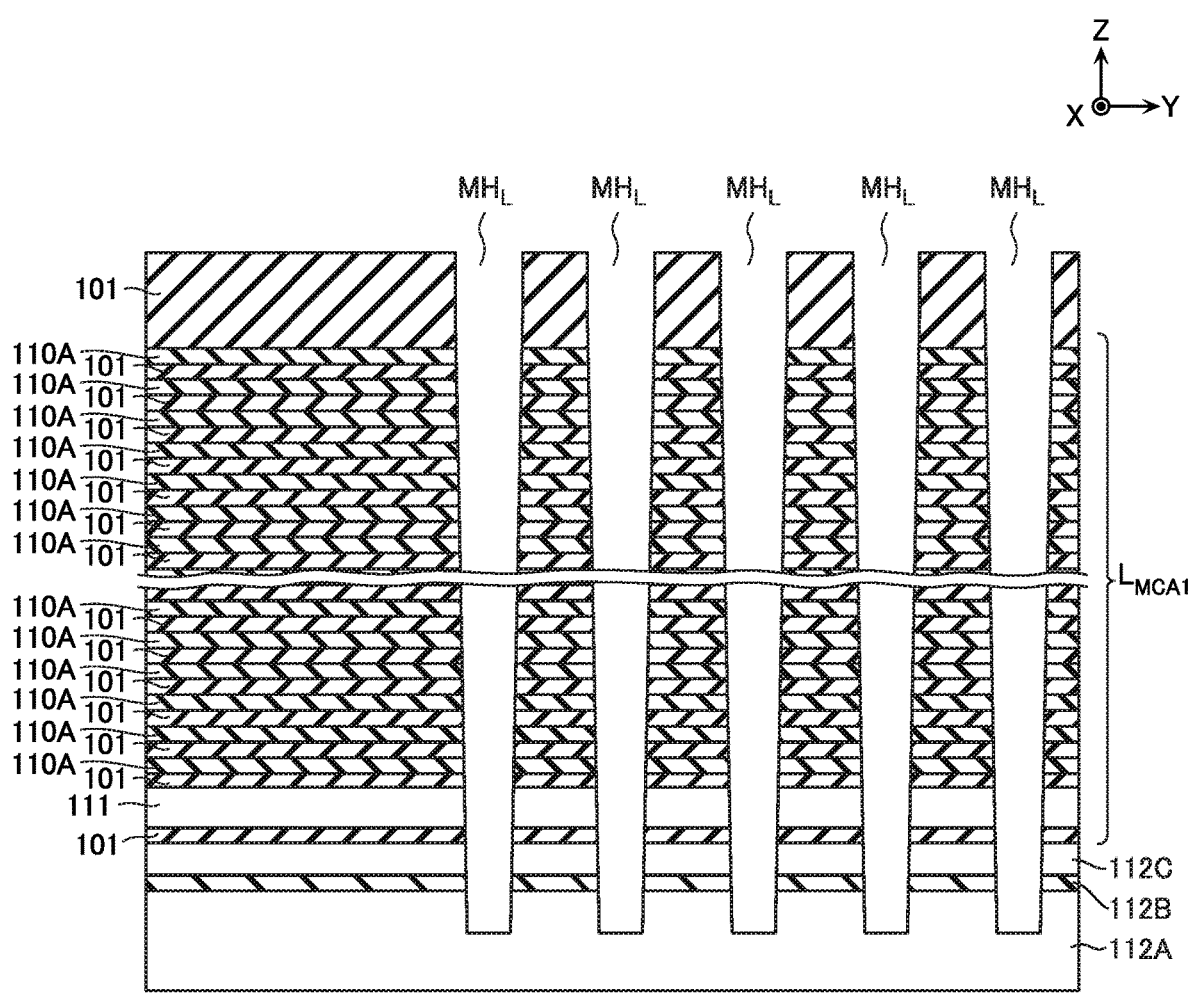
FIG. 9 is a schematic Y-Z cross-sectional view illustrating the manufacturing method of the semiconductor memory device according to the first embodiment.
Figure 10:
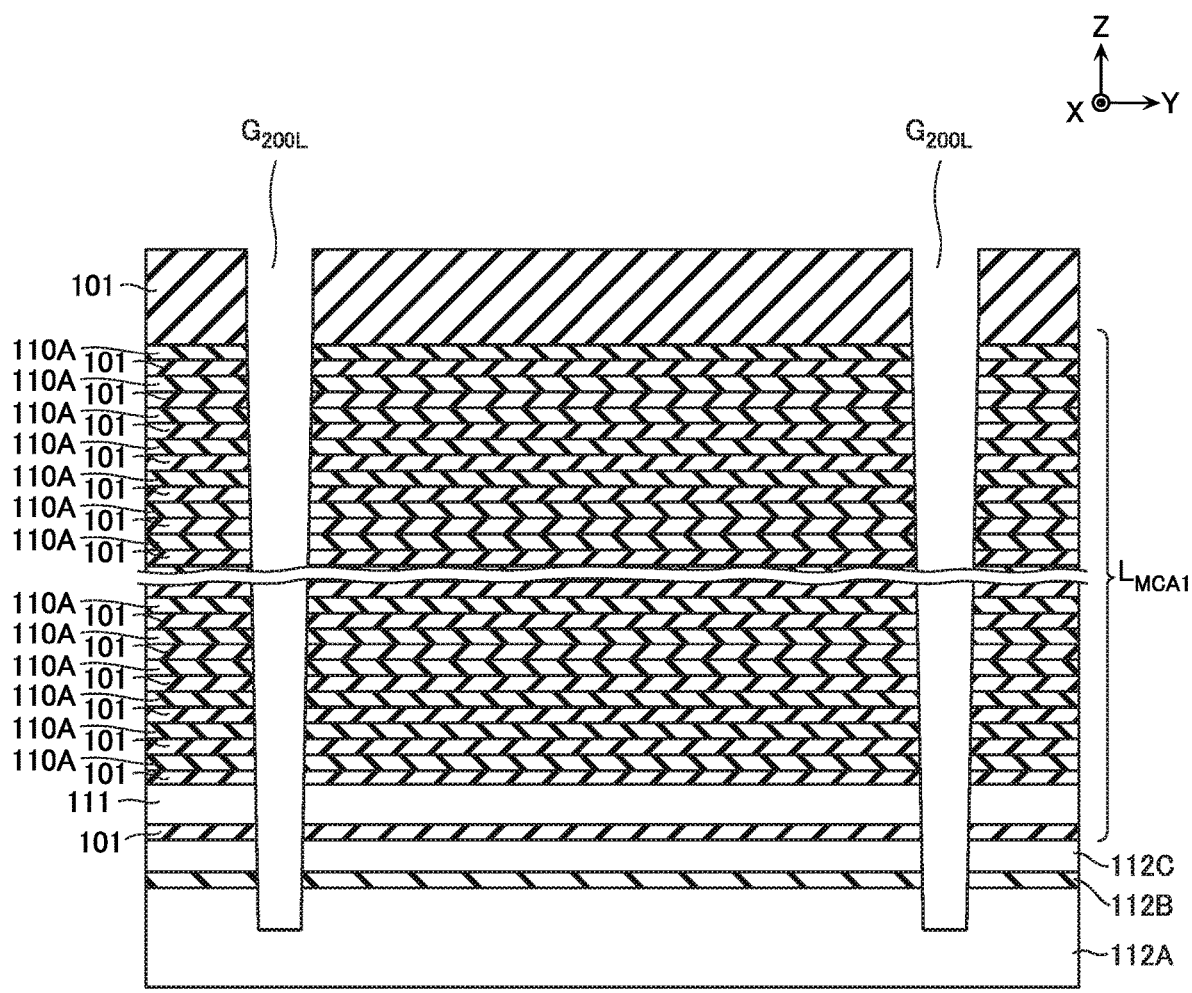
FIG. 10 is a schematic Y-Z cross-sectional view illustrating the manufacturing method of the semiconductor memory device according to the first embodiment.

Next, for example, as illustrated in FIG. 9, the plurality of memory holes $MH_L$ are formed at the positions corresponding to the semiconductor layers 120. The memory hole $MH_L$ is a through hole that extends in the Z-direction, passes through the plurality of insulating layers 101 and the plurality of insulating layers 110A, the conductive layer 111, the semiconductor layer 112C, and the sacrifice layer 112B, and reaches the semiconductor layer 112A. This process is performed by, for example, a method such as Reactive Ion Etching (RIE).

Furthermore, for example, as illustrated in FIG. 10, simultaneously with the formation of the memory holes $MH_L$ shown in FIG. 9, trenches $G_{200L}$ are formed at the positions corresponding to the structure bodies 200. The trench $G_{200L}$ is a trench that extends in the Z-direction and X-direction, passes through the plurality of insulating layers 101 and the plurality of insulating layers 110A, the conductive layer 111, the semiconductor layer 112C, and the sacrifice layer 112B, and reaches the semiconductor layer 112A. This process is performed by, for example, a method such as RIE.

Figure 11:
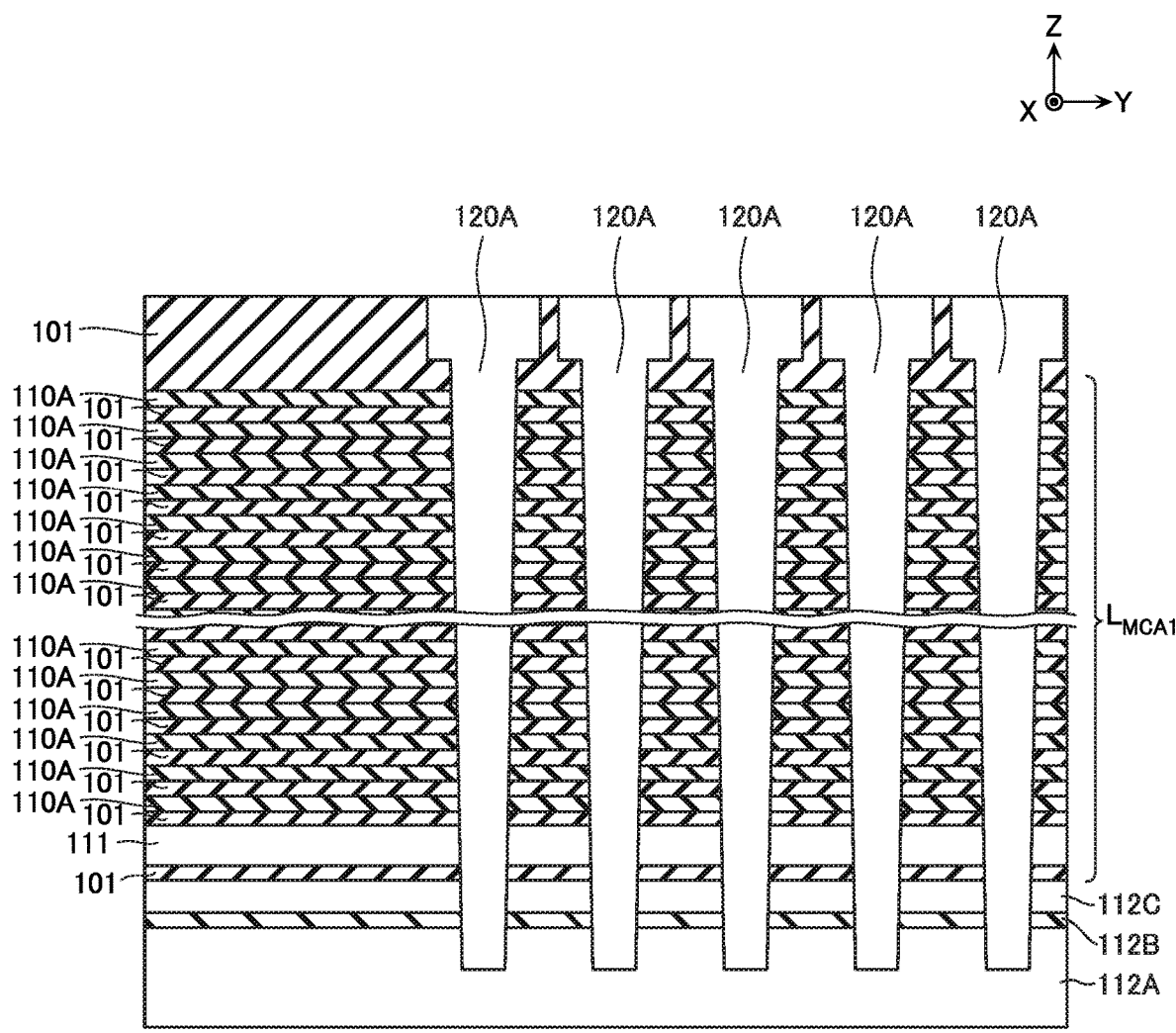
FIG. 11 is a schematic Y-Z cross-sectional view illustrating the manufacturing method of the semiconductor memory device according to the first embodiment.

Next, for example, as illustrated in FIG. 11, an amorphous silicon film 120A is formed inside the memory hole $MH_L$. Furthermore, while the illustration is omitted, simultaneously with this process, the amorphous silicon film 120A is also formed inside the trench $G_{200L}$ shown in FIG. 10. This process is performed by, for example, a method such as CVD. In this process, before the formation of the amorphous silicon film 120A, an insulation film of silicon oxide ($SiO_2$), silicon nitride (SiN), or the like may be formed.

Next, the upper end portion of the amorphous silicon film 120A is removed by wet etching or the like. A part of the insulating layer 101 in the uppermost layer is removed by wet etching or the like to enlarge a radius at the upper end of the memory hole $MH_L$ and a width in the Y-direction of the trench $G_{200L}$. Inside the upper end of the memory hole $MH_L$ and the trench $G_{200L}$, the amorphous silicon film 120A is further formed.

Next, while the illustration is omitted, for example, at the position corresponding to the support member 400 shown in FIG. 7, a hole $H_{400L}$ (FIG. 7) is formed. The hole $H_{400L}$ is a through hole that, similar to the memory hole $MH_L$, extends in the Z-direction, passes through the plurality of insulating layers 101 and the plurality of insulating layers 110A, the conductive layer 111, the semiconductor layer 112C, and the sacrifice layer 112B and reaches the semiconductor layer 112A. This process is performed by, for example, a method such as RIE.

Next, while the illustration is omitted, the amorphous silicon film 120A is formed inside the hole $H_{400L}$, the radius of the upper end of the hole $H_{400L}$ is enlarged, and silicon oxide ($SiO_2$) or the like is filled inside the upper end of the hole $H_{400L}$. This process is performed by, for example, a method such as CVD.

Figure 12:
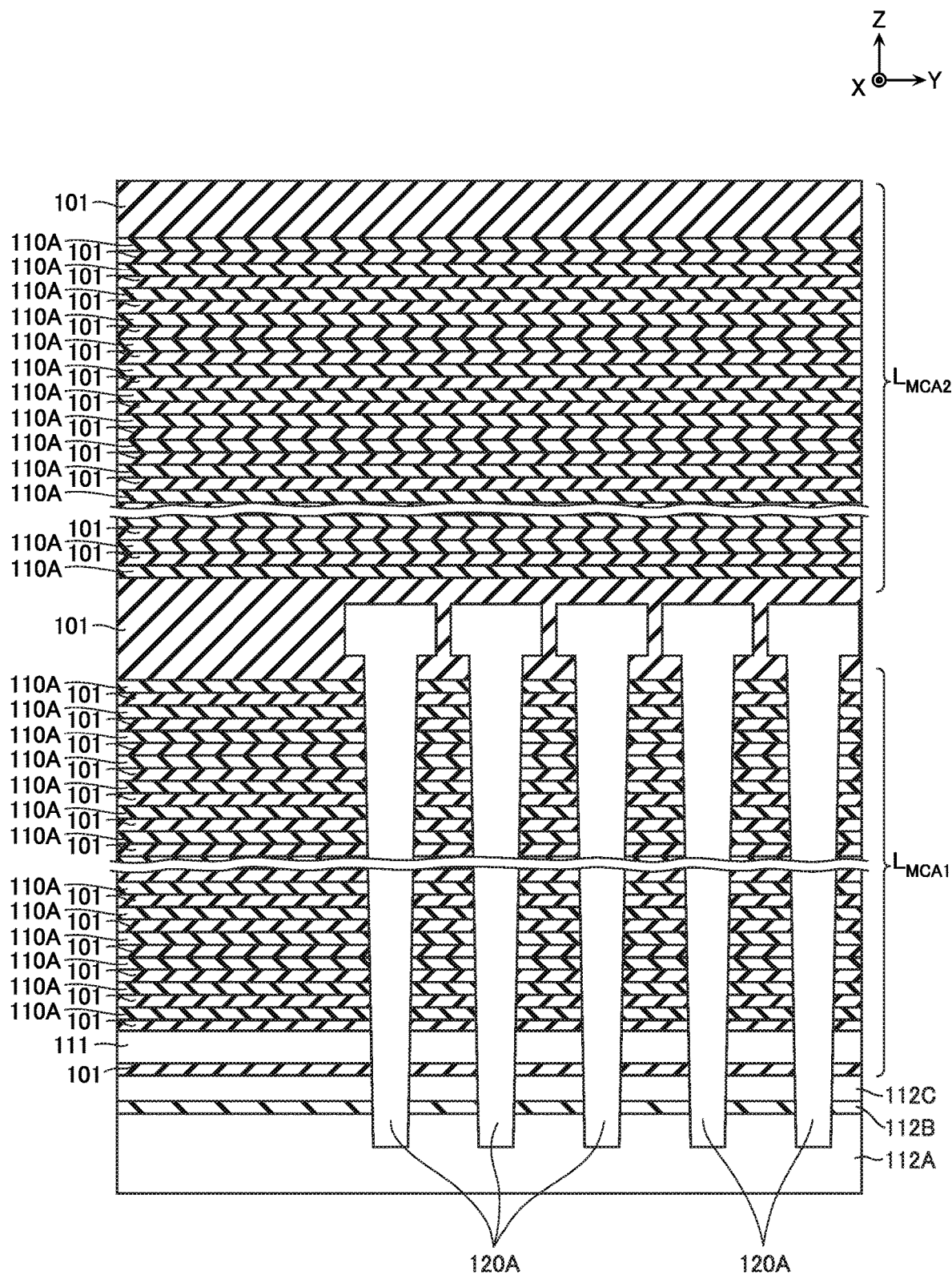
FIG. 12 is a schematic Y-Z cross-sectional view illustrating the manufacturing method of the semiconductor memory device according to the first embodiment.

Next, for example, as illustrated in FIG. 12, on the top surface of the structure described with reference to FIG. 11, the plurality of insulating layers 101 and the plurality of insulating layers 110A are formed in alternation. This process is performed by, for example, a method such as CVD. At this time, also on the top surface of the structure that includes the trench $G_{200L}$ (FIG. 10) where the amorphous silicon film 120A is formed, and on the top surface of the structure that includes the hole $H_{400L}$ (FIG. 7) where silicon oxide ($SiO_2$) or the like is filled, the plurality of insulating layers 101 and the plurality of insulating layers 110A are formed in alternation.

Figure 13:
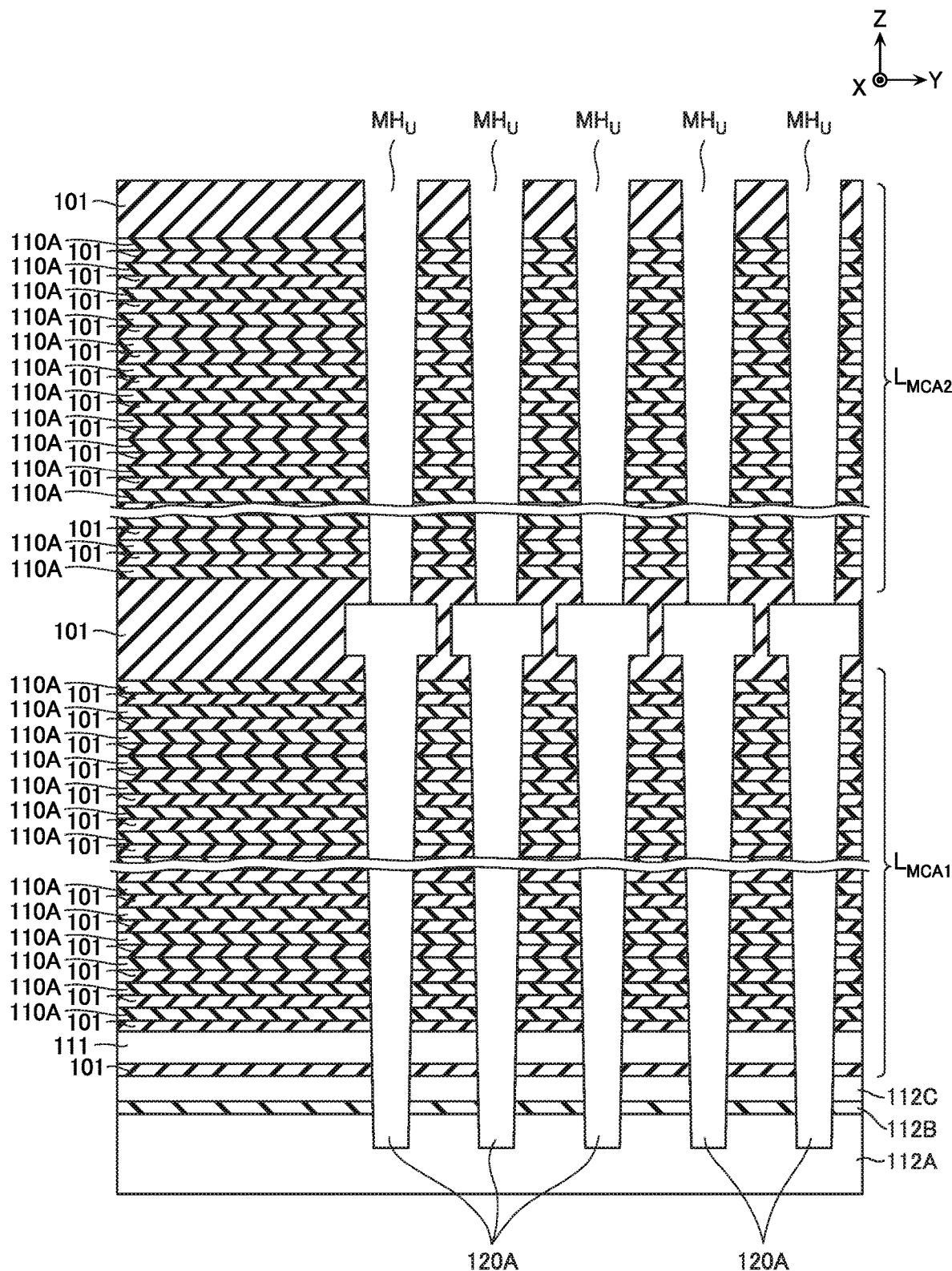
FIG. 13 is a schematic Y-Z cross-sectional view illustrating the manufacturing method of the semiconductor memory device according to the first embodiment.

Next, for example, as illustrated in FIG. 13, at the positions corresponding to the semiconductor layers 120, the plurality of memory holes $MH_U$ are formed. This memory hole $MH_U$ is a through hole that extends in the Z-direction and passes through the insulating layers 101 and the insulating layers 110A and causes the top surface of the amorphous silicon film 120A inside the memory hole $MH_L$ to be exposed. This process is performed by, for example, a method such as RIE.

Furthermore, simultaneously with the formation of the memory hole $MH_U$ shown in FIG. 13, for example, at the position corresponding to the structure body 200 shown in FIG. 5, a trench $G_{200U}$ (FIG. 16) is formed. The trench $G_{200U}$ is a trench that extends in the Z-direction and X-direction to separate the plurality of insulating layers 101 and the plurality of insulating layers 110A in the Y-direction. A lower end surface (bottom surface) of the trench $G_{200U}$ causes the top surface of the amorphous silicon film 120A inside the trench $G_{200L}$ to be exposed. This process is performed by, for example, a method such as RIE.

Figure 14:
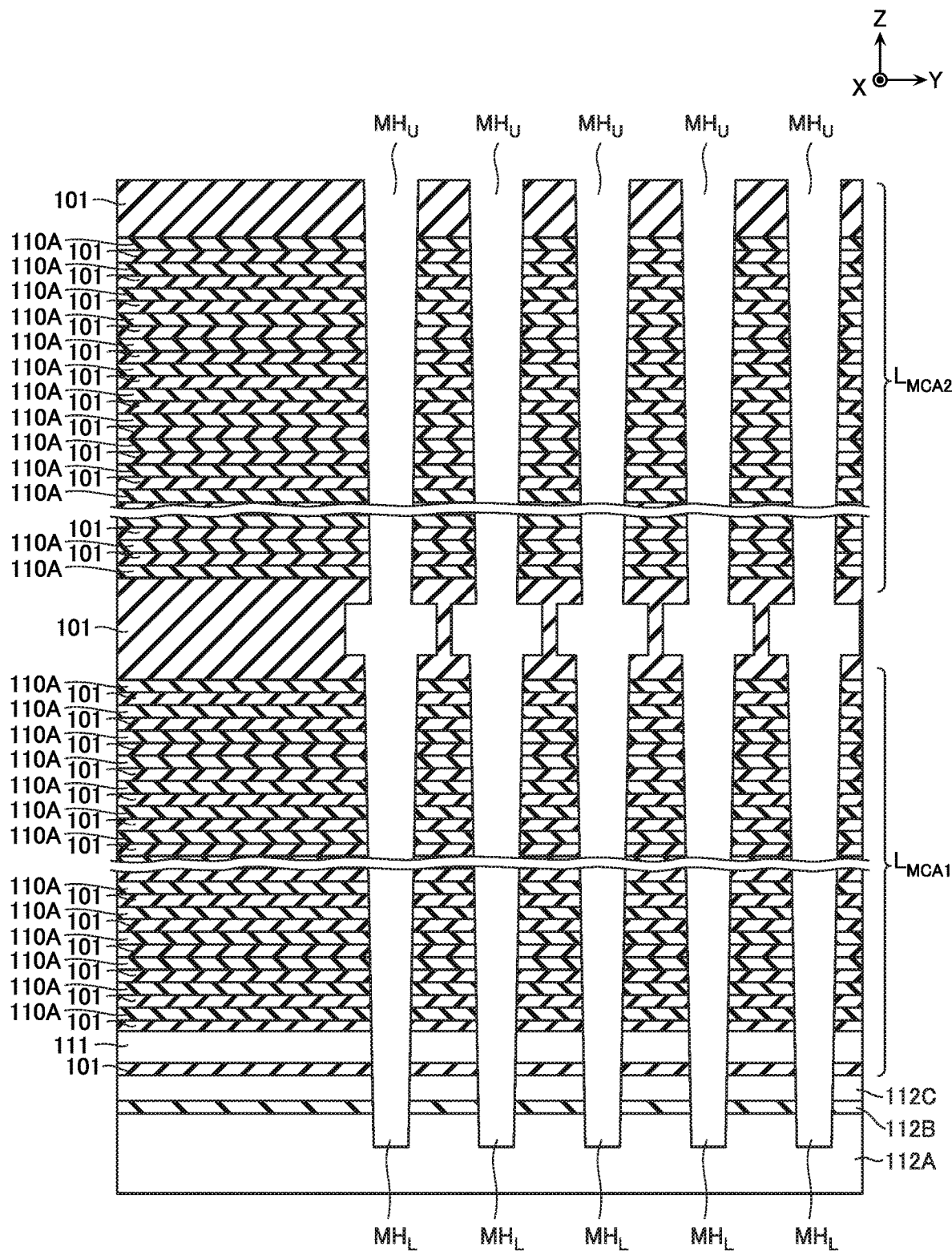
FIG. 14 is a schematic Y-Z cross-sectional view illustrating the manufacturing method of the semiconductor memory device according to the first embodiment.

Next, for example, as illustrated in FIG. 14, the amorphous silicon film 120A inside the memory hole $MH_T$ is removed. This process is performed by, for example, a method such as wet etching.

Furthermore, the amorphous silicon film 120A inside the trench $G_{200L}$ is removed. This process is performed by, for example, a method such as wet etching.

Next, for example, at the position corresponding to the support member 400 shown in FIG. 7, a hole $H_{400U}$ (FIG. 7) is formed. The hole $H_{400U}$ is a through hole that extends in the Z-direction and passes through the insulating layers 101 and the insulating layers 110A and causes the top surface of silicon oxide ($SiO_2$) or the like inside the hole $H_{400L}$ to be exposed. On the inner peripheral surface of this hole $H_{400U}$ (FIG. 7), silicon oxide ($SiO_2$) or the like is filled. This process is performed by, for example, a method such as CVD. Thus, the support member 400 (FIG. 2, FIG. 7) is formed by silicon oxide ($SiO_2$) or the like being filled inside the holes $H_{400L}$ and $H_{400U}$.

Figure 15:
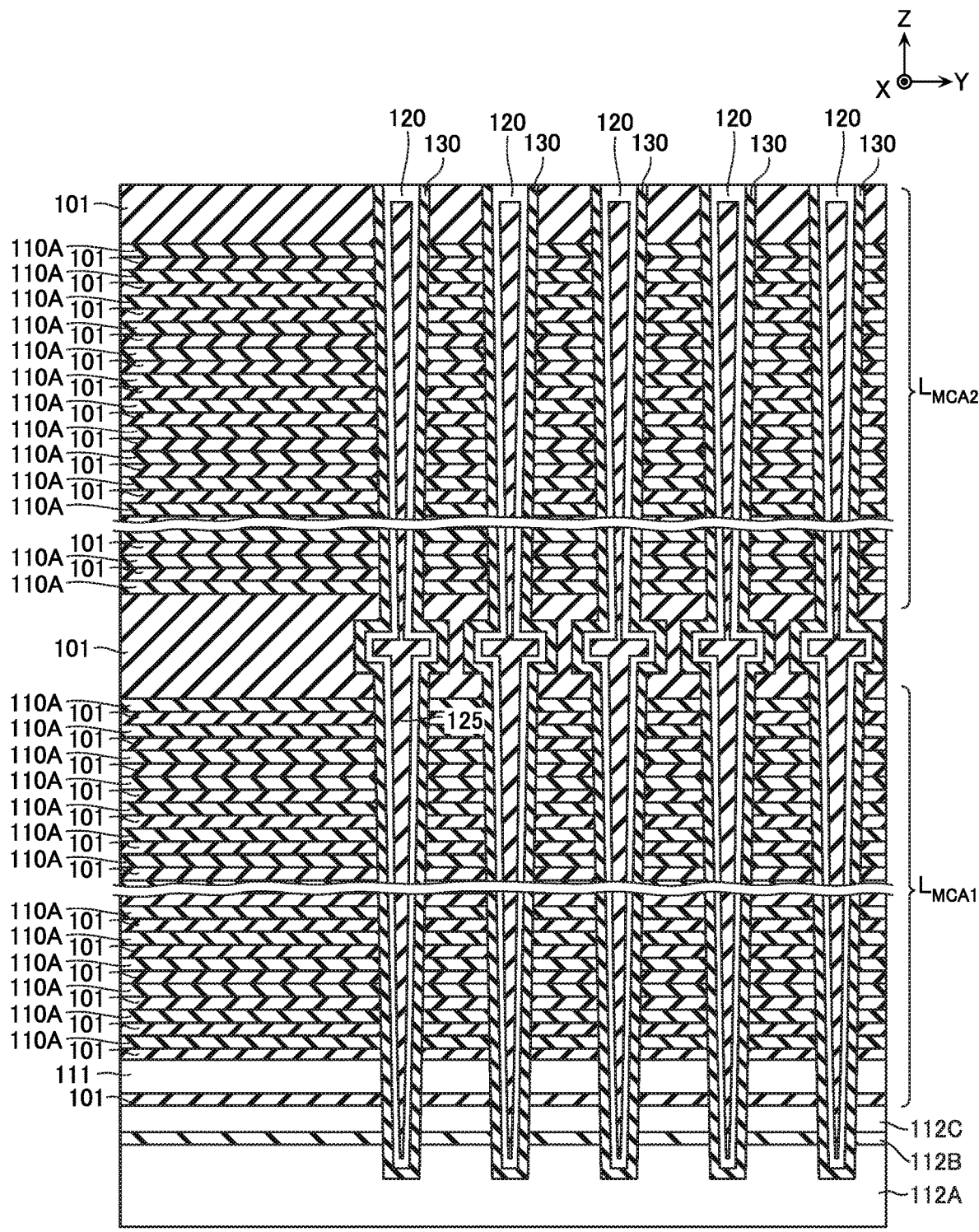
FIG. 15 is a schematic Y-Z cross-sectional view illustrating the manufacturing method of the semiconductor memory device according to the first embodiment.
Figure 16:
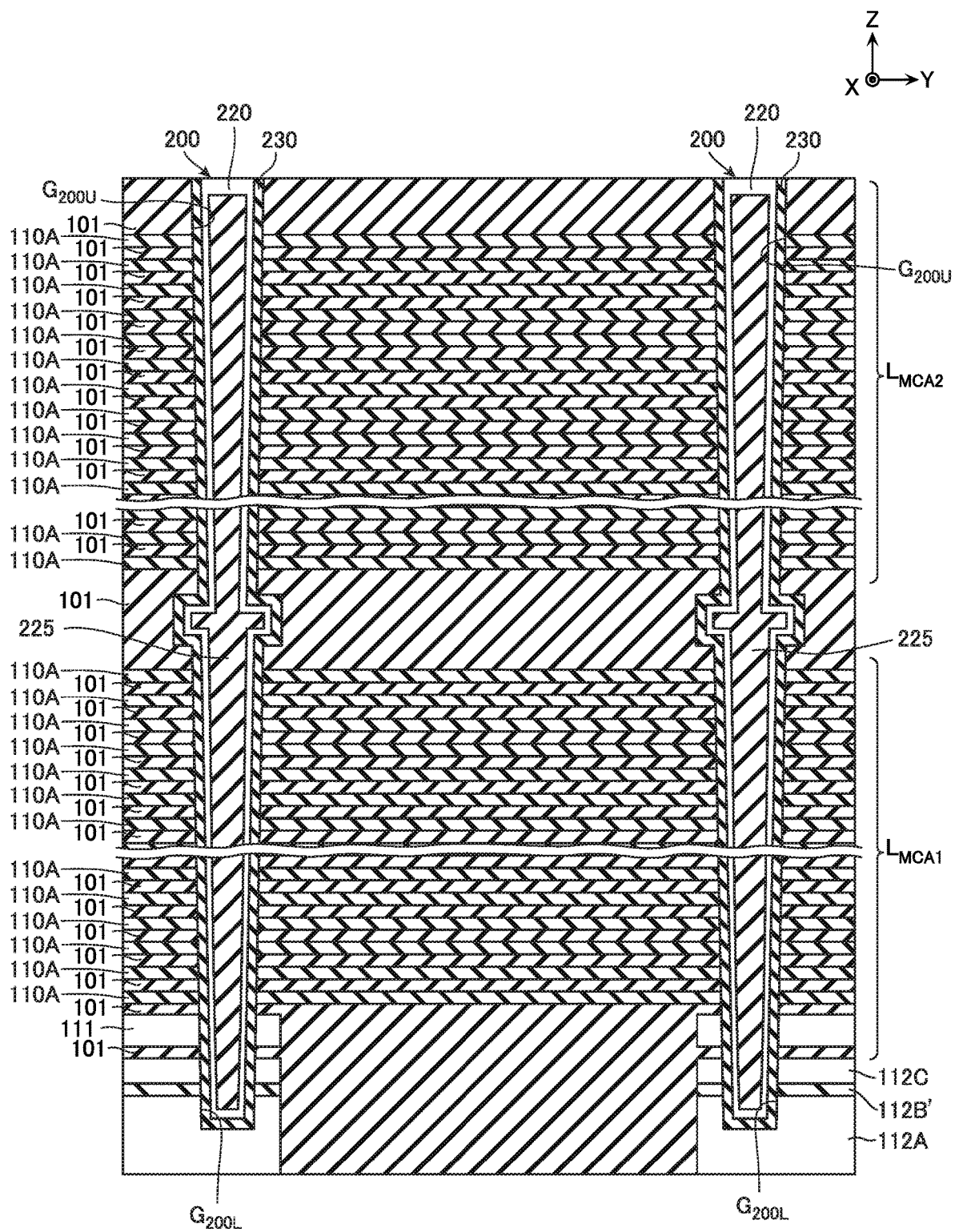
FIG. 16 is a schematic Y-Z cross-sectional view illustrating the manufacturing method of the semiconductor memory device according to the first embodiment.

Next, for example, as illustrated in FIG. 15, on the inner peripheral surfaces of the memory holes $MH_L$ and $MH_U$, the gate insulating film 130, the semiconductor layer 120, and the insulating layer 125 are formed. In this process, for example, a film formation by CVD or the like is performed, and the amorphous silicon film is formed inside the memory holes $MH_L$ and $MH_U$. Furthermore, a crystalline structure of the amorphous silicon film is modified by an annealing process or the like.

Further, for example, as illustrated in FIG. 16, on the inner surface (the side surface and the bottom surface) of the trenches $G_{200L}$ and $G_{200U}$, the structure body 200 including the gate insulating film 230, the semiconductor layer 220, and the insulating layer 225 is formed. In this process, a film formation by CVD or the like is performed, and the amorphous silicon film is formed inside the trenches $G_{200L}$ and $G_{200U}$. Furthermore, the crystalline structure of this amorphous silicon film is modified by the annealing process or the like. This process is performed, for example, simultaneously with the formation of the gate insulating film 130, the semiconductor layer 120, and the insulating layer 125 shown in FIG. 15.

Figure 17:
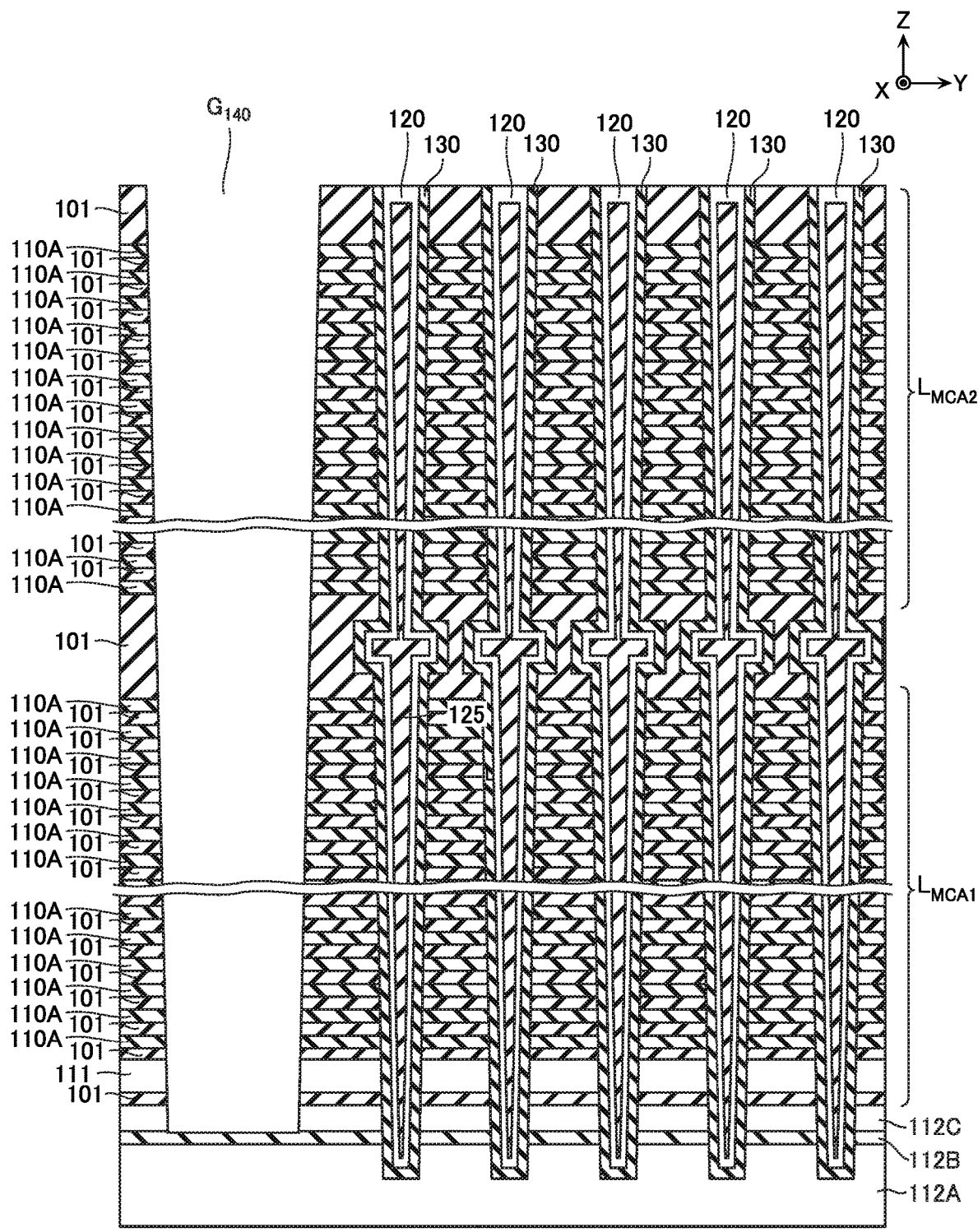
FIG. 17 is a schematic Y-Z cross-sectional view illustrating the manufacturing method of the semiconductor memory device according to the first embodiment.

Next, for example, as illustrated in FIG. 17, at the position corresponding to the inter-block structure 140, a trench $G_{140}$ is formed. The trench $G_{140}$ is a trench that extends in the Z-direction and X-direction and separates the insulating layers 101, the insulating layers 110A, the conductive layer 111, and the like in the Y-direction. This process is performed by, for example, a method such as RIE.

Figure 18:
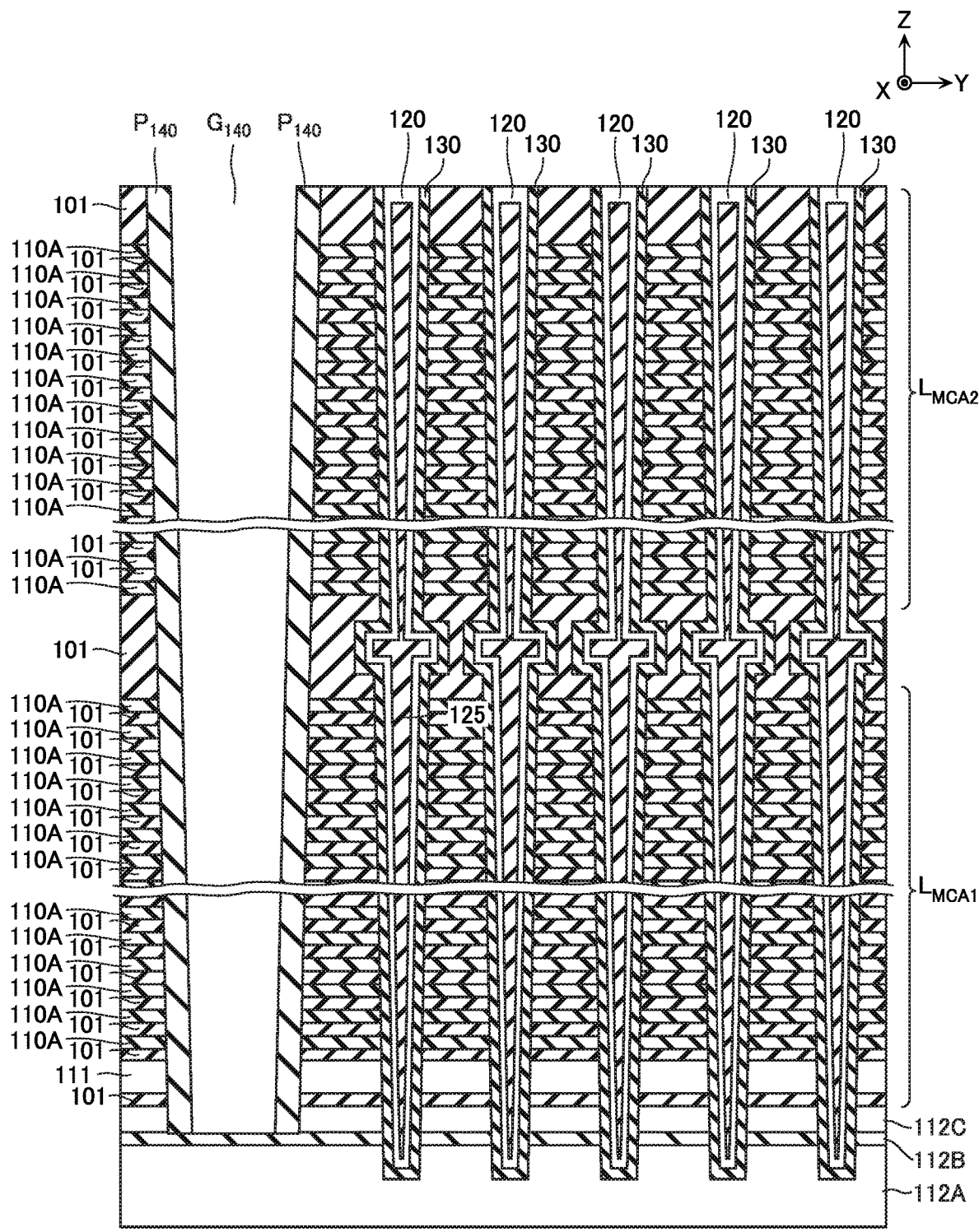
FIG. 18 is a schematic Y-Z cross-sectional view illustrating the manufacturing method of the semiconductor memory device according to the first embodiment.

Next, for example, as illustrated in FIG. 18, on the side surface in the Y-direction of the trench $G_{140}$, a protective film $P_{140}$ of silicon nitride or the like is formed. In this process, for example, an insulation film of silicon nitride or the like is formed on the side surface in the Y-direction and the bottom surface of the trench $G_{140}$ by a method such as CVD. Furthermore, of this insulation film, a portion covering the bottom surface of the trench $G_{140}$ is removed by a method such as RIE.

Figure 19:
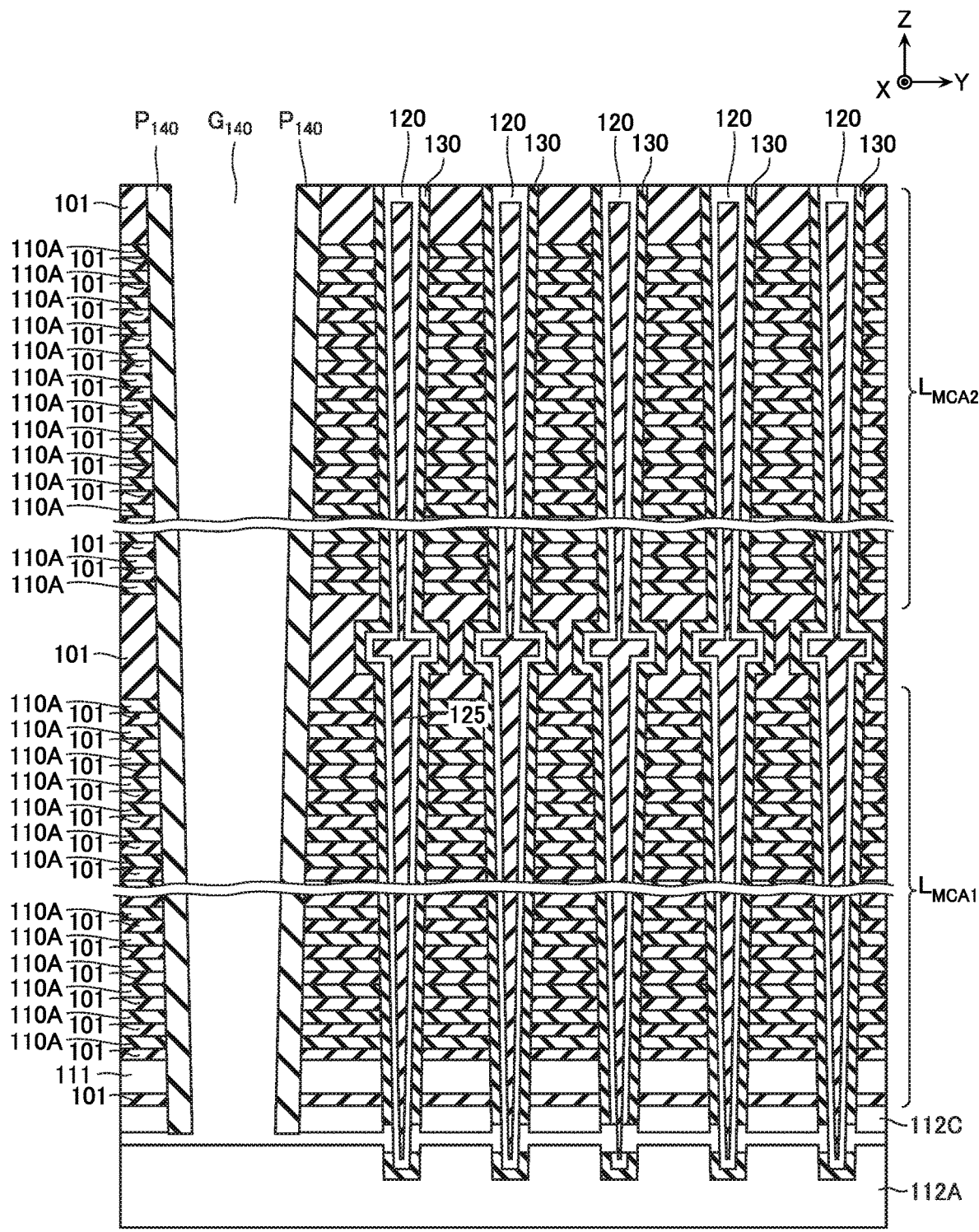
FIG. 19 is a schematic Y-Z cross-sectional view illustrating the manufacturing method of the semiconductor memory device according to the first embodiment.

Next, for example, as illustrated in FIG. 19, the sacrifice layer 112B and a part of the gate insulating film 130 are removed to cause a part of the semiconductor layer 120 to be exposed. This process is performed by, for example, a method such as wet etching.

As illustrated in FIG. 23, in this process, in the contact connection sub-region $r_{300}$, that is, in the region between the pair of structure bodies 200, 200 that extend in the X-direction and are separated in the Y-direction, the insulating layer 112B' remains.

Figure 20:
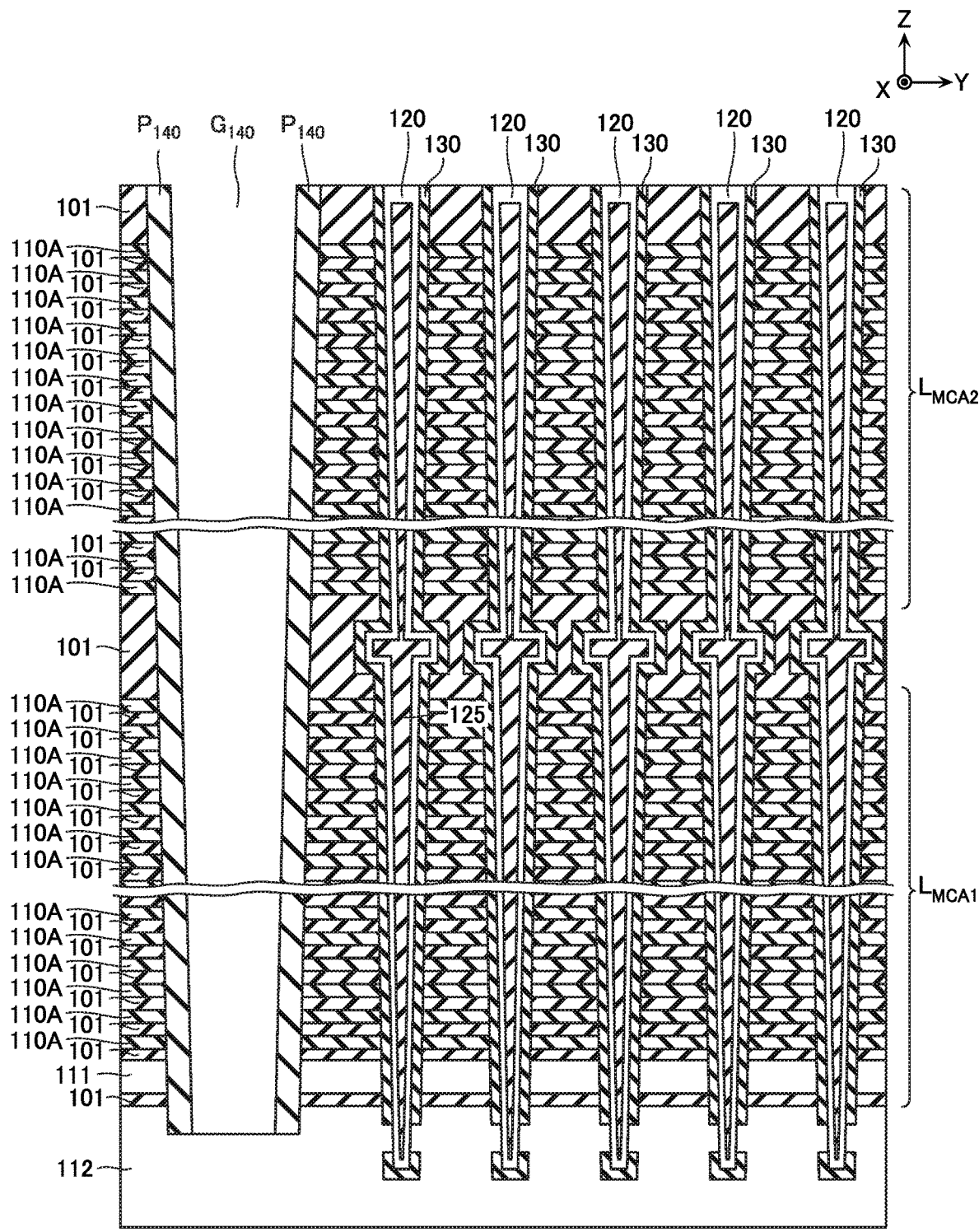
FIG. 20 is a schematic Y-Z cross-sectional view illustrating the manufacturing method of the semiconductor memory device according to the first embodiment.

Next, for example, as illustrated in FIG. 20, the semiconductor layer 112 is formed by epitaxial growth or the like.

Figure 21:
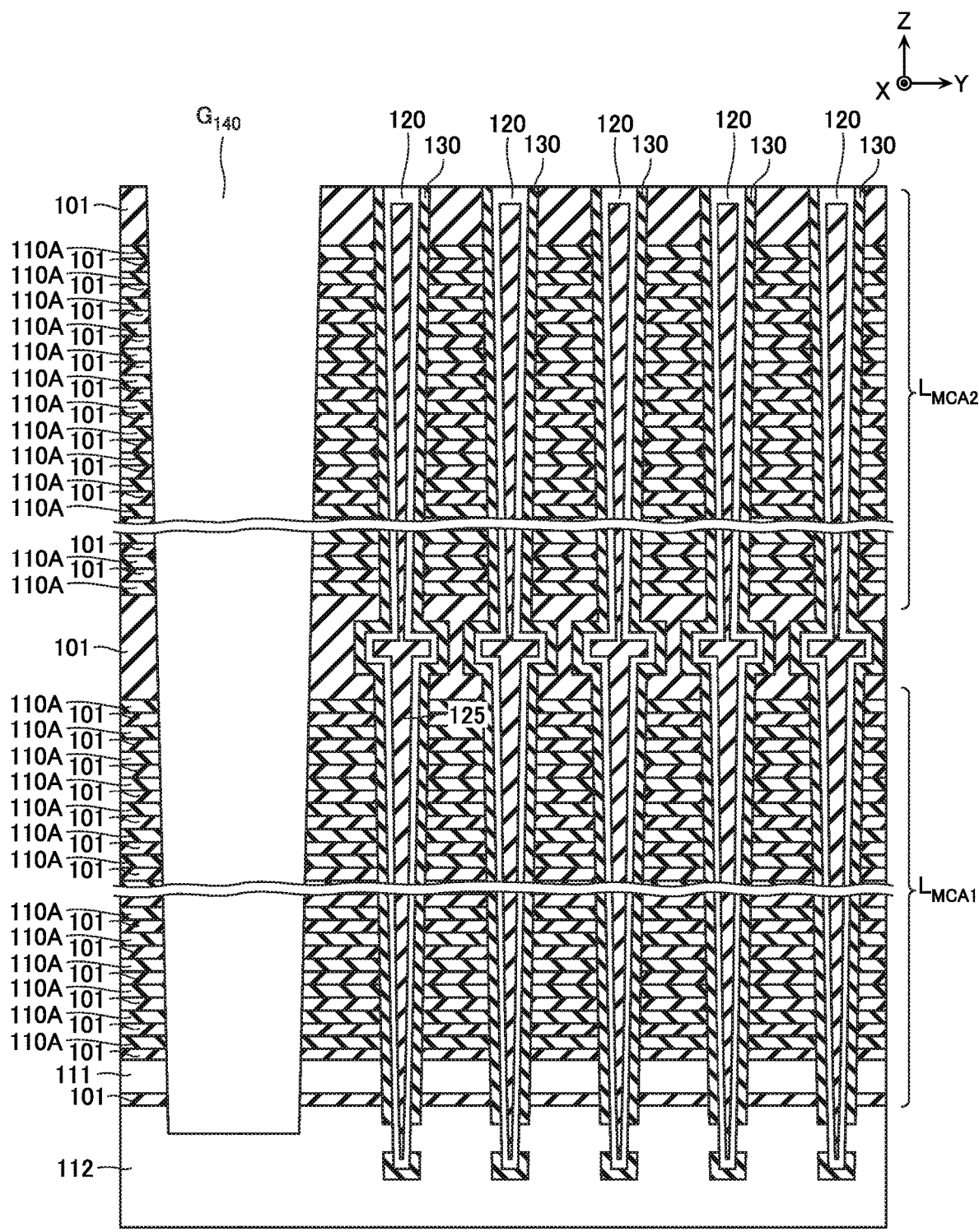
FIG. 21 is a schematic Y-Z cross-sectional view illustrating the manufacturing method of the semiconductor memory device according to the first embodiment.

Next, for example, as illustrated in FIG. 21, the protective film $P_{140}$ is removed. This process is performed by, for example, a method such as wet etching.

Figure 22:
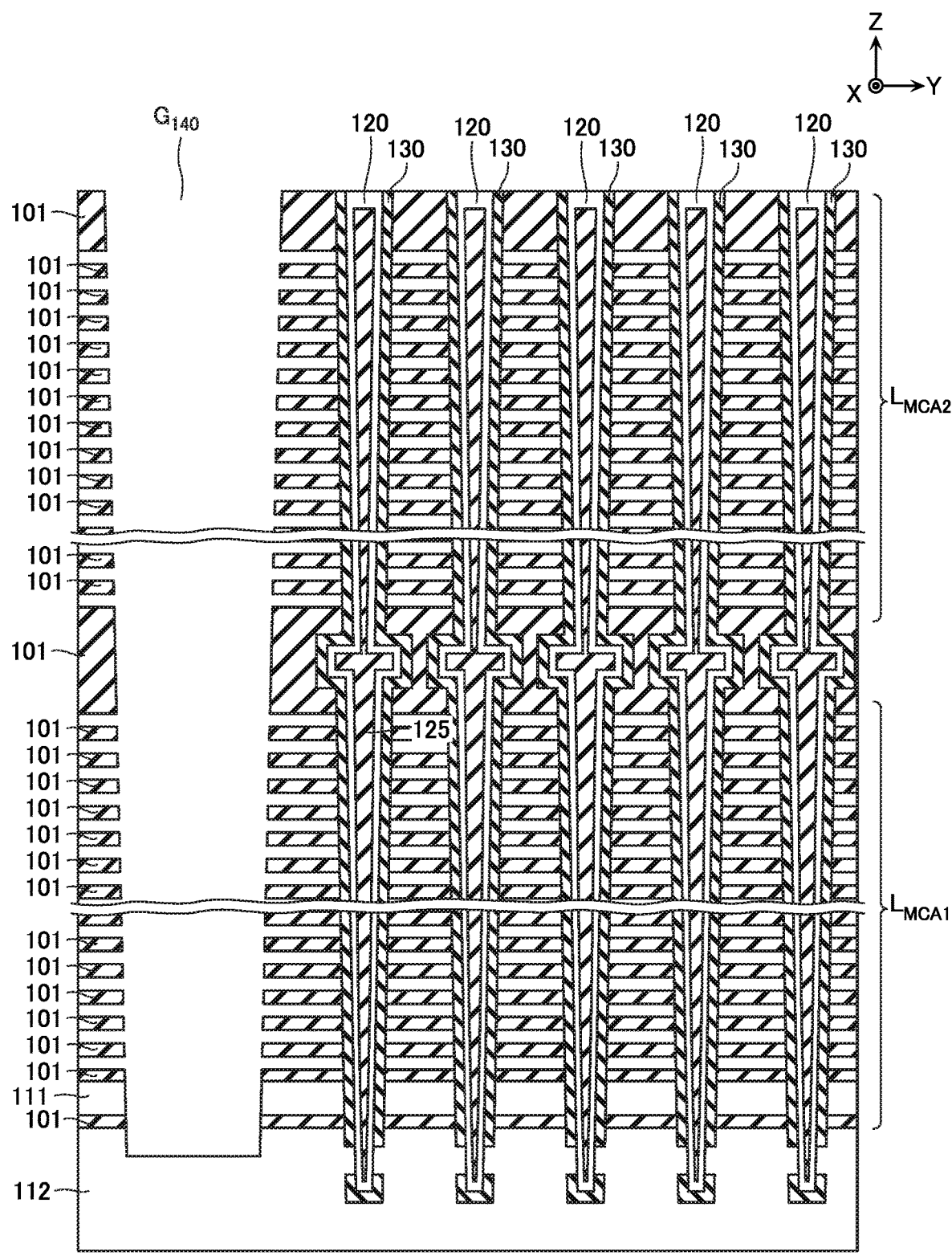
FIG. 22 is a schematic Y-Z cross-sectional view illustrating the manufacturing method of the semiconductor memory device according to the first embodiment.
Figure 23:
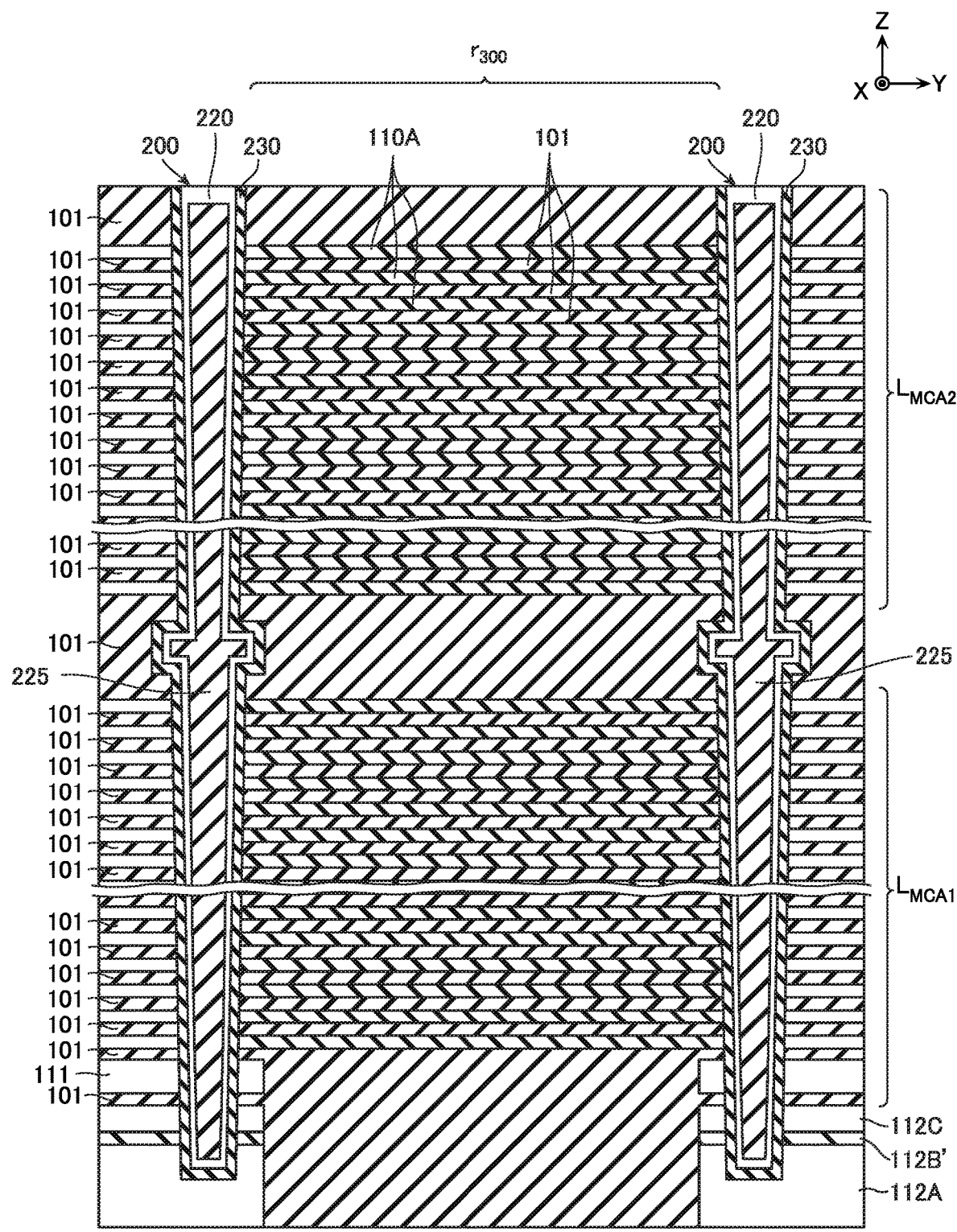
FIG. 23 is a schematic Y-Z cross-sectional view illustrating the manufacturing method of the semiconductor memory device according to the first embodiment.

Next, for example, as illustrated in FIG. 22, the insulating layers 110A are removed via the trench $G_{140}$. This process is performed by, for example, a method such as wet etching. By the insulating layers 110A being removed in this way, the mutual space between the plurality of insulating layers 101 arranged in the Z-direction becomes hollow. The plurality of insulating layers 101, which becomes a hollow structure in this way, are supported by the structures including the semiconductor layers 120, the gate insulating films 130, and the insulating layers 125 shown in FIG. 22, the structure bodies 200 (the semiconductor layers 220, the gate insulating films 230, and the insulating layers 225) shown in FIG. 5, and the support members 400 shown in FIG. 7.

Further, as illustrated in FIG. 23, in this process, in the contact connection sub-region $r_{300}$, that is, the region between the pair of structure bodies 200, 200 that extend in the X-direction and are separated in the Y-direction, the insulating layers 110A remain.

Figure 24:
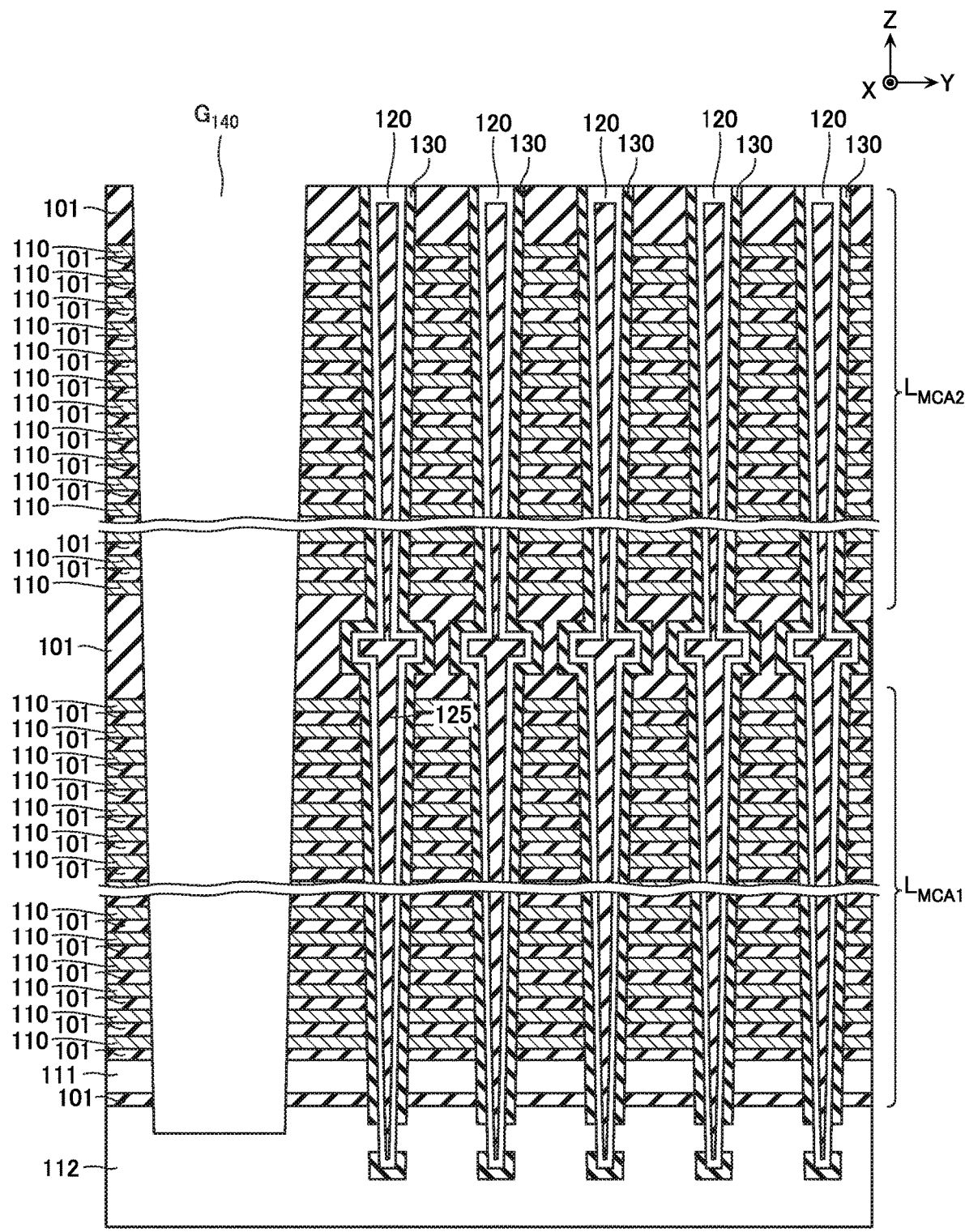
FIG. 24 is a schematic Y-Z cross-sectional view illustrating the manufacturing method of the semiconductor memory device according to the first embodiment.

Next, for example, as illustrated in FIG. 24, the conductive layers 110 are formed. This process is performed by, for example, a method such as CVD.

Next, the inter-block structure 140 (FIG. 7) is formed inside the trench $G_{140}$. This process is performed by, for example, a method such as CVD, RIE, and the like.

Subsequently, the through contacts 300 described with reference to, for example, FIG. 5 are formed. The process to form the through contacts 300 is performed by, for example, a method such as CVD, RIE, and the like. Furthermore, the inter-string unit insulating layers 126 (FIG. 3), the contacts C1 and C2 (FIG. 5), the wiring layer at the upper layer side including the wiring m (FIG. 2, FIG. 5), and the like are formed. Thus, the semiconductor memory device is manufactured.

Comparative Example

Figure 25:
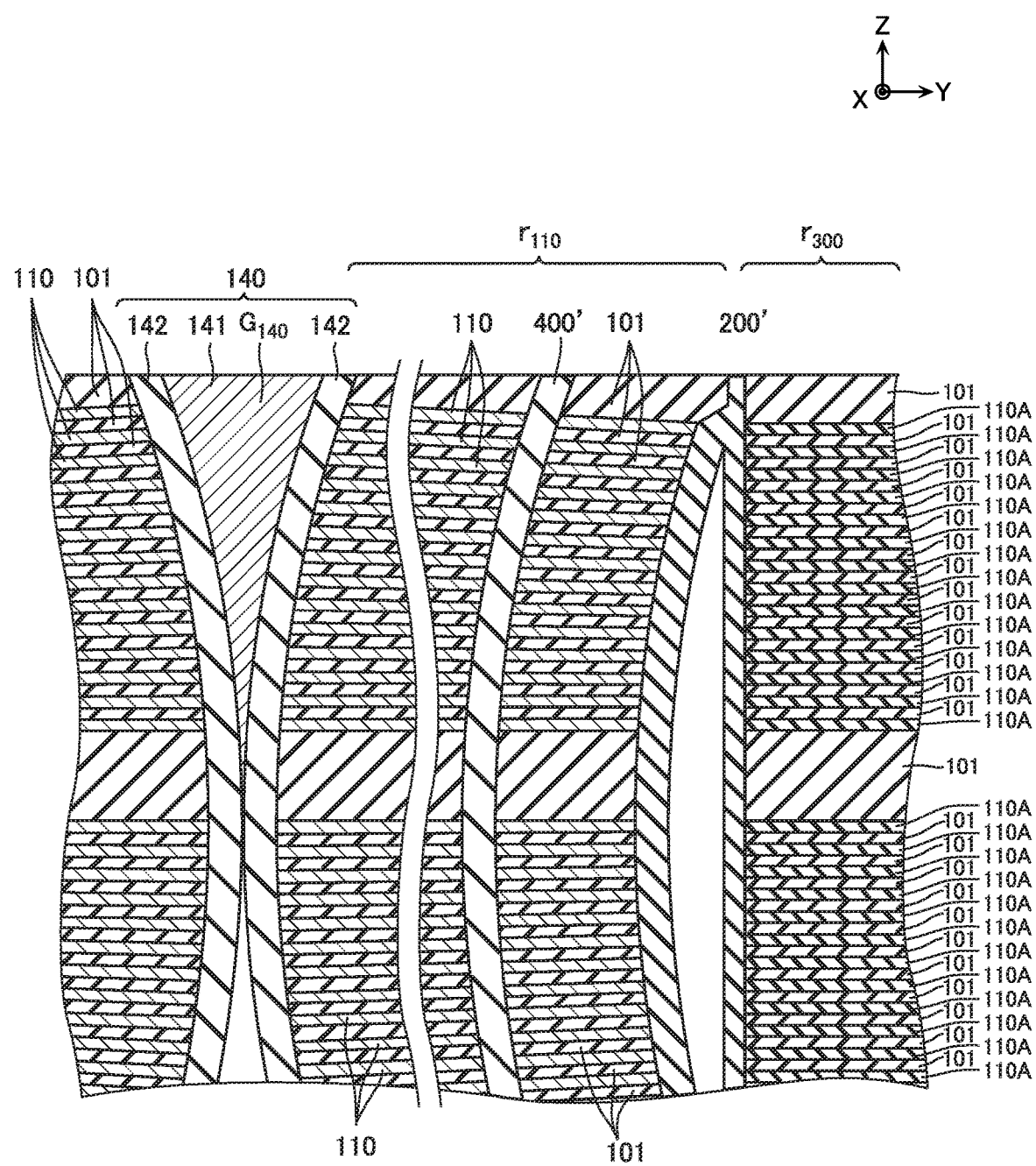
FIG. 25 is a Y-Z cross-sectional view of a portion including an insulating layer 200' and an inter-block structure 140 in a comparative example.

In the above-described semiconductor memory device according to the first embodiment, as illustrated in FIG. 5, while the structure body 200 is formed of the gate insulating film 230, the semiconductor layer 220, and the insulating layer 225, in the comparative example, as illustrated in FIG. 25, an insulating layer 200' corresponding to the structure body 200 includes an oxide, such as silicon oxide ($SiO_2$), which is filled inside a trench. When the oxide, such as silicon oxide ($SiO_2$), is filled inside the trench, a "warpage" occurs in the semiconductor memory device in some cases due to thermal shrinkage of the oxide, such as silicon oxide ($SiO_2$).

For example, in manufacturing the semiconductor memory device according to the comparative example, in the processes corresponding to FIG. 22 and FIG. 23, the insulating layers 110A are removed to form the hollow structures including the plurality of insulating layers 101. At this time, the insulating layer 200' is thermally shrunk in the Z-direction. Here, a shrinkage stress in the Z-direction of the insulating layer 200' is sometimes larger than the shrinkage stress in the Z-direction of a support member 400' (FIG. 25) disposed in the conductive layer connection sub-region $r_{110}$ (FIG. 2, FIG. 5, FIG. 25). In such a case, in manufacturing the semiconductor memory device according to the comparative example, in the processes corresponding to FIG. 22 and FIG. 23, a central portion in the Z-direction of the above-described hollow structure sometimes protrudes in a curved state from the contact connection sub-region $r_{300}$ (FIG. 2, FIG. 5, FIG. 25) side toward the trench $G_{140}$ side.

When the conductive layers 110 are formed in such a state in the process corresponding to FIG. 24, as illustrated in FIG. 25, there is a possibility that the width in the Y-direction at the central portion in the Z-direction of the trench $G_{140}$ becomes narrow, and thus the conductive layer 141 in the inter-block structure 140 cannot be connected to the semiconductor layer 112. Further, there is a possibility that the two conductive layers 110 adjacent in the Y-direction are electrically connected.

Furthermore, as described above, in the comparative example, since the insulating layer 200' corresponding to the structure body 200 includes the oxide, such as silicon oxide ($SiO_2$), which is filled inside the trench, it was required to form the insulating layer 200' by a process different from the process where the semiconductor layer 120 was formed, and thus the number of manufacturing processes was increased.

Effect of First Embodiment

As illustrated in FIG. 5, for example, the structure body 200 in the first embodiment includes the gate insulating film 230, the semiconductor layer 220 of polycrystalline silicon (Si) or the like, and the insulating layer 225 of silicon oxide ($SiO_2$) or the like. The shrinkage stress in the Z-direction of such a structure body 200 is smaller than the shrinkage stress in the Z-direction of the insulating layer 200' as described above. Consequently, in the semiconductor memory device according to the first embodiment, occurrence of "warpage" as described above can be reduced. As a result, the semiconductor memory device according to the first embodiment is preferably manufacturable.

Further, in the first embodiment, the structure body 200 that includes the gate insulating film 230, the semiconductor layer 220, and the insulating layer 225, for example, illustrated in FIG. 16, can be simultaneously formed with the gate insulating film 130, the semiconductor layer 120, and the insulating layer 125, for example, illustrated in FIG. 15, and thus the number of manufacturing processes can be reduced.

Furthermore, in the semiconductor memory device according to the first embodiment, after completion of a product, by applying a voltage to the semiconductor layer 220 of the structure body 200 via the wiring m and the contacts C1 and C2 shown in FIG. 5, an inspection whether or not a short circuit failure exists between the semiconductor layer 220 and the conductive layers 110 can be performed. When the short circuit failure is detected from the result of the inspection, the use of the memory block BLK including the portion where the short circuit failure has occurred is prohibited. The inspection can be performed in this way, and thus the high quality of the semiconductor memory device of the first embodiment can be maintained.

Second Embodiment

Next, the second embodiment is described. While the semiconductor memory device according to the second embodiment includes a structure body 200a (FIG. 26) and a support member 400a (FIG. 27) instead of the structure body 200 (FIG. 5) and the support member 400 (FIG. 7) according to the first embodiment, the structures of the other portions are similar to those of the first embodiment. Thus, in the following, while the structure body 200a (FIG. 26) and the support member 400a (FIG. 27) is described in detail, the description of the other portions is omitted or simplified.

[Structure]

Figure 26:
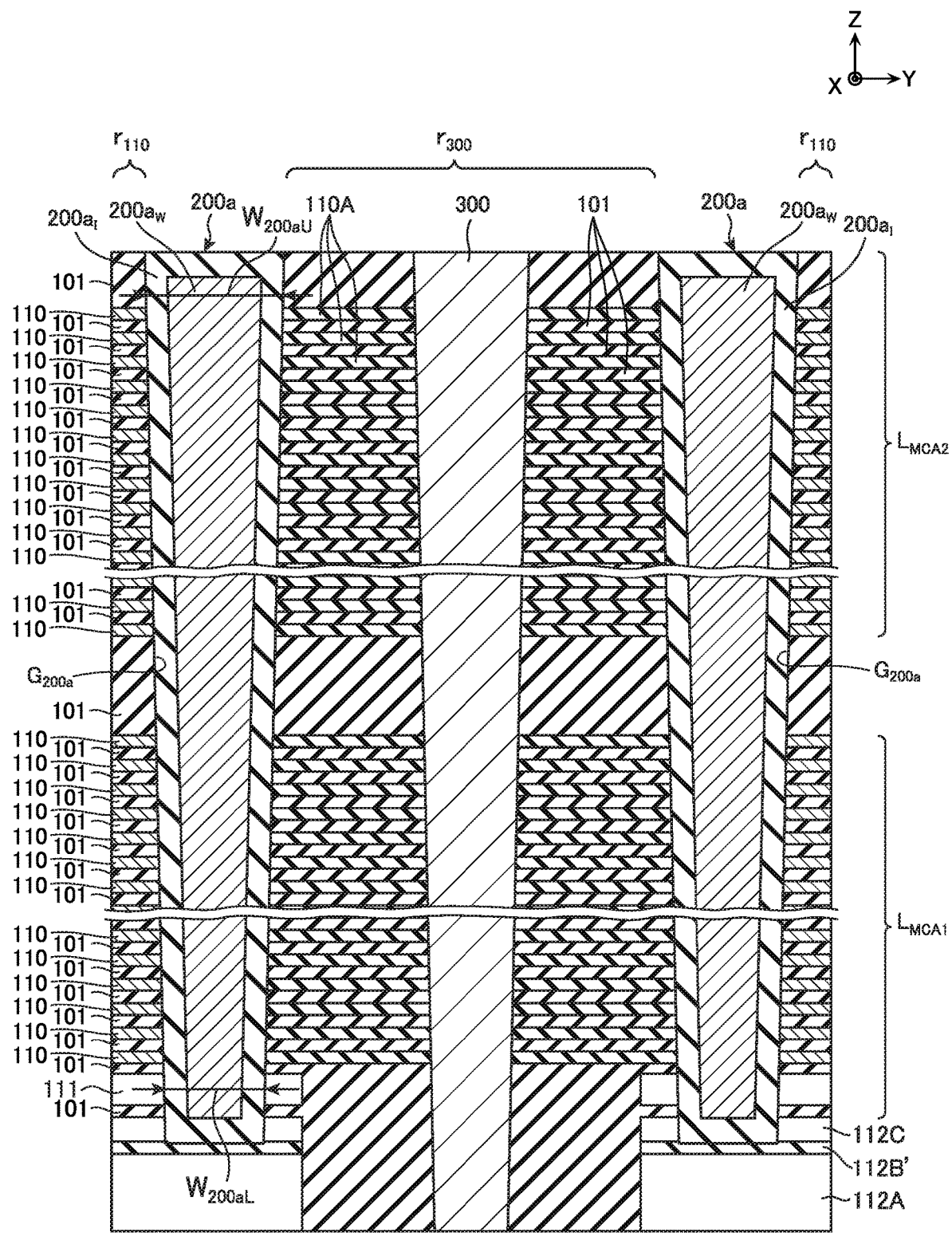
FIG. 26 is a cross-sectional view illustrating a structure body 200a of a second embodiment and a schematic cross-sectional view of a portion of the second embodiment corresponding to a portion illustrated in FIG. 5 of the first embodiment.
Figure 27:
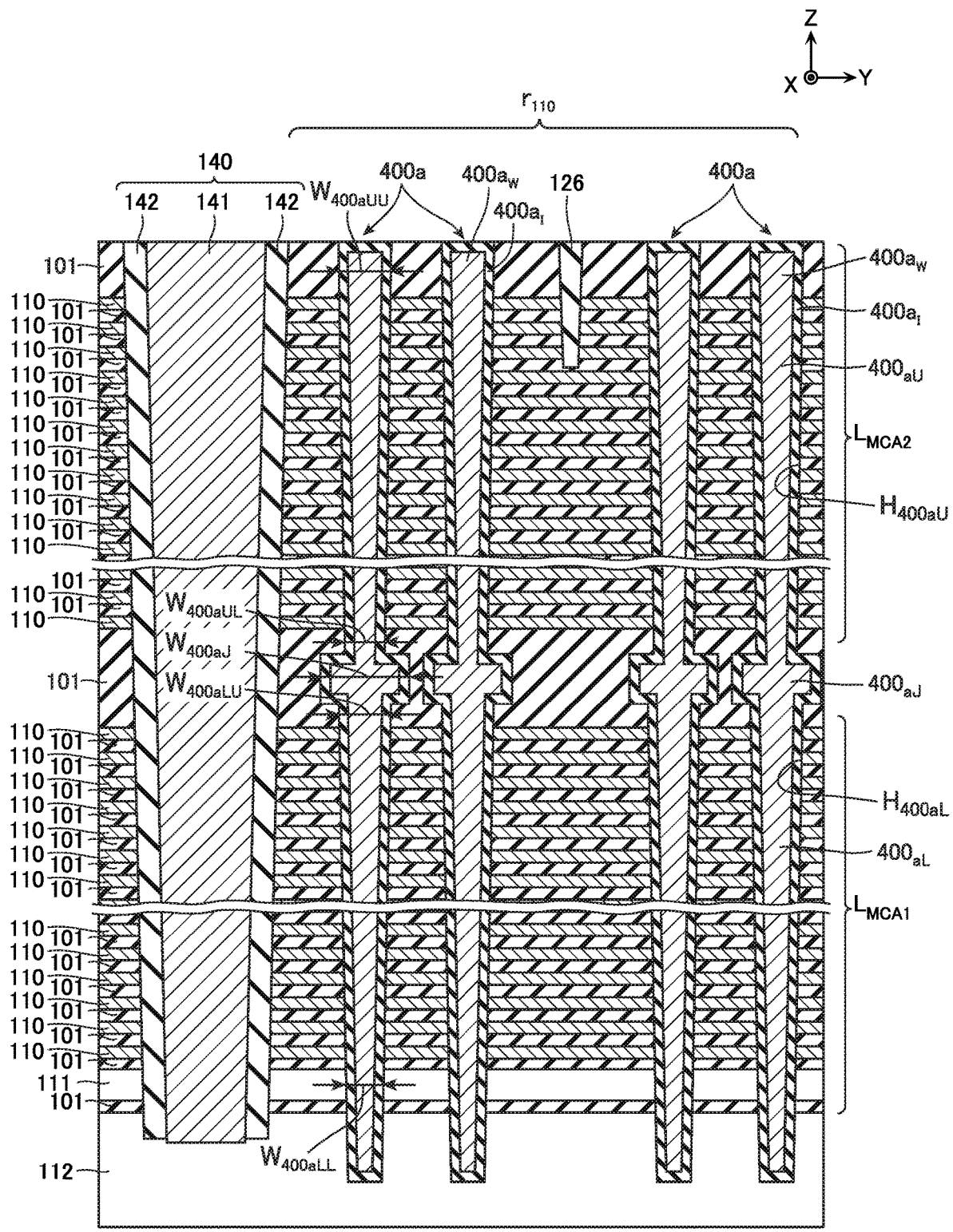
FIG. 27 is a cross-sectional view illustrating a support member 400a of the second embodiment and a schematic cross-sectional view of a portion of the second embodiment corresponding to a portion illustrated in FIG. 7 of the first embodiment.

FIG. 26 is a cross-sectional view illustrating the structure body 200a of the second embodiment and is a schematic cross-sectional view of the portion of the second embodiment corresponding to the portion illustrated in FIG. 5 of the first embodiment. FIG. 27 is a cross-sectional view illustrating the support member 400a of the second embodiment and is a schematic cross-sectional view of the portion of the second embodiment corresponding to the portion illustrated in FIG. 7 of the first embodiment.

[Structure of Structure Body 200a]

As illustrated in FIG. 26, between the conductive layer connection sub-region $r_{110}$ and the contact connection sub-region $r_{300}$, a trench $G_{200a}$ extending in the Z-direction and the X-direction is formed. Inside the trench $G_{200a}$, the structure body 200a extending in the Z-direction and the X-direction is formed. The structure body 200a includes an oxide film $200a_I$ of silicon oxide ($SiO_2$) or the like and a metal layer $200a_W$ of tungsten (W). The oxide film $200a_I$ is included on a side surface, a bottom surface, and a top surface of the trench $G_{200a}$ and extends in the Z-direction and the X-direction. The metal layer $200a_W$ is included inside the oxide film $200a_I$ and extends in the Z-direction and the X-direction. The metal layer $200a_W$ is grounded by a conductive wire or the like, which is not illustrated.

The oxide film $200a_I$ included on one side surface (the side surface in the conductive layer connection sub-region $r_{110}$ side) of the trench $G_{200a}$ is disposed between the plurality of insulating layers 101 and the plurality of conductive layers 110 of the conductive layer connection sub-region $r_{110}$ and the metal layer $200a_W$. The oxide film $200a_I$ included on another side surface (the side surface in the contact connection sub-region $r_{300}$ side) of the trench $G_{200a}$ is disposed between the plurality of insulating layers 101 and the plurality of insulating layers 110A of the contact connection sub-region $r_{300}$ and the metal layer $200a_W$.

When viewed in the Y-Z cross-sectional surface as illustrated in FIG. 26, the structure body 200a is constituted so as to have a width in the Y-direction gradually decreases as the structure body 200a extends downward in the Z-direction. Thus, a width $W_{200aU}$ in the Y-direction at an upper end portion of the structure body 200a is larger than a width $W_{200aL}$ at a lower end portion of the structure body 200a.

The above-described "upper end portion of the structure body 200a" is a portion positioned above and including a position opposed to the conductive layer 110 in the uppermost layer among the plurality of conductive layers 110 included in the memory cell array layer $L_{MCA2}$ in the structure body 200a. The "lower end portion of the structure body 200a" is a portion positioned below and including a position opposed to the conductive layer 110 in the lowermost layer among the plurality of conductive layers 110 included in the memory cell array layer $L_{MCA1}$ in the structure body 200a.

[Structure of Support Member 400a]

In the conductive layer connection sub-region $r_{110}$ (FIG. 27) made by the plurality of insulating layers 101 and the plurality of conductive layers 110 being stacked in alternation and the contact connection sub-region $r_{300}$ (FIG. 26) made by the plurality of insulating layers 101 and the plurality of insulating layers 110A being stacked in alternation, holes $H_{400aL}$ and $H_{400aU}$ extending in the Z-direction are formed as illustrated in FIG. 27. The holes $H_{400aL}$ and $H_{400aU}$ are communicated along the Z-direction, the hole $H_{400aL}$ is formed in the memory cell array layer $L_{MCA1}$, and the hole $H_{400aU}$ is formed in the memory cell array layer $L_{MCA2}$. Inside the holes $H_{400aL}$ and $H_{400aU}$, the support member 400a extending in the Z-direction is formed. The support member 400a includes an oxide film $400a_I$ of silicon oxide ($SiO_2$) or the like and a metal layer $400a_W$ of tungsten (W). The oxide film $400a_I$ is included on an inner peripheral surface, a bottom surface, and a top surface of the holes $H_{400aL}$ and $H_{400aU}$ and extends in the Z-direction. The metal layer $400a_W$ is included inside the oxide film $400a_I$ and extends in the Z-direction.

The support member 400a includes a support member region $400_{aL}$ included in the memory cell array layer $L_{MCA1}$ and a support member region $400_{aU}$ included in the memory cell array layer $L_{MCA2}$. The support member 400a includes a support member region $400_{aJ}$ disposed between the support member region $400_{aL}$ and the support member region $400_{aU}$. The support member region $400_{aJ}$ is disposed above the plurality of conductive layers 110 included in the memory cell array layer $L_{MCA1}$ and disposed below the plurality of conductive layers 110 included in the memory cell array layer $L_{MCA2}$.

Further, a Y-Z cross-sectional shape and a width in the radial direction of the support member 400a shown in FIG. 27 are approximately similar to a Y-Z cross-sectional shape and a width in the radial direction of the support member 400 shown in FIG. 7.

Further, a width $W_{400aLU}$ in the radial direction at an upper end portion of the support member region $400_{aL}$ and a width $W_{400aUU}$ in the radial direction at an upper end portion of the support member region $400_{aU}$ are approximately equal. A width $W_{400aLL}$ in the radial direction at a lower end portion of the support member region $400_{aL}$ and a width $W_{400aUL}$ in the radial direction at a lower end portion of the support member region $400_{aU}$ are approximately equal. A width $W_{400aJ}$ in the radial direction of the support member region $400_{aJ}$ is larger than the width $W_{400aLU}$ in the radial direction at the upper end portion of the support member region $400_{aL}$ and the width $W_{400aUU}$ in the radial direction at the upper end portion of the support member region $400_{aU}$.

The above-described "upper end portion of the support member region $400_{aL}$" is a portion positioned above and including a position opposed to the conductive layer 110 in the uppermost layer among the plurality of conductive layers 110 included in the memory cell array layer $L_{MCA1}$ in the support member region $400_{aL}$. The "upper end portion of the support member region $400_{aU}$" is a portion positioned above and including a position opposed to the conductive layer 110 in the uppermost layer among the plurality of conductive layers 110 included in the memory cell array layer $L_{MCA2}$ in the support member region $400_{aU}$. The "lower end portion of the support member region $400_{aL}$" is a portion positioned below and including a position opposed to the conductive layer 110 in the lowermost layer among the plurality of conductive layers 110 included in the memory cell array layer $L_{MCA1}$ in the support member region $400_{aL}$. The "lower end portion of the support member region $400_{aU}$" is a portion positioned below and including a position opposed to the conductive layer 110 in the lowermost layer among the plurality of conductive layers 110 included in the memory cell array layer $L_{MCA2}$ in the support member region $400_{aU}$.

[Manufacturing Method]

Figure 28:
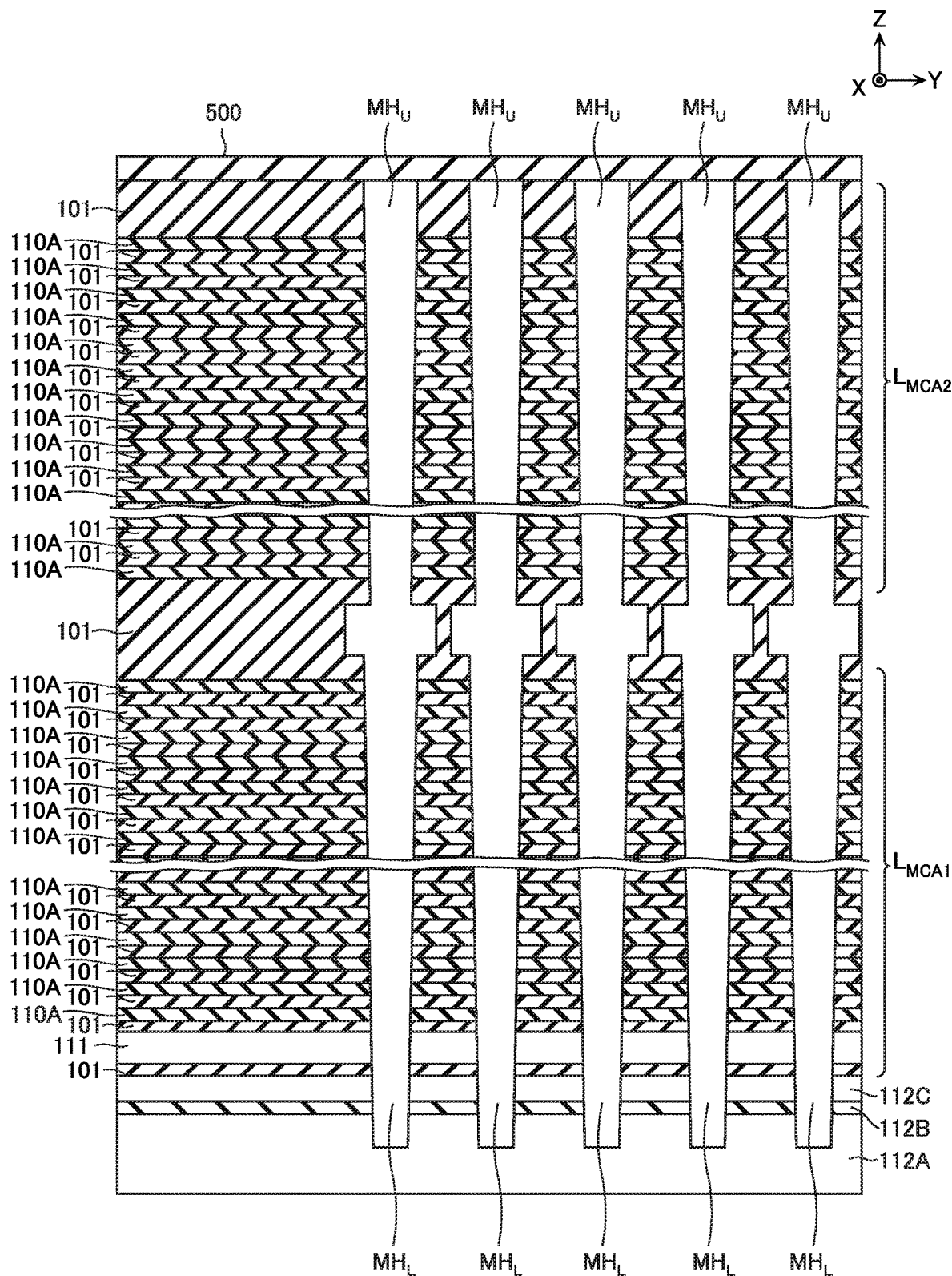
FIG. 28 is a schematic Y-Z cross-sectional view illustrating a manufacturing method of a semiconductor memory device according to the second embodiment.
Figure 34:
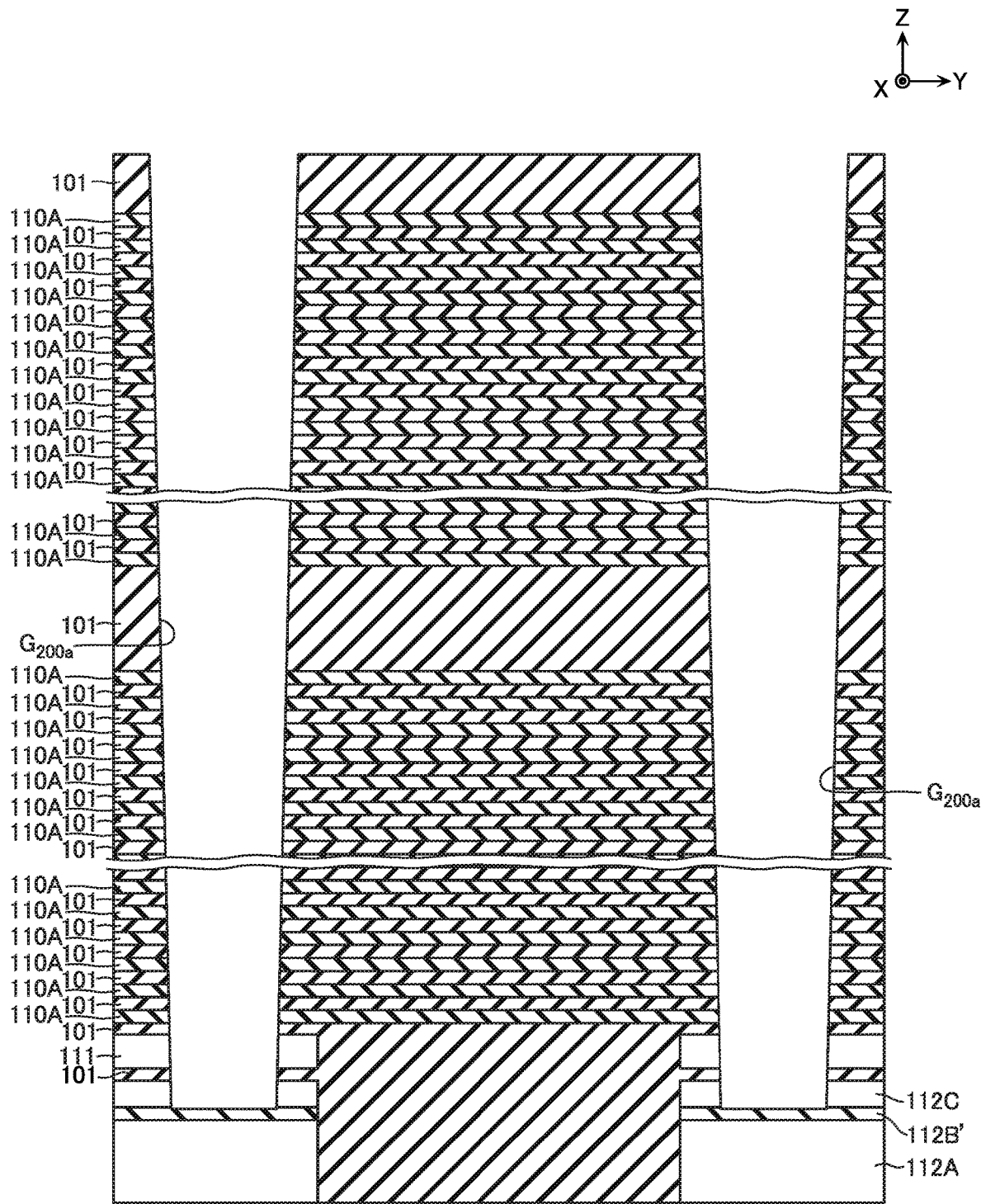
FIG. 34 is a schematic Y-Z cross-sectional view illustrating the manufacturing method of the semiconductor memory device according to the second embodiment.
Figure 35:
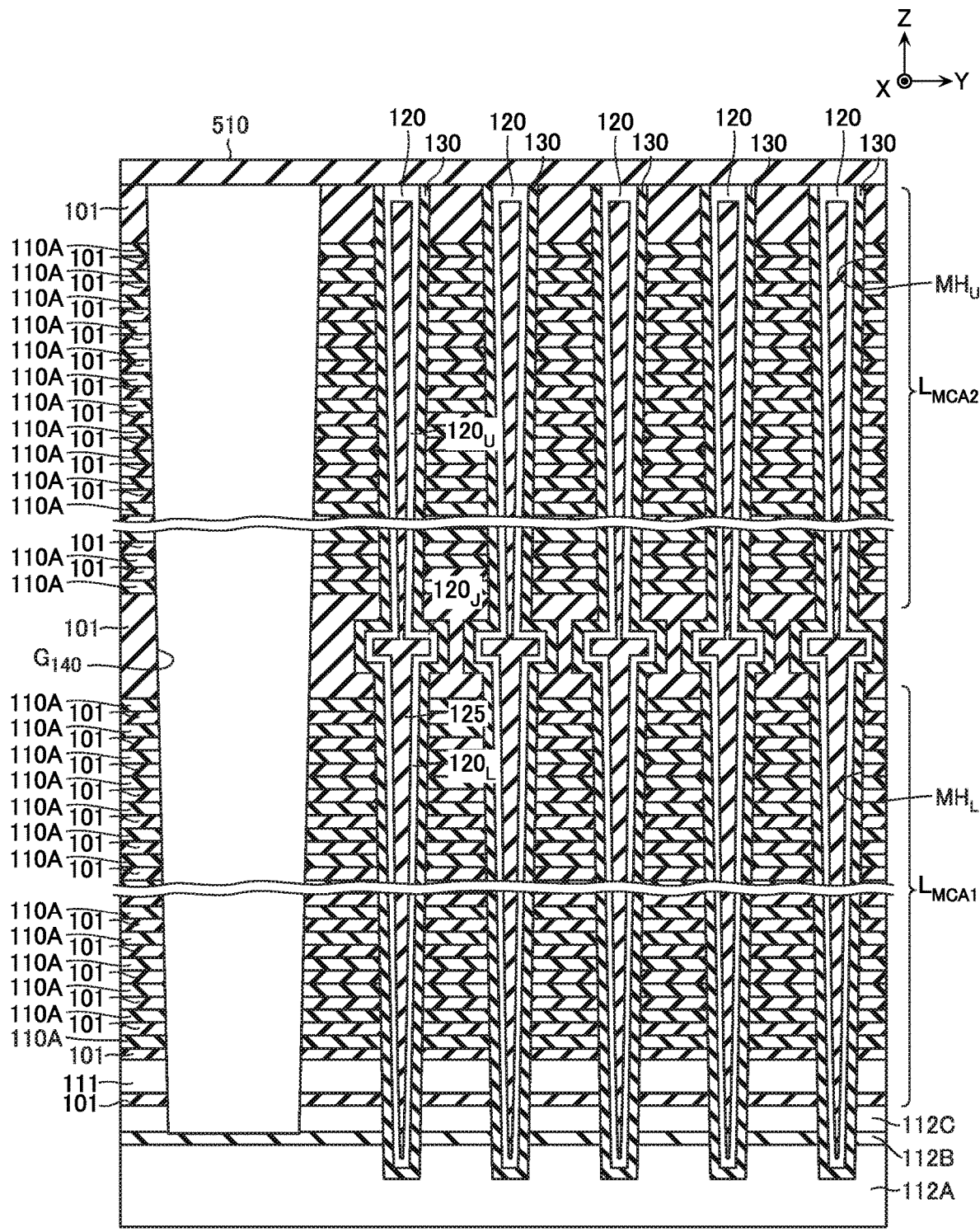
FIG. 35 is a schematic Y-Z cross-sectional view illustrating the manufacturing method of the semiconductor memory device according to the second embodiment.

Next, with reference to FIG. 28 to FIG. 40, the manufacturing method of the semiconductor memory device according to the second embodiment is described. FIG. 28 and FIG. 35 are schematic cross-sectional views for describing the manufacturing method and illustrate the cross-sectional surfaces of the portions of the second embodiment corresponding to the portions illustrated in FIG. 3 of the first embodiment. FIG. 29 to FIG. 33 are schematic cross-sectional views for describing the manufacturing method and illustrate the cross-sectional surfaces corresponding to FIG. 27. FIG. 34 and FIG. 36 to FIG. 40 are schematic cross-sectional views for describing the manufacturing method and illustrate the cross-sectional surfaces corresponding to FIG. 26.

In the processes of the manufacturing method of the semiconductor memory device according to the second embodiment, the description of the processes similar to those of the manufacturing method of the semiconductor memory device according to the first embodiment is omitted.

In the manufacturing method of the semiconductor memory device according to the second embodiment, among the processes included in the manufacturing method of the semiconductor memory device according to the first embodiment, the processes up to the processes described with reference to FIG. 14 are executed. However, in the hole $H_{400L}$ corresponding to the support member 400, the amorphous silicon film 120A is formed, not the insulating film of silicon oxide ($SiO_2$) or the like. Further, in forming the memory holes $MH_L$ and $MH_U$, the trenches $G_{200L}$ and $G_{200U}$ are not formed.

Next, as illustrated in FIG. 28, an insulating layer 500 of silicon oxide ($SiO_2$) or the like is formed on the top surface of the insulating layer 101 in the uppermost layer to cause the memory hole $MH_U$ to be closed. This process is performed by, for example, a method such as CVD.

Figure 29:
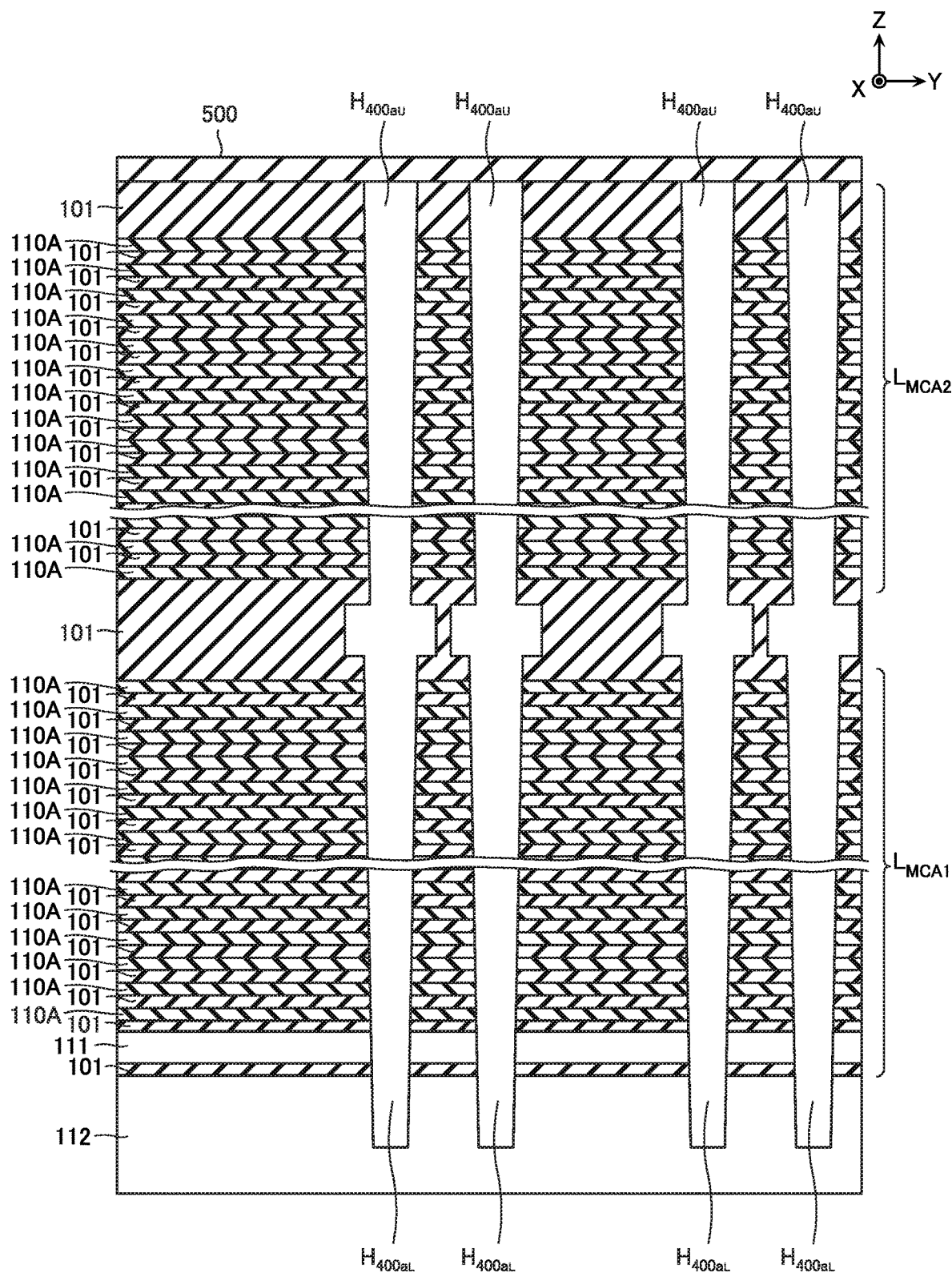
FIG. 29 is a schematic Y-Z cross-sectional view illustrating the manufacturing method of the semiconductor memory device according to the second embodiment.

Next, for example, as illustrated in FIG. 29, the hole $H_{400aU}$ is formed at the position corresponding to the support member 400, and the amorphous silicon film 120A inside the hole $H_{400aL}$ is removed. Then, the insulating layer 500 of silicon oxide ($SiO_2$) or the like is formed on the top surface of the insulating layer 101 in the uppermost layer to cause the memory hole $MH_U$ to be closed. This process is performed by, for example, a method such as CVD.

Figure 30:
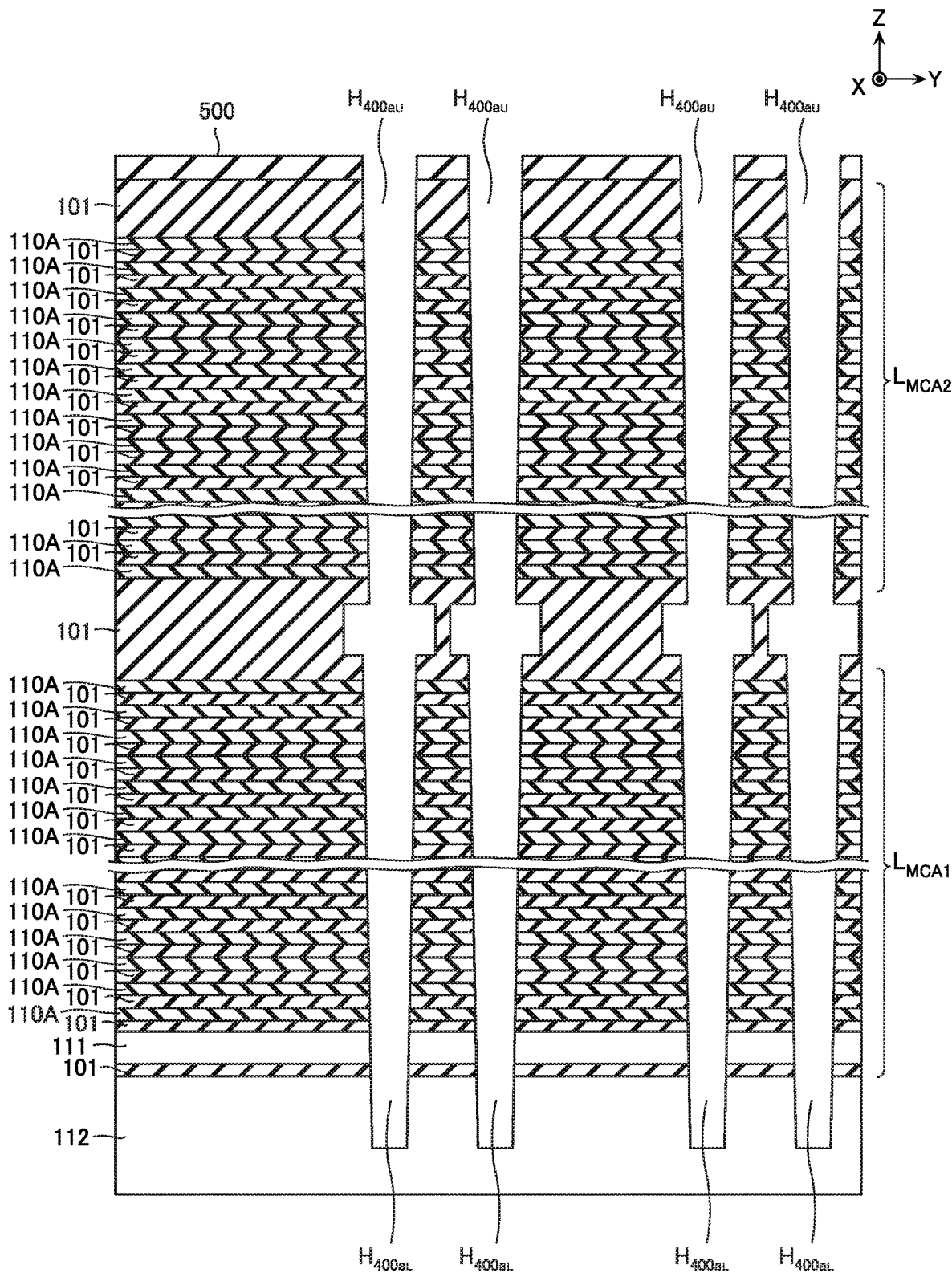
FIG. 30 is a schematic Y-Z cross-sectional view illustrating the manufacturing method of the semiconductor memory device according to the second embodiment.

Next, as illustrated in FIG. 30, of the insulating layer 500, the portions corresponding to the holes $H_{400aL}$ and $H_{400aU}$ are removed. This process is performed by, for example, a method such as wet etching.

Figure 31:
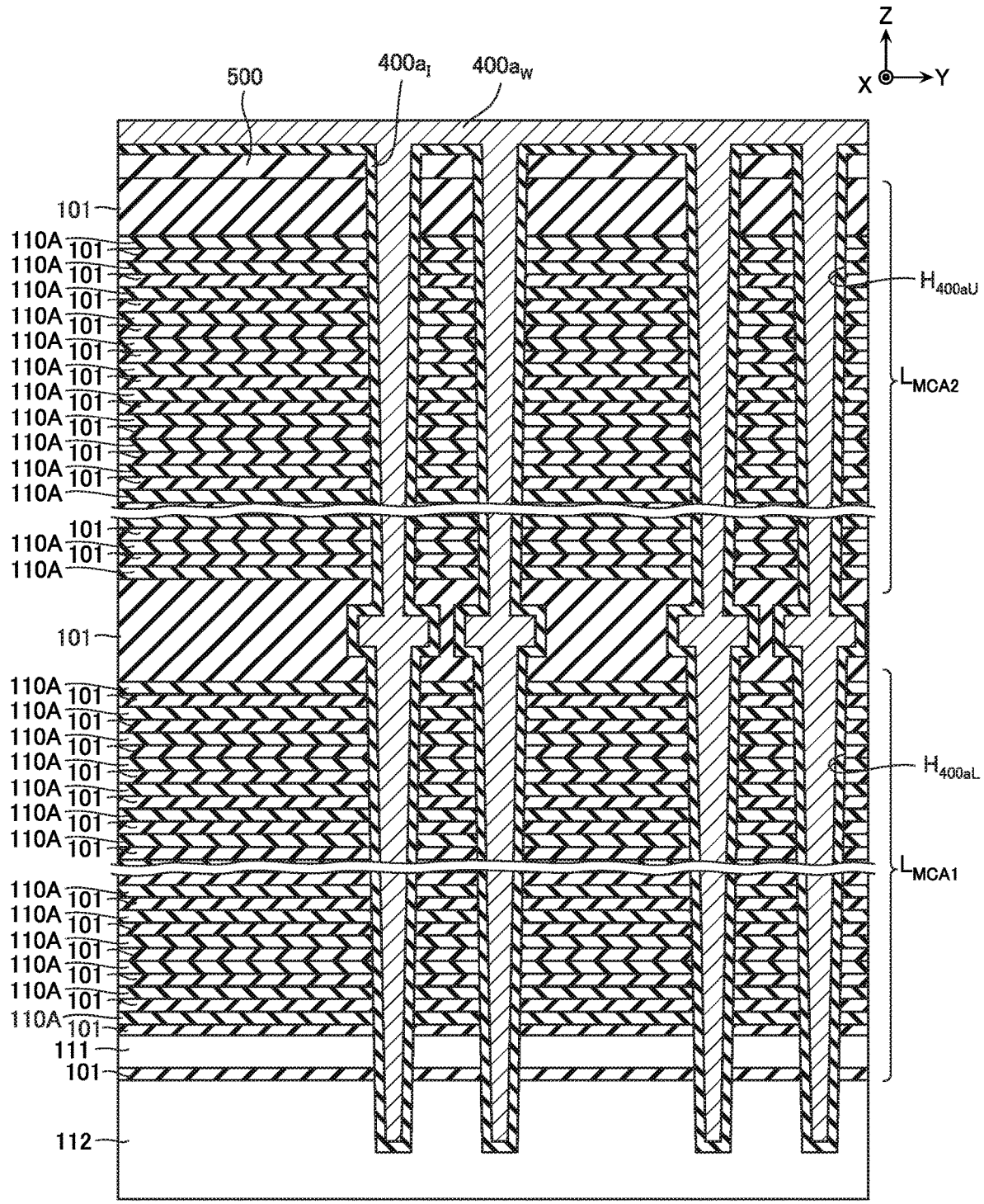
FIG. 31 is a schematic Y-Z cross-sectional view illustrating the manufacturing method of the semiconductor memory device according to the second embodiment.

Next, as illustrated in FIG. 31, on the inner peripheral surfaces of the holes $H_{400aL}$ and $H_{400aU}$ and the bottom surface of the hole $H_{400aL}$, and on the top surface of the insulating layer 500, the oxide film $400a_I$ of silicon oxide ($SiO_2$) or the like is formed. Further, on the inner peripheral surface and the top surface of the oxide film $400a_I$, the metal layer $400a_W$ of tungsten (W) is formed. This process is performed by, for example, a method such as CVD.

Figure 32:
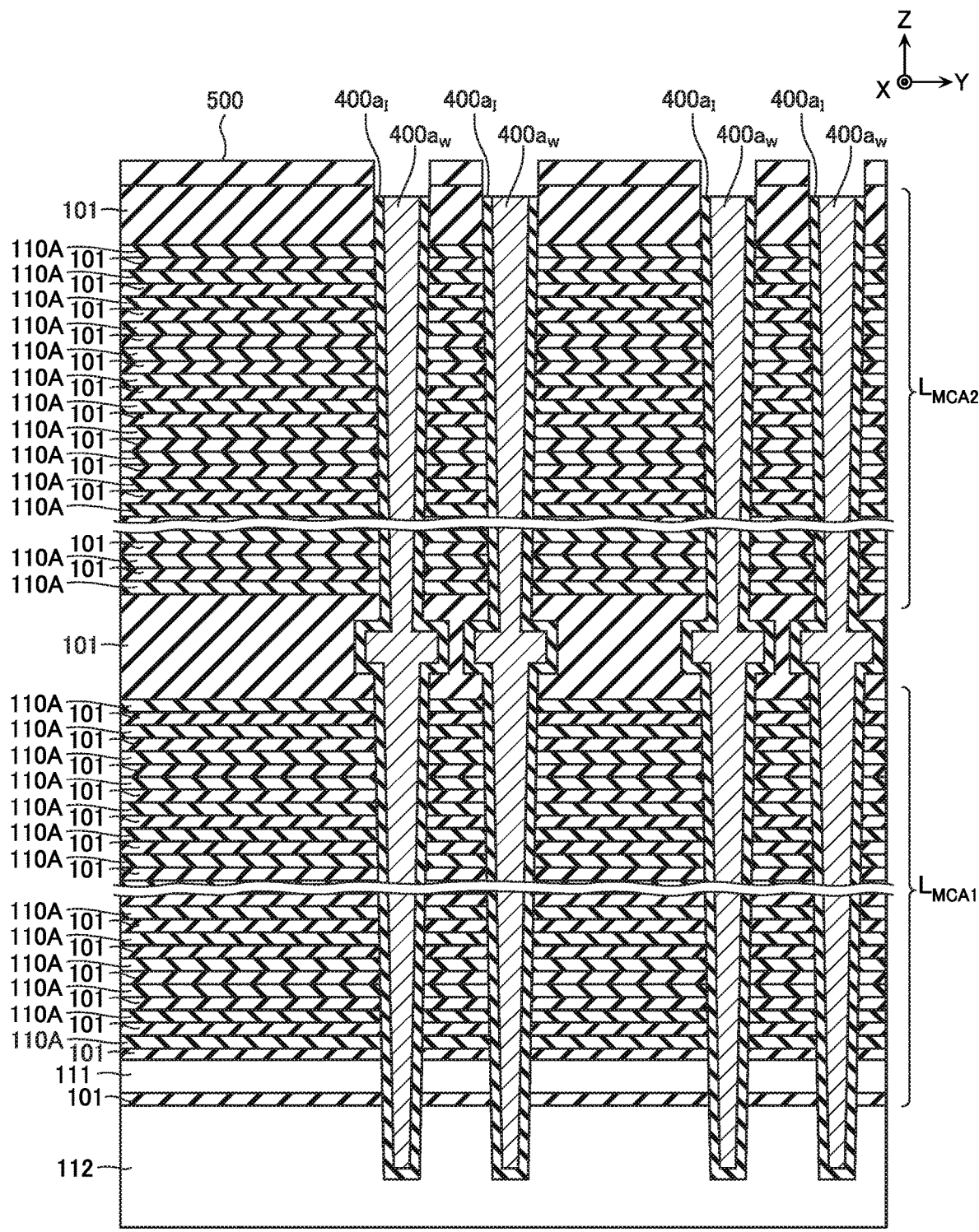
FIG. 32 is a schematic Y-Z cross-sectional view illustrating the manufacturing method of the semiconductor memory device according to the second embodiment.

Next, as illustrated in FIG. 32, the oxide film $400a_I$ and the metal layer $400a_W$ formed on the top surface of the insulating layer 500 and in the upper-end opening portion of the hole $H_{400aU}$ are removed. With this, the top surface of the metal layer $400a_W$ is exposed. This process is performed by, for example, a method such as RIE.

Figure 33:
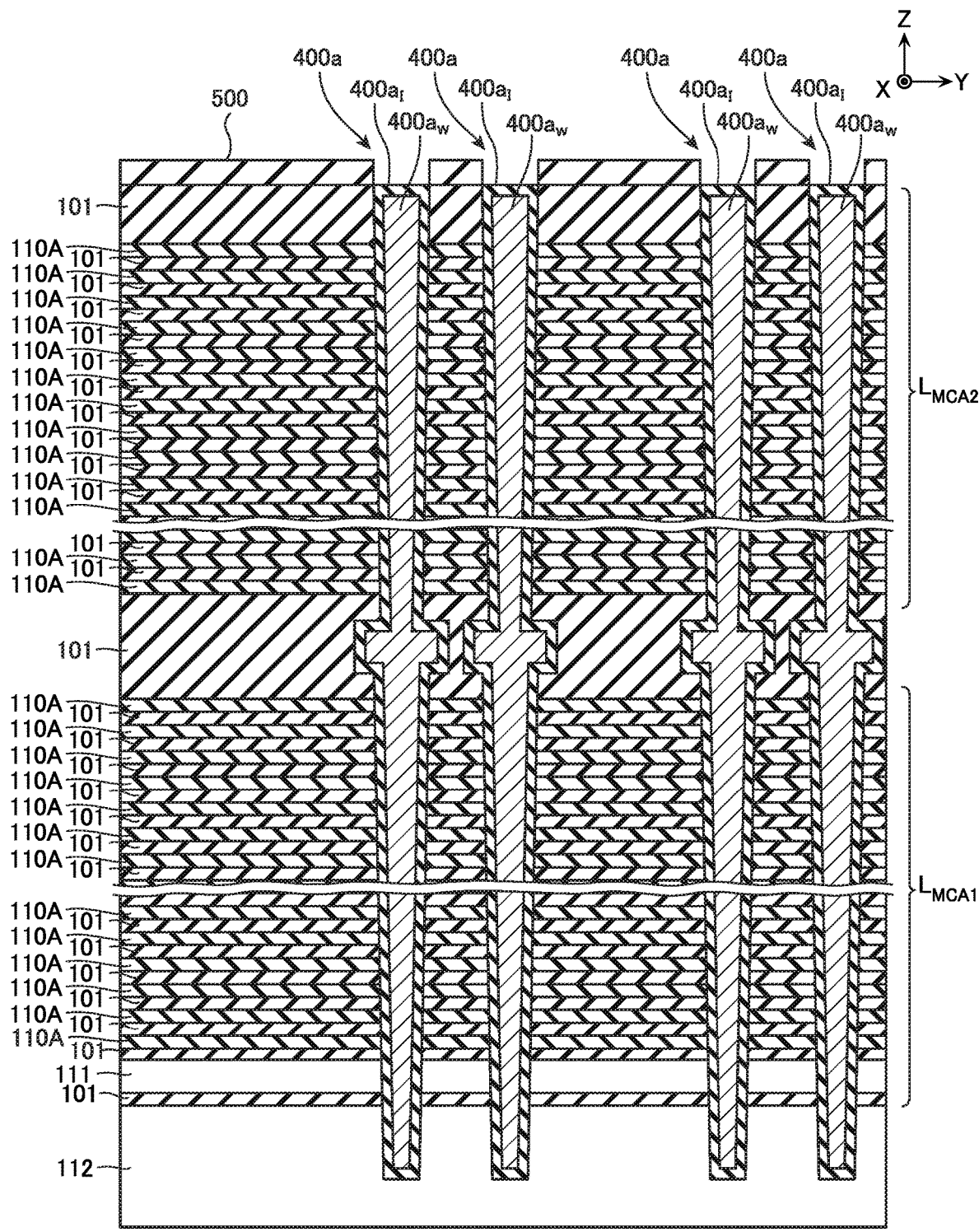
FIG. 33 is a schematic Y-Z cross-sectional view illustrating the manufacturing method of the semiconductor memory device according to the second embodiment.

Next, as illustrated in FIG. 33, on the top surface of the metal layer $400a_W$, the oxide film $400a_I$ is formed. In this way, the support member 400a is formed.

Next, the insulating layer 500 illustrated in FIG. 28, FIG. 33, and the like is removed by a method such as RIE.

Next, among the processes included in the manufacturing method of the semiconductor memory device according to the first embodiment, the process described with reference to FIG. 15 is executed.

Next, among the processes included in the manufacturing method of the semiconductor memory device according to the first embodiment, the process described with reference to FIG. 17 is executed. At this time, as illustrated in FIG. 34, at the position corresponding to the structure body 200a, the trench $G_{200a}$ that extends in the Z-direction and the X-direction and passes through the insulating layers 101 and the insulating layers 110A is formed.

Figure 36:
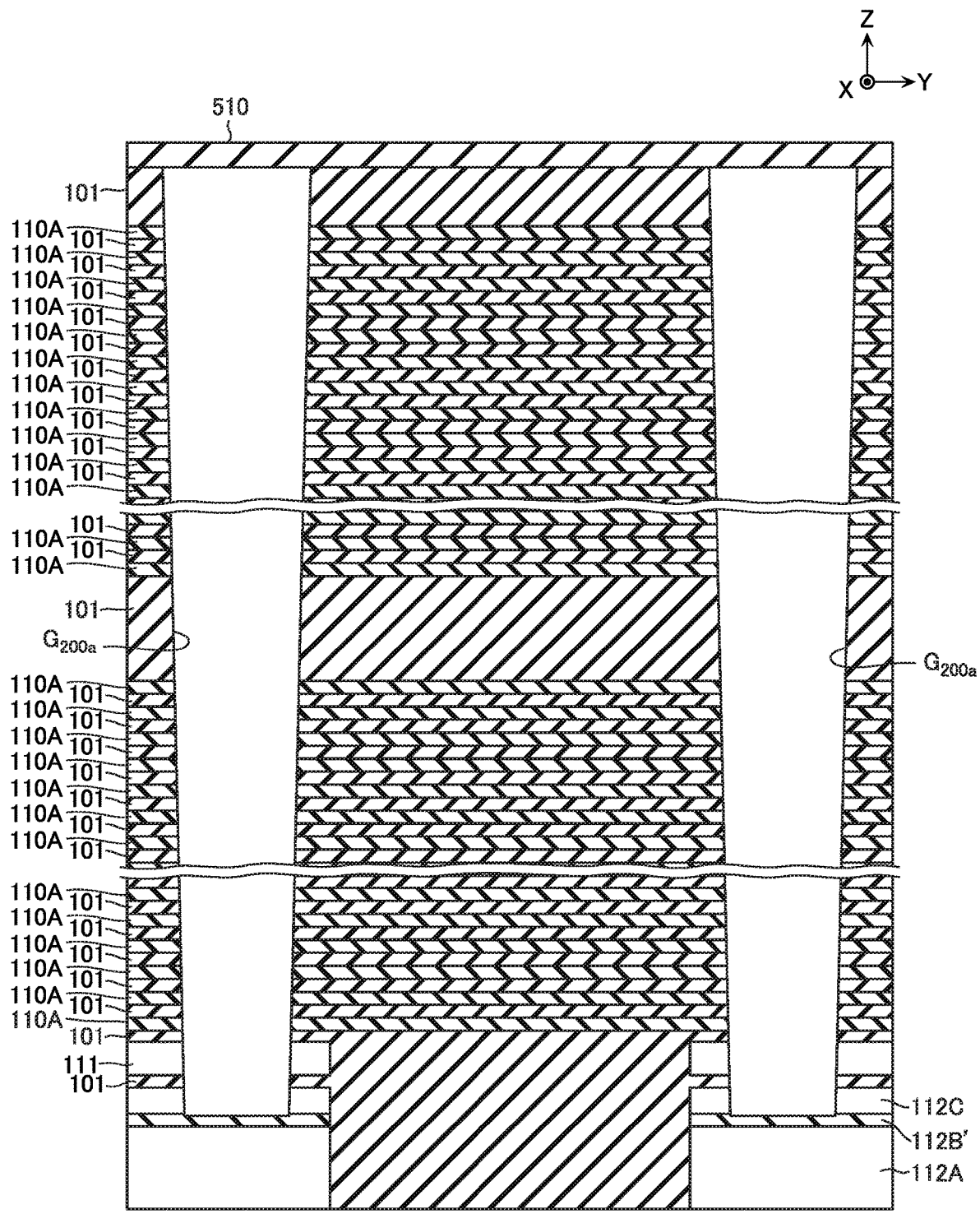
FIG. 36 is a schematic Y-Z cross-sectional view illustrating the manufacturing method of the semiconductor memory device according to the second embodiment.

Next, as illustrated in FIG. 35 and FIG. 36, an insulating layer 510 of silicon oxide ($SiO_2$) or the like is formed on the top surface of the insulating layer 101 in the uppermost layer to cause the trench $G_{200a}$ and the trench $G_{140}$ to be closed. This process is performed by, for example, a method such as CVD.

Figure 37:
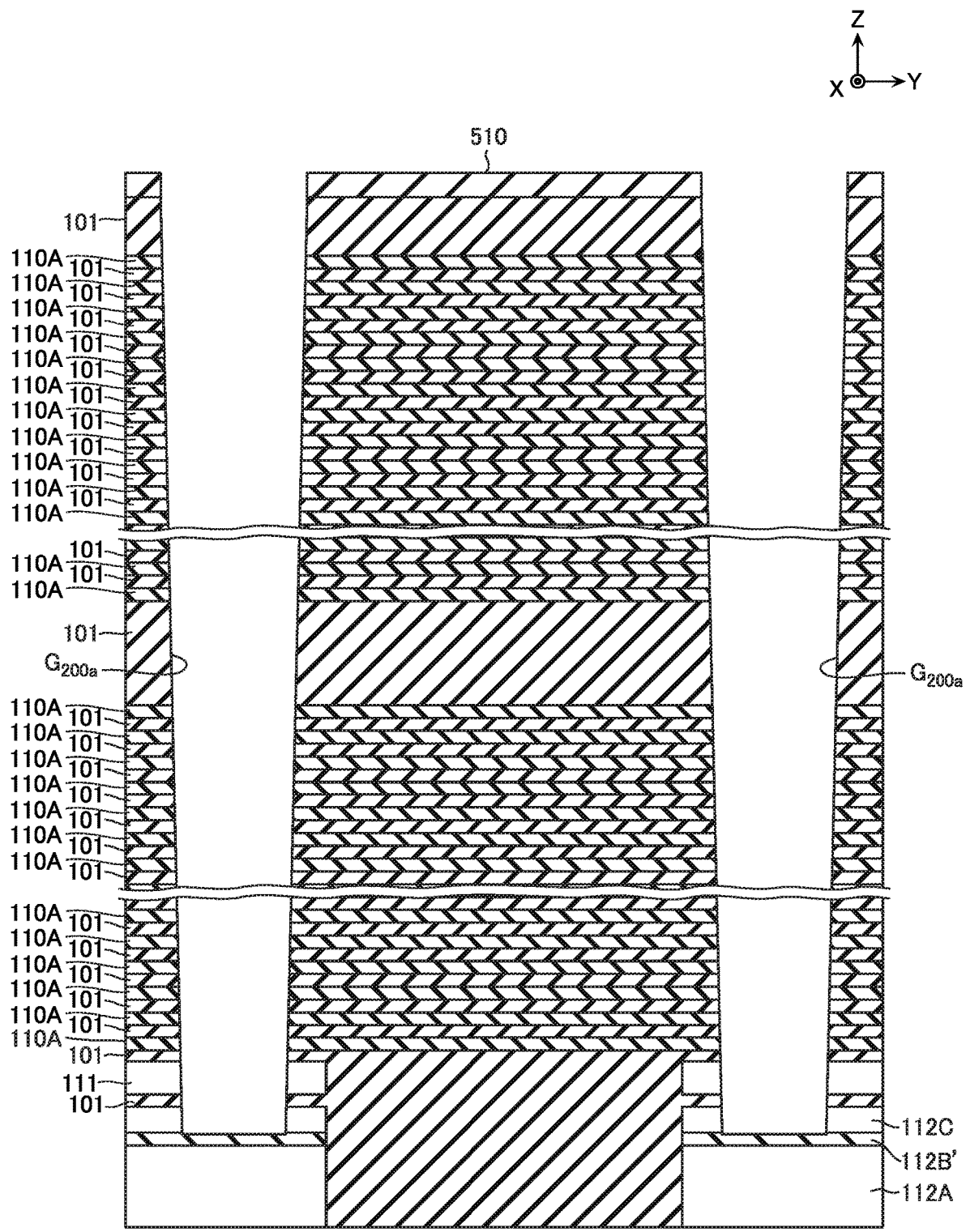
FIG. 37 is a schematic Y-Z cross-sectional view illustrating the manufacturing method of the semiconductor memory device according to the second embodiment.

Next, as illustrated in FIG. 37, in the insulating layer 510, the portions corresponding to the trench $G_{200a}$ are removed. This process is performed by, for example, a method such as RIE.

Figure 38:
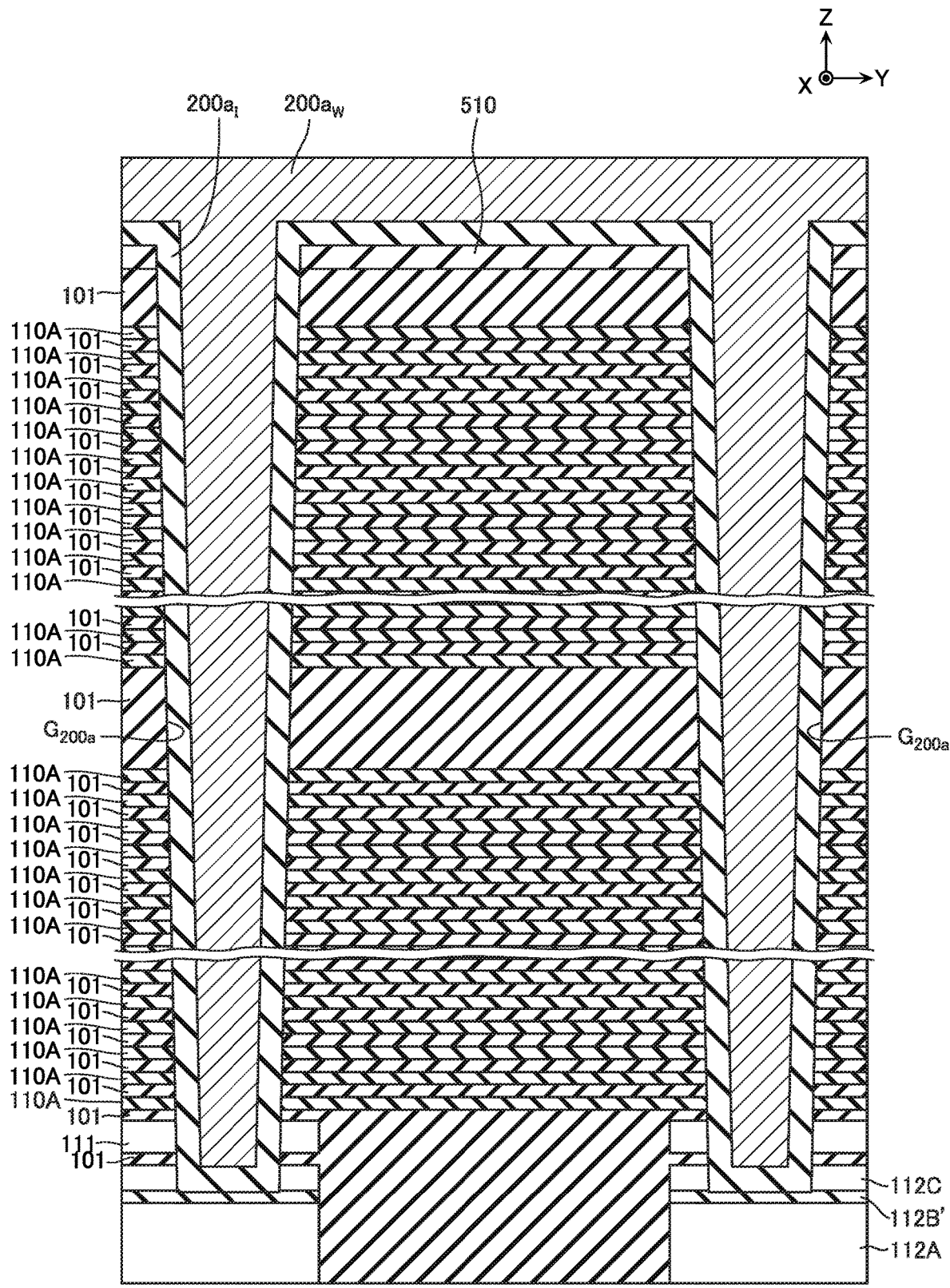
FIG. 38 is a schematic Y-Z cross-sectional view illustrating the manufacturing method of the semiconductor memory device according to the second embodiment.

Next, as illustrated in FIG. 38, on the side surface and the bottom surface of the trench $G_{200a}$ and on the top surface of the insulating layer 510, the oxide film $200a_I$ of silicon oxide ($SiO_2$) or the like is formed. Further, on the side surface and the top surface of the oxide film $200a_I$, the metal layer $200a_W$ of tungsten (W) is formed. This process is performed by, for example, a method such as CVD.

Figure 39:
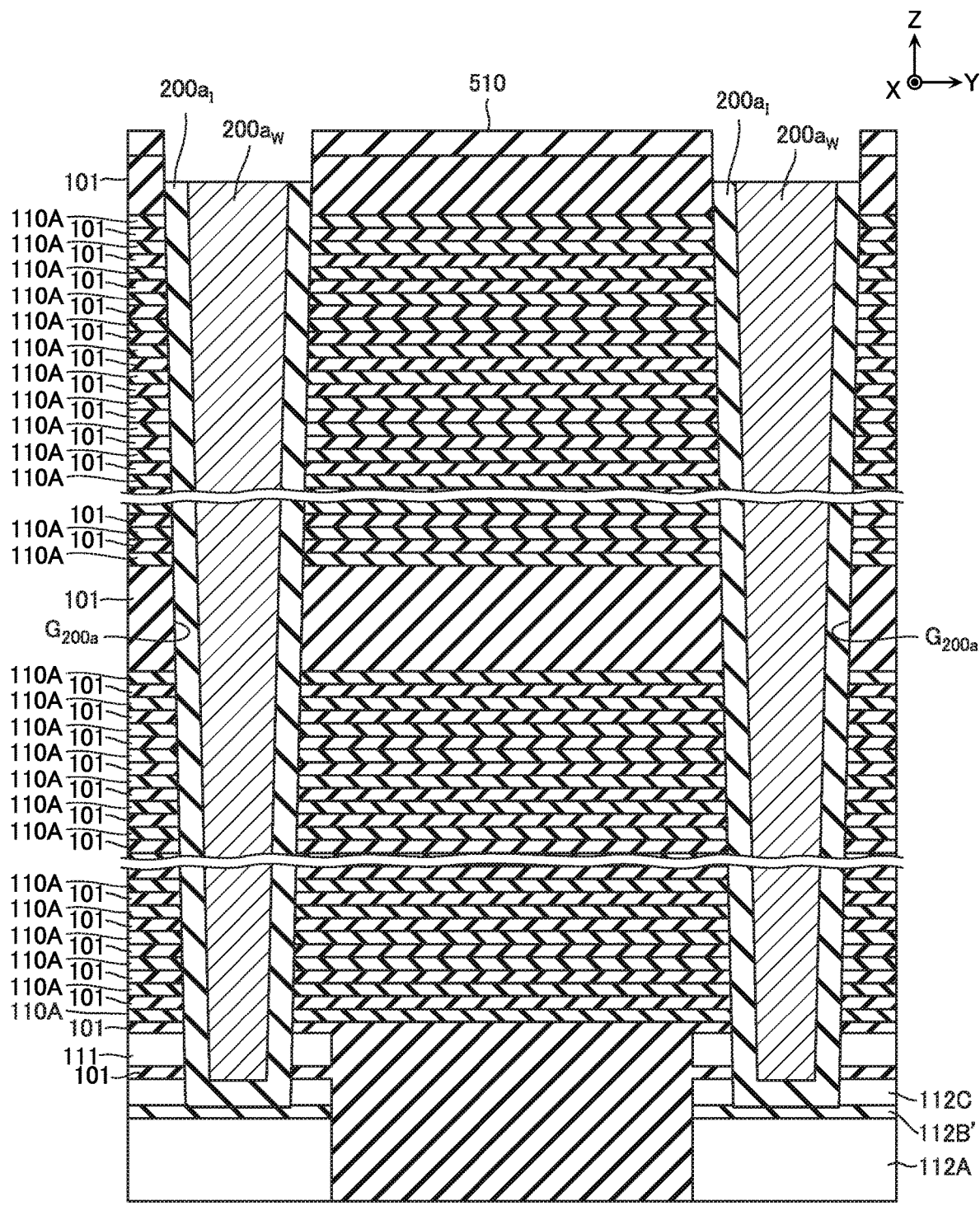
FIG. 39 is a schematic Y-Z cross-sectional view illustrating the manufacturing method of the semiconductor memory device according to the second embodiment.

Next, as illustrated in FIG. 39, the oxide film $200a_I$ and the metal layer $200a_W$, which are formed on the top surface of the insulating layer 510 and in the upper-end opening portion of the trench $G_{200a}$, are removed. With this, the top surface of the metal layer $200a_W$ is exposed. This process is performed by, for example, a method such as RIE.

Figure 40:
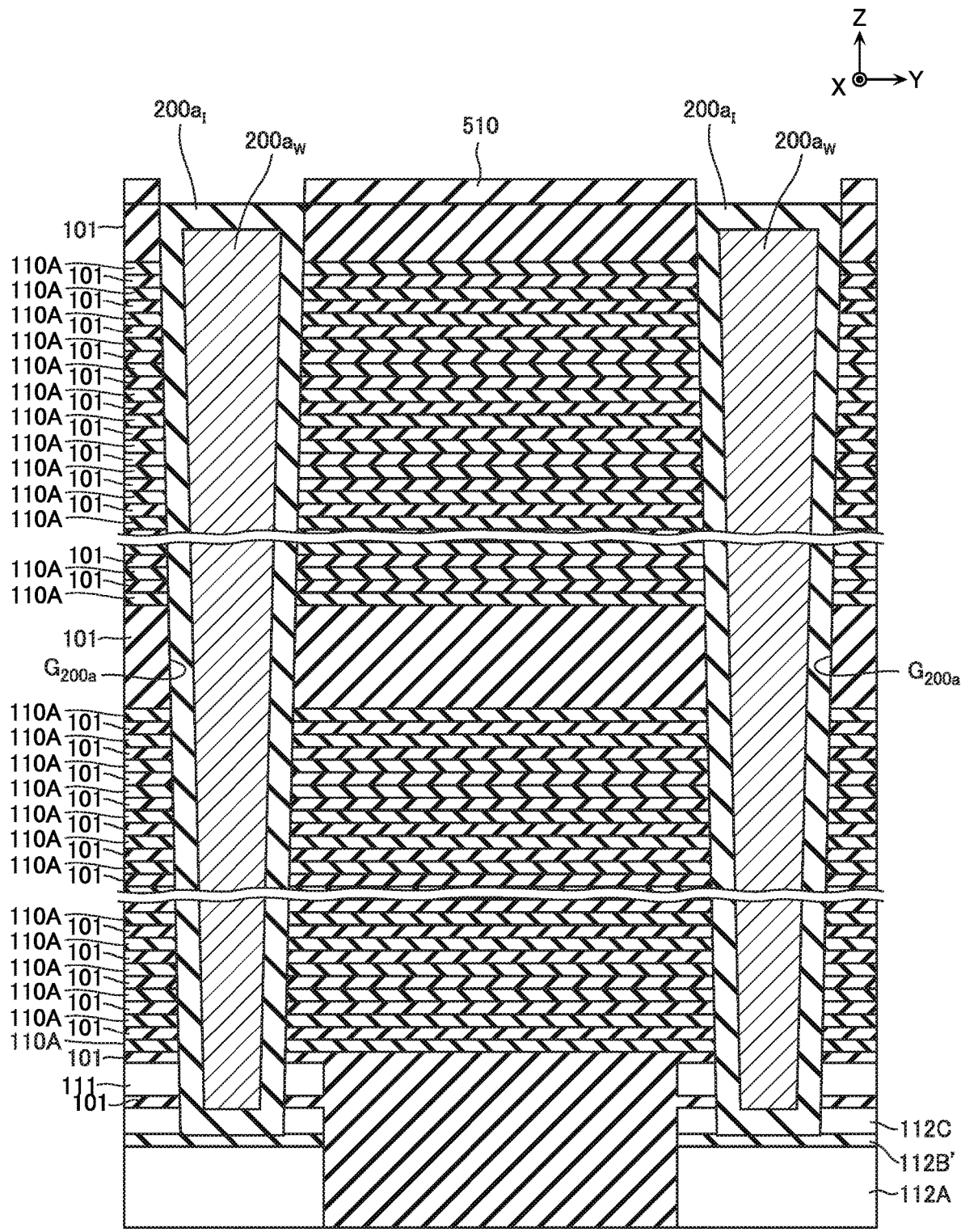
FIG. 40 is a schematic Y-Z cross-sectional view illustrating the manufacturing method of the semiconductor memory device according to the second embodiment.

Next, as illustrated in FIG. 40, on the top surface of the metal layer $200a_W$, the oxide film $200a_I$ is formed. In this way, the structure body 200a is formed.

Next, the insulating layer 510 is removed. This process is performed by wet etching or the like.

Subsequently, by executing the processes described with reference to FIG. 18 to FIG. 24 among the processes included in the manufacturing method of the semiconductor memory device according to the first embodiment, the semiconductor memory device according to the second embodiment is manufactured.

Effect of Second Embodiment

In the second embodiment, as described above, the structure body 200a has the metal layer $200a_W$ of tungsten (W), and the support member 400a includes the metal layer $400a_W$ of tungsten (W). Tungsten (W) contained in the metal layer $200a_W$ and the metal layer $400a_W$ has features of high Young's modulus and high rigidity and also has the features of a high melting point and high heat resistance.

Thus, the structure body 200a and the support member 400a have the feature of high rigidity. Consequently, in the semiconductor memory device according to the second embodiment, occurrence of the above-described "warpage" can be reduced. As a result, the semiconductor memory device of the second embodiment is preferably manufacturable.

Furthermore, since the structure body 200a and the support member 400a have the feature of high heat resistance, the structure body 200a and the support member 400a can sufficiently withstand the heat, for example, as illustrated in FIG. 24, when the conductive layer 110 is formed by a method such as CVD. Thus, the semiconductor memory device of the second embodiment is preferably manufacturable.

[Modification]

Furthermore, for example, as described with reference to FIG. 2 or the like, in the first embodiment, the pair of structure bodies 200 arranged in the Y-direction are mutually separated when viewed in the XY plane. Similarly, in the second embodiment, the pair of structure bodies 200a arranged in the Y-direction are mutually separated when viewed in the XY plane. However, such an arrangement is merely an example, and a specific arrangement can be appropriately changed. For example, when viewed in the XY plane, the pair of structure bodies 200 arranged in the Y-direction may be mutually connected at one end and the other end. Similarly, the pair of structure bodies 200a arranged in the Y-direction may be mutually connected at one end and the other end. In such a case, it is possible to electromagnetically shield the through contacts 300 from, for example, the semiconductor layer 120 and improve its electrical characteristic.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising
a substrate that includes a first region and a second region arranged in a first direction, wherein
the first region includes:
a plurality of first word line layers stacked in a second direction intersecting with a surface of the substrate;
a first semiconductor layer that extends in the second direction, the first semiconductor layer having an outer peripheral surface opposed to the plurality of first word line layers; and
a first electric charge accumulating film disposed between the plurality of first word line layers and the first semiconductor layer,
the second region includes:
a part of the plurality of first word line layers stacked in the second direction;
a plurality of first insulating layers that are separated from the plurality of first word line layers in a third direction intersecting with the first direction and the second direction, the plurality of first insulating layers being stacked in the second direction;
a first contact that extends in the second direction, the first contact having an outer peripheral surface opposed to the plurality of first insulating layers;
a second semiconductor layer disposed between the plurality of first word line layers and the plurality of first insulating layers, the second semiconductor layer extending in the first direction and the second direction; and
a second electric charge accumulating film disposed between the plurality of first insulating layers and the second semiconductor layer, wherein
a position in the second direction of one of the plurality of first word line layers is assumed to be a first position,
a width in the third direction at the first position of the first semiconductor layer is assumed to be a first width, and
a width in the third direction at the first position of the second semiconductor layer is assumed to be a second width,
the second width is larger than 0.5 times of the first width and smaller than 2.0 times of the first width.

2. The semiconductor memory device according to claim 1, comprising
a plurality of second word line layers farther from the substrate than the plurality of first word line layers, wherein the first semiconductor layer includes:
  a first part that extends in the second direction, the first part being opposed to the plurality of first word line layers;
  a second part that extends in the second direction, the second part being opposed to the plurality of second word line layers; and
  a third part connected to the first part and the second part, wherein
a width in the third direction of the third part is larger than widths in the third direction of the first part and the second part.

3. The semiconductor memory device according to claim 2, wherein
the second semiconductor layer includes:
  a fourth part that extends in the second direction, the fourth part being opposed to the plurality of first word line layers;
  a fifth part that extends in the second direction, the fifth part being opposed to the plurality of second word line layers; and
  a sixth part connected to the fourth part and the fifth part, wherein
a width in the third direction of the sixth part is larger than widths in the third direction of the fourth part and the fifth part.

4. The semiconductor memory device according to claim 1, comprising
a plurality of second word line layers farther from the substrate than the plurality of first word line layers, wherein
the first semiconductor layer includes:
  a first part that extends in the second direction, the first part being opposed to the plurality of first word line layers; and
  a second part that extends in the second direction, the second part being opposed to the plurality of second word line layers, wherein
a position in the second direction of one of the plurality of second word line layers is assumed to be a second position,
a width in the third direction at the second position of the first semiconductor layer is assumed to be a third width, and
a width in the third direction at the second position of the second semiconductor layer is assumed to be a fourth width,
the fourth width is larger than 0.5 times of the third width and smaller than 2.0 times of the third width.

5. The semiconductor memory device according to claim 1, comprising
a second insulating layer extending in the first direction and the second direction, wherein
a side surface in the third direction of the second insulating layer is surrounded by the second semiconductor layer.

6. The semiconductor memory device according to claim 1, comprising:
a plurality of third word line layers separated from the plurality of first word line layers in the third direction, the plurality of third word line layers being stacked in the second direction; and
a second insulating layer disposed between the plurality of first word line layers and the plurality of third word line layers, the second insulating layer extending in the first direction and the second direction.

7. The semiconductor memory device according to claim 6, comprising:
a plurality of fourth word line layers separated in the third direction from the plurality of first word line layers in a direction opposite to the plurality of third word line layers, the plurality of fourth word line layers being stacked in the second direction;
a third insulating layer disposed between the plurality of first word line layers and the plurality of fourth word line layers, the third insulating layer extending in the first direction and the second direction; and
a third semiconductor layer disposed between the second semiconductor layer and the third insulating layer.

8. The semiconductor memory device according to claim 6, wherein
a width in the third direction of the second insulating layer is larger than a width in the third direction of the first semiconductor layer and a width in the third direction of the second semiconductor layer.

9. The semiconductor memory device according to claim 6, comprising
a second conductive layer extending in the first direction and the second direction, wherein
a side surface in the third direction of the second conductive layer is surrounded by the second insulating layer.

10. The semiconductor memory device according to claim 1, comprising
a first wiring electrically connected to the second semiconductor layer.

11. A semiconductor memory device comprising
a substrate that includes a first region and a second region arranged in a first direction, wherein
the first region includes:
  a plurality of first word line layers stacked in a second direction intersecting with a surface of the substrate;
  a first semiconductor layer that extends in the second direction, the first semiconductor layer having an outer peripheral surface opposed to the plurality of first word line layers; and
  a first electric charge accumulating film disposed between the plurality of first word line layers and the first semiconductor layer, wherein
the second region includes:
  a part of the plurality of first word line layers stacked in the second direction;
  a plurality of first insulating layers that are separated from the plurality of first word line layers in a third direction intersecting with the first direction and the second direction, the plurality of first insulating layers being stacked in the second direction;
  a first contact that extends in the second direction, the first contact having an outer peripheral surface opposed to the plurality of first insulating layers;
  a first metal layer disposed between the plurality of first word line layers and the plurality of first insulating layers, the first metal layer extending in the first direction and the second direction;
  a second insulating layer disposed between the first metal layer and the plurality of first word line layers; and
  a third insulating layer disposed between the first metal layer and the plurality of first insulating layers, wherein
a position in the second direction of one of the plurality of first word line layers is assumed to be a first position, a width in the third direction at the first position of the first semiconductor layer is assumed to be a first width, and a width in the third direction at the first position of the first metal layer is assumed to be a second width, the second width is larger than 0.5 times of the first width and smaller than 2.0 times of the first width.

12. The semiconductor memory device according to claim 11, wherein the first metal layer has a width in the third direction that decreases toward the substrate.

13. The semiconductor memory device according to claim 11, comprising:

a plurality of third word line layers separated from the plurality of first word line layers in the third direction, the plurality of third word line layers being stacked in the second direction; and a fourth insulating layer disposed between the plurality of first word line layers and the plurality of third word line layers, the fourth insulating layer extending in the first direction and the second direction.

14. The semiconductor memory device according to claim 13, comprising:

a plurality of fourth word line layers separated in the third direction from the plurality of first word line layers in a direction opposite to the plurality of third word line layers, the plurality of fourth word line layers being stacked in the second direction;

a fifth insulating layer disposed between the plurality of first word line layers and the plurality of fourth word line layers, the fifth insulating layer extending in the first direction and the second direction; and a second metal layer disposed between the first metal layer and the fifth insulating layer.

15. The semiconductor memory device according to claim 13, wherein a width in the third direction of the fourth insulating layer is larger than a width in the third direction of the first semiconductor layer and a width in the third direction of the first metal layer.

16. The semiconductor memory device according to claim 13, comprising a second conductive layer extending in the first direction and the second direction, wherein a side surface in the third direction of the second conductive layer is surrounded by the fourth insulating layer.

* * * * *